(12) United States Patent
Yamazaki et al.

(10) Patent No.: US 7,977,678 B2
(45) Date of Patent: Jul. 12, 2011

(54) SEMICONDUCTOR DISPLAY DEVICE

(75) Inventors: Shunpei Yamazaki, Tokyo (JP); Jun Koyama, Kanagawa (JP); Yoshifumi Tanada, Kanagawa (JP); Hiroyuki Miyake, Kanagawa (JP); Kei Takahashi, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 233 days.

(21) Appl. No.: 12/336,996

(22) Filed: Dec. 17, 2008

(65) Prior Publication Data

US 2009/0159890 A1  Jun. 25, 2009

(30) Foreign Application Priority Data

Dec. 21, 2007 (JP) ................. 2007-329579

(51) Int. Cl.
*H01L 29/04* (2006.01)
(52) U.S. Cl. . 257/59; 257/72; 257/E33.06; 257/E33.062
(58) Field of Classification Search .................... 257/59, 257/79, E33.06, E33.062
See application file for complete search history.

(56) References Cited

U.S. PATENT DOCUMENTS

| | | | |
|---|---|---|---|
| 5,075,674 A | 12/1991 | Katayama et al. | |
| 5,247,190 A | 9/1993 | Friend et al. | |
| 5,399,502 A | 3/1995 | Friend et al. | |
| 5,440,208 A | 8/1995 | Uskali et al. | |
| 5,670,792 A | 9/1997 | Utsugi et al. | |
| 5,965,363 A | 10/1999 | Monforte et al. | |
| 6,124,604 A | 9/2000 | Koyama et al. | |
| 6,165,824 A | 12/2000 | Takano et al. | |
| 6,421,034 B1 | 7/2002 | Mihara | |
| 6,476,419 B1 | 11/2002 | Yasuda | |
| 6,512,504 B1 | 1/2003 | Yamauchi et al. | |
| 6,528,950 B2 | 3/2003 | Kimura | |
| 6,529,178 B1 | 3/2003 | Kimura | |
| 6,556,177 B1 | 4/2003 | Katayama et al. | |
| 6,559,594 B2 | 5/2003 | Fukunaga et al. | |
| 6,580,408 B1 | 6/2003 | Bae et al. | |
| 6,580,409 B1 | 6/2003 | Ito et al. | |
| 6,714,178 B2 | 3/2004 | Koyama et al. | |
| 6,753,656 B2 | 6/2004 | Kimura | |
| 6,864,638 B2 | 3/2005 | Ishihara et al. | |
| 7,012,300 B2 | 3/2006 | Yamazaki | |
| 7,145,289 B2 | 12/2006 | Yamazaki et al. | |

(Continued)

FOREIGN PATENT DOCUMENTS

JP 62-209514 9/1987
(Continued)

*Primary Examiner* — Lex Malsawma
(74) *Attorney, Agent, or Firm* — Husch Blackwell LLP

(57) ABSTRACT

A semiconductor display device using a light-emitting element, which can suppress luminance unevenness among pixels due to the potential drop of a wiring, is provided. Power supply lines to which a power supply potential is supplied are electrically connected to each other in a display region where a plurality of pixels are arranged. Further, an interlayer insulating film is formed over a wiring (an auxiliary power supply line) for electrically connecting the power supply lines to each other in the display region and a gate electrode of a transistor included in a pixel; and the power supply lines are formed over the interlayer insulating film which is formed over the auxiliary power supply line and the gate electrode. Furthermore, a wiring (an auxiliary wiring) formed over the interlayer insulating film is electrically or directly connected to the auxiliary power supply line.

20 Claims, 22 Drawing Sheets

U.S. PATENT DOCUMENTS

| | | |
|---|---|---|
| 7,164,155 B2 | 1/2007 | Yamazaki et al. |
| 7,187,421 B2 * | 3/2007 | Tsunashima et al. ............ 349/41 |
| 7,332,745 B2 * | 2/2008 | Kang et al. ...................... 257/83 |
| 7,408,196 B2 | 8/2008 | Kurokawa |
| 7,724,245 B2 * | 5/2010 | Miyazawa .................... 345/204 |
| 7,728,510 B2 * | 6/2010 | Oh ................................. 313/504 |
| 2003/0227021 A1 | 12/2003 | Yamazaki et al. |
| 2004/0252117 A1 | 12/2004 | Tanada |
| 2005/0036078 A1 * | 2/2005 | Tsunashima et al. ............ 349/38 |
| 2007/0128583 A1 * | 6/2007 | Miyazawa .................... 434/433 |
| 2007/0139571 A1 | 6/2007 | Kimura |

FOREIGN PATENT DOCUMENTS

| | | |
|---|---|---|
| JP | 4-313729 | 11/1992 |
| JP | 6-160904 | 6/1994 |
| JP | 10-198292 | 7/1998 |
| JP | 2000-242196 | 9/2000 |
| WO | WO 90/13148 A1 | 11/1990 |

* cited by examiner

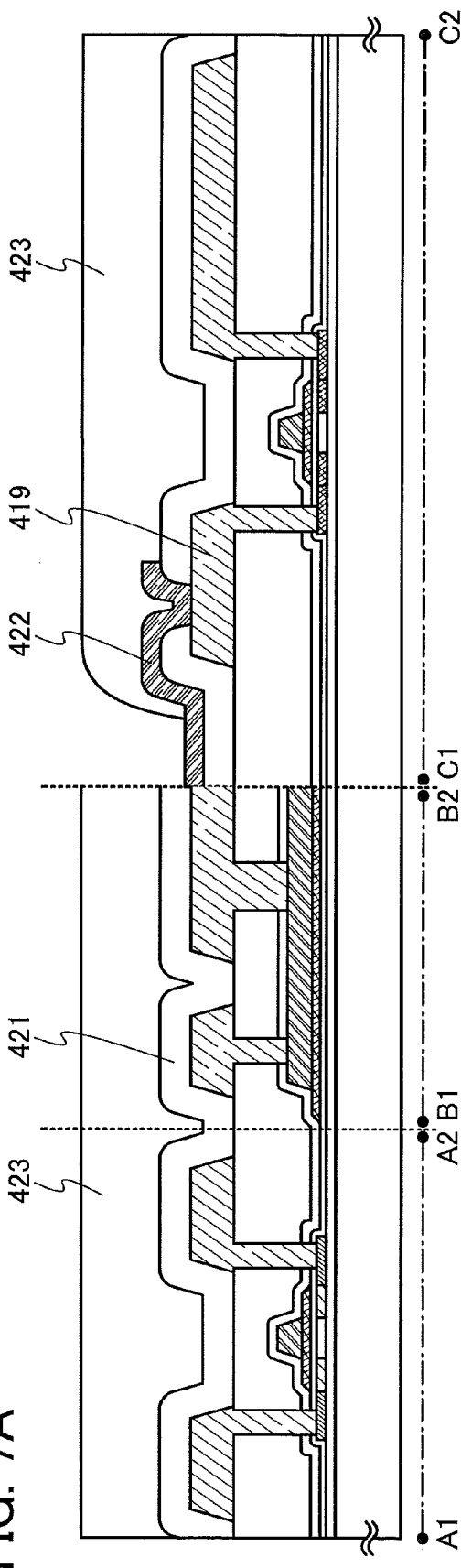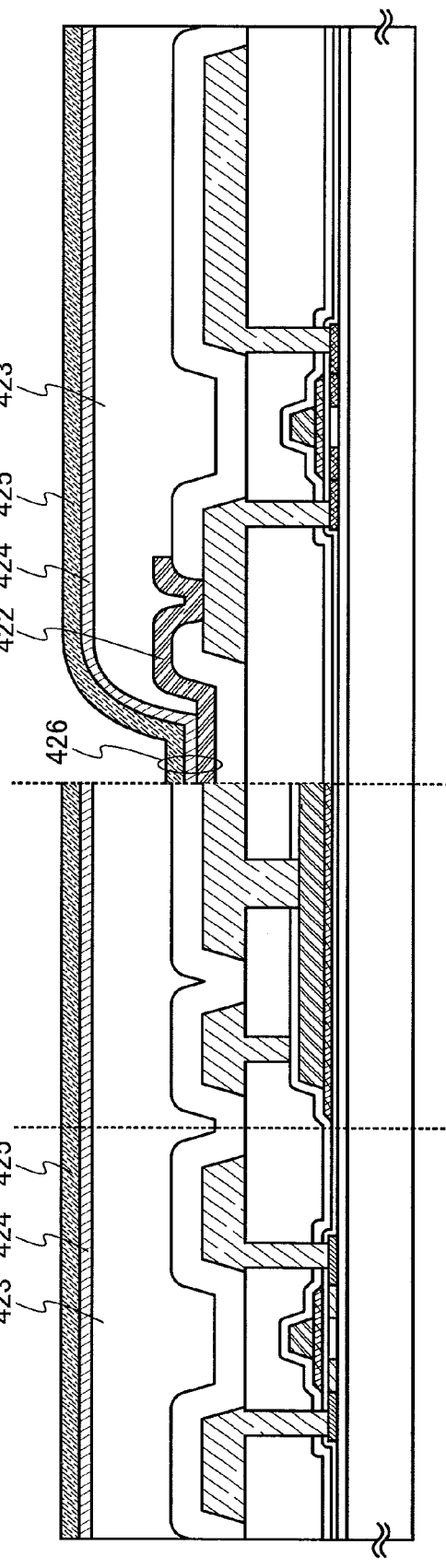

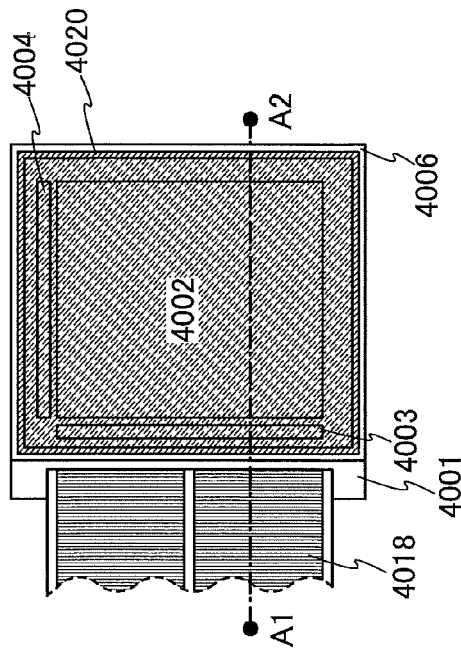
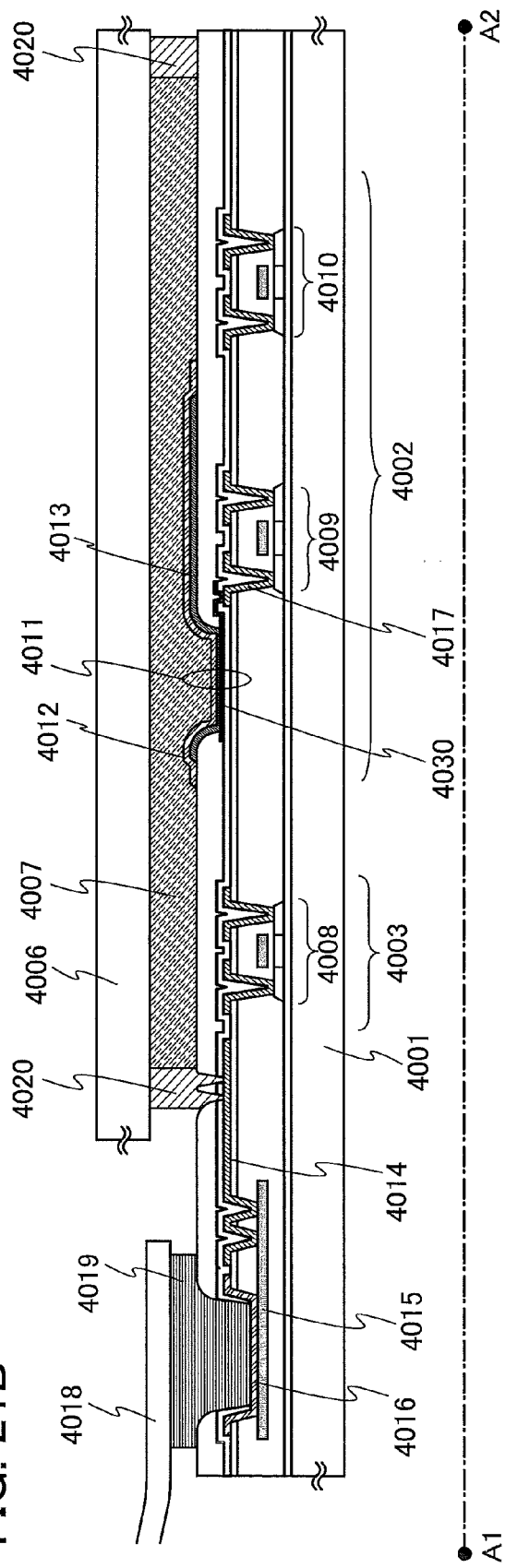
FIG. 21A
FIG. 21B

SEMICONDUCTOR DISPLAY DEVICE

BACKGROUND OF THE INVENTION

1. Field of the Invention

The present invention relates to a semiconductor display device having a light-emitting element in each pixel.

2. Description of the Related Art

In an active matrix semiconductor display device, a switching element and a display element are provided in each of several hundred thousand to several million pixels arranged in matrix. Since application of voltage or supply of current to the display element is held to some extent by the switching element after a video signal is input to the pixel, the active matrix semiconductor display device can be flexible on enlargement and high definition and has become the mainstream of future semiconductor display devices.

As a problem caused in accordance with enlargement of a semiconductor display device, there is the potential drop of a wiring, which is caused by increase in a resistance value. For example, when the potential of a wiring (a scan line) connected to a gate electrode of a transistor which functions as a switching element drops, disorder is generated in the waveform of a signal input to the scan line, so that the switching of the transistor cannot be controlled at appropriate timing. In particular, gate electrodes of transistors included in all pixels in a horizontal direction are connected to the scan line. When the number of pixels is increased as a semiconductor display device has higher definition, the number of transistors connected to one scan line is also increased. Therefore, the potential of the scan line drops more significantly, which makes the appropriate control of the switching of the transistors more difficult.

If the scan line can be formed using a material having lower resistivity, the potential drop can be suppressed. However, a gate electrode of a transistor included in a pixel and a scan line are usually formed by processing (patterning) a conductive film formed over one layer into a desired shape by etching or the like. It is necessary that the gate electrode have heat resistance which is high enough to withstand heat treatment performed in steps of manufacturing the transistor. Thus, the kinds of materials which can be used for the gate electrode and the scan line have been limited to certain kinds.

Reference 1 (Japanese Published Patent Application No. H10-198292) discloses a liquid crystal display device in which the potential drop of a scan line is suppressed by connecting the scan line to an auxiliary wiring formed over a layer which is different from the layer over which the scan line is formed.

SUMMARY OF THE INVENTION

Since semiconductor display devices using light-emitting elements as display elements have high visibility, are suitable for reduction in thickness, and do not have limitations on viewing angle, they have attracted attention as semiconductor display devices which are alternatives to CRTs (cathode ray tube) or liquid crystal display devices. Specifically proposed structures of active matrix semiconductor display devices using light-emitting elements are different depending on manufacturers. However, in general, at least a light-emitting element, a transistor (a switching transistor) which controls input of video signals to pixels, and a transistor (a driving transistor) which controls the amount of current supplied to the light-emitting element are provided in each pixel.

A liquid crystal element is a display element which displays grayscale in accordance with the level of voltage applied between a pair of electrodes. On the other hand, a light-emitting element is a display element which displays grayscale in accordance with the amount of current flowing between a pair of electrodes. Thus, as compared to liquid crystal display devices, the amount of current supplied to pixels is larger in semiconductor display devices using light-emitting elements. Therefore, when the total area of display elements to which current should be supplied is increased as semiconductor display devices become larger, the amount of current supplied to pixels is significantly increased depending on grayscale to be displayed. Accordingly, the potential of a wiring (a power supply line) for supplying current to pixels considerably drops, so that luminance unevenness is generated among pixels in a display region.

It is preferable to suppress luminance unevenness among pixels due to the potential drop of a wiring.

In order to solve the aforementioned problems, power supply lines to which a power supply potential is supplied are electrically connected to each other in a display region where a plurality of pixels are arranged. Further, an interlayer insulating film is formed over a wiring (an auxiliary power supply line) for electrically connecting the power supply lines to each other in the display region and a gate electrode of a transistor included in a pixel; and the power supply lines are formed over the interlayer insulating film which is formed over the auxiliary power supply line and the gate electrode. Furthermore, a wiring (an auxiliary wiring) formed over the interlayer insulating film is electrically or directly connected to the auxiliary power supply line. Note that in this specification, the state of "electrically connected" also includes the state of "directly connected" unless otherwise specified.

Note that as for electrical connection of the power supply lines, all adjacent power supply lines may be electrically connected to each other; or all power supply lines may be divided into several groups and power supply lines in each group may be connected to each other. In particular, when the level of a power supply potential supplied to the power supply line is different depending on the color of light obtained from the pixel, power supply lines to which the same power supply potential is supplied are electrically connected to each other through the auxiliary power supply line. Note that the color of light obtained from the pixel can be varied by changing the kind of an electroluminescent layer used for a light-emitting element; or the color of light obtained from the pixel can be varied by using a color filter which can transmit only light with a particular wavelength among light emitted from the light-emitting element.

In addition, an interlayer insulating film may be formed over a scan line connected to the gate electrode of the transistor which functions as a switching element; and a wiring (a scan line auxiliary wiring) formed over the interlayer insulating film and the scan line may be electrically or directly connected to each other.

Further, the thickness of the power supply line, the auxiliary wiring, or the scan line auxiliary wiring formed over the interlayer insulating film is preferably greater than or equal to 0.8 μm and less than or equal to 1.5 μm.

Furthermore, the power supply line, the auxiliary wiring, or the scan line auxiliary wiring formed over the interlayer insulating film is formed by processing (patterning) a single conductive film or a plurality of stacked conductive films formed over the interlayer insulating film into a desired shape. The gate electrode, the auxiliary power supply line, or the scan line formed below the interlayer insulating film is formed by processing (patterning) a single conductive film or a plurality of stacked conductive films formed before the interlayer insulating film is formed into a desired shape. Note that the electric conductivity of at least one conductive film used for the power supply line, the auxiliary wiring, or the scan line auxiliary wiring is preferably higher than the electric conductivity of at least one conductive film used for the gate electrode, the auxiliary power supply line, or the scan line.

By electrically connecting the power supply lines to each other using the auxiliary power supply line formed below the power supply lines, generation of luminance unevenness in the display region due to the potential drop of the power supply line can be prevented. In addition, by electrically or directly connecting the auxiliary power supply line to the auxiliary wiring formed over the same layer as the layer over which the power supply line is formed, the potential drop of the auxiliary power supply line and thus the potential drop of the power supply line can be prevented more effectively. Thus, the luminance unevenness among the pixels due to the potential drop of the wiring can be suppressed, so that a semiconductor display device having a large display region and high image quality can be provided.

Furthermore, by electrically or directly connecting the scan line to the scan line auxiliary wiring formed above the scan line, the switching of a switching transistor can be prevented from being unable to be controlled at appropriate timing due to the potential drop of the scan line.

BRIEF DESCRIPTION OF THE DRAWINGS

In the accompanying drawings:

FIGS. 7A and 7B are cross-sectional views showing a method for manufacturing a semiconductor display device of Embodiment Mode 2;

FIG. 21A is a top view of a semiconductor display device of Embodiment 3, and FIG. 21B is a cross-sectional view thereof.

DETAILED DESCRIPTION OF THE INVENTION

Hereinafter, embodiment modes and embodiments will be described with reference to the drawings. Note that the present invention can be implemented in various different ways and it will be readily appreciated by those skilled in the art that various changes and modifications are possible without departing from the spirit and the scope of the present invention. Therefore, the present invention should not be construed as being limited to the following description of the embodiment modes and embodiments.

Note that a semiconductor display device of the present invention includes a panel where a light-emitting element is formed and a module where an IC or the like including a controller is mounted on the panel in its category. In addition, the semiconductor display device of the present invention includes an element substrate which corresponds to one mode before the light-emitting element is completed in steps of manufacturing the semiconductor display device in its category. Specifically, the element substrate may be in a state where only one of a pair of electrodes of the light-emitting element is formed, or in a state after a conductive film which serves as the one of the electrodes is deposited and before the one of the electrodes is formed by patterning.

Embodiment Mode 1

Figure 1A:
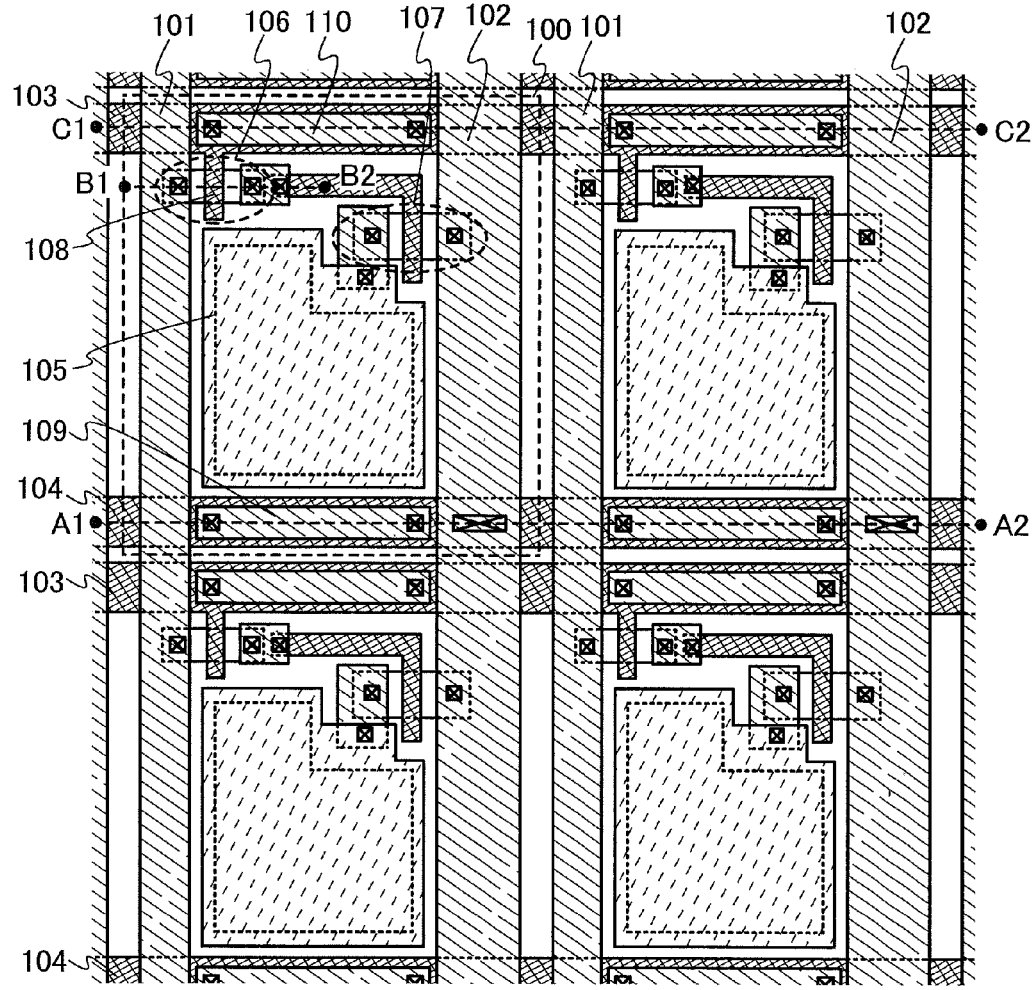
FIG. 1A is a magnified view of a display region of a semiconductor display device of Embodiment Mode 1.
Figure 1B:
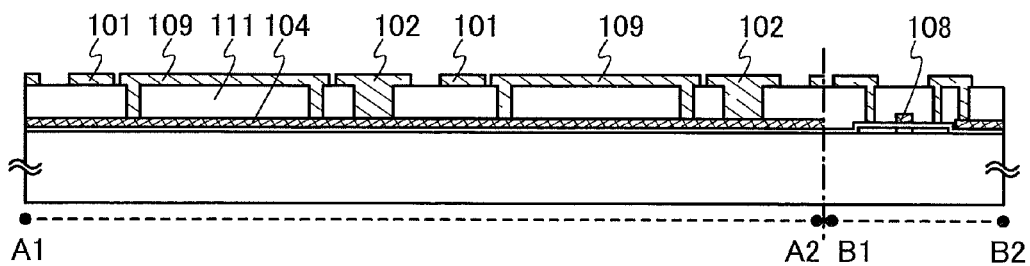
FIGS. 1B and 1C are cross-sectional views thereof.
Figure 1C:
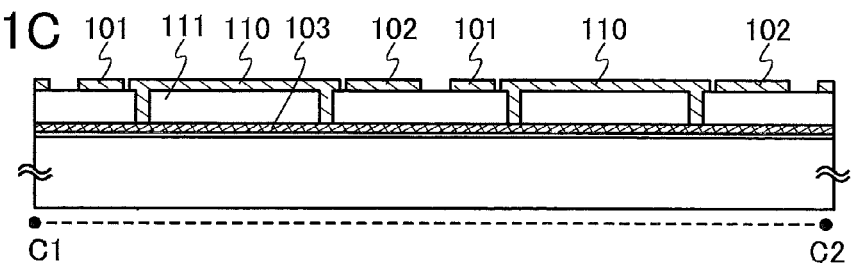

The structure of a pixel included in a semiconductor display device is described with reference to FIGS. 1A to 1C. FIG. 1A is an example of a top view showing, by enlarging, part of a display region included in the semiconductor display device shown in this embodiment mode. In addition, FIG. 1B shows a cross-sectional view taken along broken line A1-A2 in FIG. 1A and a cross-sectional view taken along broken line B1-B2 in FIG. 1A. Further, FIG. 1C shows a cross-sectional view taken along broken line C1-C2 in FIG. 1A.

The semiconductor display device shown in FIGS. 1A to 1B includes a plurality of signal lines 101, a plurality of power supply lines 102, a plurality of scan lines 103, and a plurality of auxiliary power supply lines 104 in a display region. Each of a plurality of pixels 100 provided in the display region includes at least one of the signal lines 101, one of the power supply lines 102, and one of the scan lines 103.

The power supply line 102 included in the given pixel 100 is electrically connected to the power supply line 102 which is different from the above power supply line 102 through the auxiliary power supply line 104. In FIGS. 1A to 1C, an example is shown in which two power supply lines 102 are directly connected to the auxiliary power supply line 104, so that the power supply lines 102 are electrically connected to each other; however, one of the power supply lines 102 and the auxiliary power supply line 104 may be electrically connected to each other through a different wiring. Further, although the adjacent power supply lines 102 are electrically connected to each other in FIGS. 1A to 1C, it is not necessary that all of the power supply lines 102 in the display region be electrically connected to each other.

By electrically connecting at least two power supply lines 102 to each other through the auxiliary power supply line 104, potential differences generated in the power supply lines 102 due to potential drop can be prevented from varying among the power supply lines 102 even when the amount of current which should be supplied to pixels are considerably varied among the power supply lines 102. Thus, generation of luminance unevenness in the display region due to the potential drop can be prevented.

Further, each pixel 100 includes at least a light-emitting element 105, a switching transistor 106 for controlling input of video signals to the pixel 100, and a driving transistor 107 for controlling the amount of current supplied to the light-emitting element 105. Note that in FIG. 1A, a region which serves as the light-emitting element 105 is represented by a broken line. Note that although an example in which two transistors are provided in each pixel 100 is shown in FIGS. 1A to 1C, the present invention is not limited to this structure. In the semiconductor display device of the present invention, each pixel 100 may include at least a transistor for controlling input of video signals to the pixel 100 and a transistor for controlling the amount of current supplied to a light-emitting element.

A gate electrode 108 of the switching transistor 106 and the scan line 103 are directly or electrically connected to each other. Note that in this specification, a gate electrode refers to a portion which overlaps with a semiconductor film which serves as an active layer with a gate insulating film interposed therebetween among a single conductive film or a plurality of stacked conductive films formed in contact with the gate insulating film. In FIG. 1A, a series of conductive films functions as the scan line 103 and the gate electrode 108, and the scan line 103 and the gate electrode 108 are directly connected to each other. However, the scan line 103 and the gate electrode 108 may be formed using conductive films which are separately provided from each other, and the scan line 103 and the gate electrode 108 may be electrically connected to each other through a different wiring. Alternatively, the scan line 103 and the gate electrode 108 may be formed using conductive films which are different from each other, and the scan line 103 and the gate electrode 108 may be directly connected to each other or electrically connected to each other through a different wiring.

In addition, each pixel 100 includes an auxiliary wiring 109 which is directly connected to the auxiliary power supply line 104 and a scan line auxiliary wiring 110 which is directly connected to the scan line 103. Note that although the auxiliary power supply line 104 and the auxiliary wiring 109 are directly connected to each other in FIGS. 1A to 1C, the auxiliary power supply line 104 and the auxiliary wiring 109 may be electrically connected to each other through a different wiring. Further, although the scan line 103 and the scan line auxiliary wiring 110 are directly connected to each other in FIGS. 1A to 1C, the scan line 103 and the scan line auxiliary wiring 110 may be electrically connected to each other through a different wiring.

In the semiconductor display device shown in this embodiment mode, by providing the auxiliary wiring 109 which is directly or electrically connected to the auxiliary power supply line 104, combined resistance of the auxiliary power supply line 104 and the auxiliary wiring 109 can be lowered. Thus, the potential drop of the auxiliary power supply line 104 can be prevented; consequently, the potential drop of the power supply line 102 can be prevented.

In addition, in FIGS. 1A to 1C, the semiconductor display device includes the scan line auxiliary wiring 110; however, the semiconductor display device shown in this embodiment mode may include at least the auxiliary wiring 109 and does not necessarily include the scan line auxiliary wiring 110. Note that by providing the scan line auxiliary wiring 110, combined resistance of the scan line 103 and the scan line auxiliary wiring 110 can be lowered. Thus, the switching of the switching transistor 106 can be prevented from being unable to be controlled at appropriate timing due to the potential drop of the scan line 103.

Further, in this embodiment mode, at least the power supply line 102, the auxiliary wiring 109, and the scan line auxiliary wiring 110 are formed over an interlayer insulating film 111. In FIGS. 1A to 1C, an example is shown in which the signal line 101 as well as the power supply line 102, the auxiliary wiring 109, and the scan line auxiliary wiring 110 is formed over the interlayer insulating film 111. Thus, in this embodiment mode, the power supply line 102, the auxiliary wiring 109, the scan line auxiliary wiring 110, and the signal line 101 can be formed by processing (patterning) a single conductive film or a plurality of stacked conductive films formed over the interlayer insulating film into desired shapes. Accordingly, the power supply line 102, the auxiliary wiring 109, the scan line auxiliary wiring 110, and the signal line 101 can be formed using one mask. Furthermore, in this embodiment mode, at least the gate electrode 108, the auxiliary power supply line 104, and the scan line 103 are formed below the interlayer insulating film 111. Thus, in this embodiment mode, the gate electrode 108, the auxiliary power supply line 104, and the scan line 103 can be formed by processing a single conductive film or a plurality of stacked conductive films into desired shapes before the interlayer insulating film is formed. Accordingly, the gate electrode 108, the auxiliary power supply line 104, and the scan line 103 can be formed using one mask. Therefore, the semiconductor display device of this embodiment mode can be manufactured without increasing the number of masks as compared to a conventional semiconductor display device.

Note that it is necessary that the gate electrode 108 have heat resistance which is high enough to withstand heat treatment performed in steps of manufacturing the switching transistor 106. Thus, when the scan line 103 and the auxiliary power supply line 104 are formed together with the gate electrode 108 by processing (patterning) a single conductive film or a plurality of stacked conductive films into desired shapes, the kinds of materials which can be used for the gate electrode 108, the scan line 103, and the auxiliary power supply line 104 are limited to certain kinds. Therefore, it is difficult to form the gate electrode 108, the scan line 103, and the auxiliary power supply line 104 by using materials having lower resistivity. However, in this embodiment mode, the power supply line 102, the auxiliary wiring 109, and the scan line auxiliary wiring 110 are formed above the interlayer insulating film 111 formed over the switching transistor 106 and the driving transistor 107. Thus, since the power supply line 102, the auxiliary wiring 109, and the scan line auxiliary wiring 110 are formed after the switching transistor 106 is manufactured, the power supply line 102, the auxiliary wiring 109, and the scan line auxiliary wiring 110 do not need to have higher heat resistance than the gate electrode 108, the scan line 103, and the auxiliary power supply line 104. Therefore, materials which can be used for the power supply line 102, the auxiliary wiring 109, and the scan line auxiliary wiring 110 can be relatively freely selected, so that it is possible to select materials having lower resistivity than materials for the gate electrode 108, the scan line 103, and the auxiliary power supply line 104. By forming the auxiliary wiring 109 and the scan line auxiliary wiring 110 by using materials having low resistivity, the combined resistance of the auxiliary power supply line 104 and the auxiliary wiring 109 and the combined resistance of the scan line 103 and the scan line auxiliary wiring 110 can be further lowered. Accordingly, the potential drop of the power supply line 102 and the potential drop of the scan line 103 can be prevented.

Note that in the semiconductor display device shown in FIGS. 1A to 1C, wirings for lowering the combined resistance, such as the auxiliary wiring 109 and the scan line auxiliary wiring 110 formed over the interlayer insulating film 111, are connected to wirings such as the auxiliary power supply line 104 and the scan line 103 formed below the interlayer insulating film 111. However, in this embodiment mode, below the interlayer insulating film 111, a wiring for lowering the combined resistance may be connected to a wiring such as the signal line 101 formed over the interlayer insulating film 111.

Next, the case is described in which power supply lines to which a common power supply potential is supplied are electrically connected to each other through the auxiliary power supply line when the level of a power supply potential supplied to the power supply line is different depending on the color of light obtained from the pixel.

Figure 2:
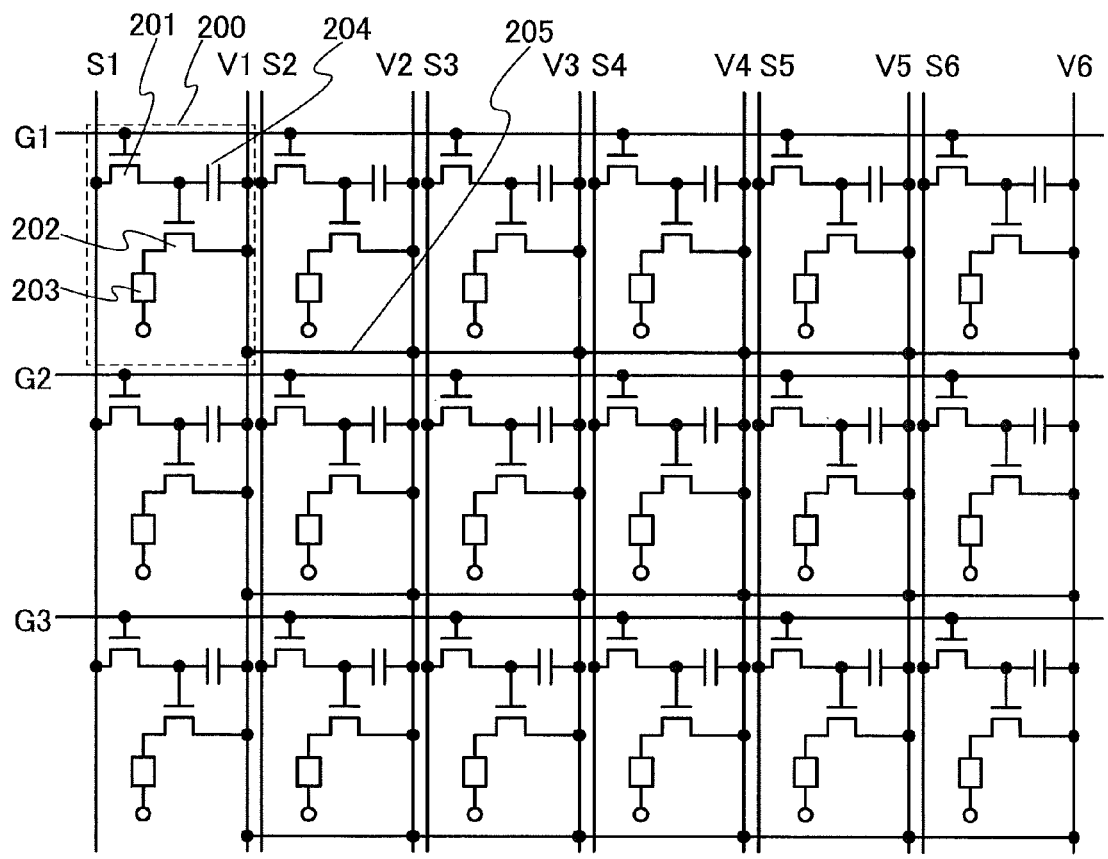
FIG. 2 is a circuit diagram of a display region of a semiconductor display device of Embodiment Mode 1.

First, FIG. 2 shows a circuit diagram of a display region when all adjacent power supply lines are electrically connected to each other. In the display region shown in FIG. 2, signal lines S1 to S6, power supply lines V1 to V6, and scan lines G1 to G3 are provided. Note that the number of signal lines, power supply lines, and scan lines provided in the display region is not limited to the number shown in FIG. 2. Each pixel 200 provided in the display region includes at least one of the signal lines S1 to S6, one of the power supply lines V1 to V6, and one of the scan lines G1 to G3.

In addition, each pixel 200 includes at least one switching transistor 201, one driving transistor 202, and a light-emitting element 203. A gate electrode of the switching transistor 201 is connected to one of the scan lines G1 to G3. One of a source region and a drain region of the switching transistor 201 is connected to one of the signal lines S1 to S6. The other of the source region and the drain region of the switching transistor 201 is connected to a gate electrode of the driving transistor 202. One of a source region and a drain region of the driving transistor 202 is connected to one of the power supply lines V1 to V6. The other of the source region and the drain region of the driving transistor 202 is connected to a pixel electrode of the light-emitting element 203. Further, the pixel 200 includes a storage capacitor 204. One of electrodes of the storage capacitor 204 is connected to one of the power supply lines V1 to V6. The other of the electrodes of the storage capacitor 204 is connected to the gate electrode of the driving transistor 202. Note that the structure of the pixel 200 shown in FIG. 2 is just an example of the pixel included in the semiconductor display device of the present invention, and the present invention is not limited to the structure of the pixel shown in FIG. 2.

In the display region shown in FIG. 2, all of the power supply lines V1 to V6 are electrically connected to each other through the auxiliary power supply line 205. In addition, in the display region shown in FIG. 2, an example is shown in which the auxiliary power supply line 205 electrically connects the adjacent power supply lines to each other in a plurality of portions. It is more effective to electrically connect the adjacent power supply lines to each other in a plurality portions as shown in FIG. 2 than to electrically connect the adjacent power supply lines to each other in one portion in order to prevent potential differences generated in power supply lines due to the potential drop from varying among the power supply lines even when the amount of current which should be supplied to the pixel 200 is considerably varied among the power supply lines. Thus, generation of luminance unevenness in the display region due to the potential drop can be prevented.

Figure 3:
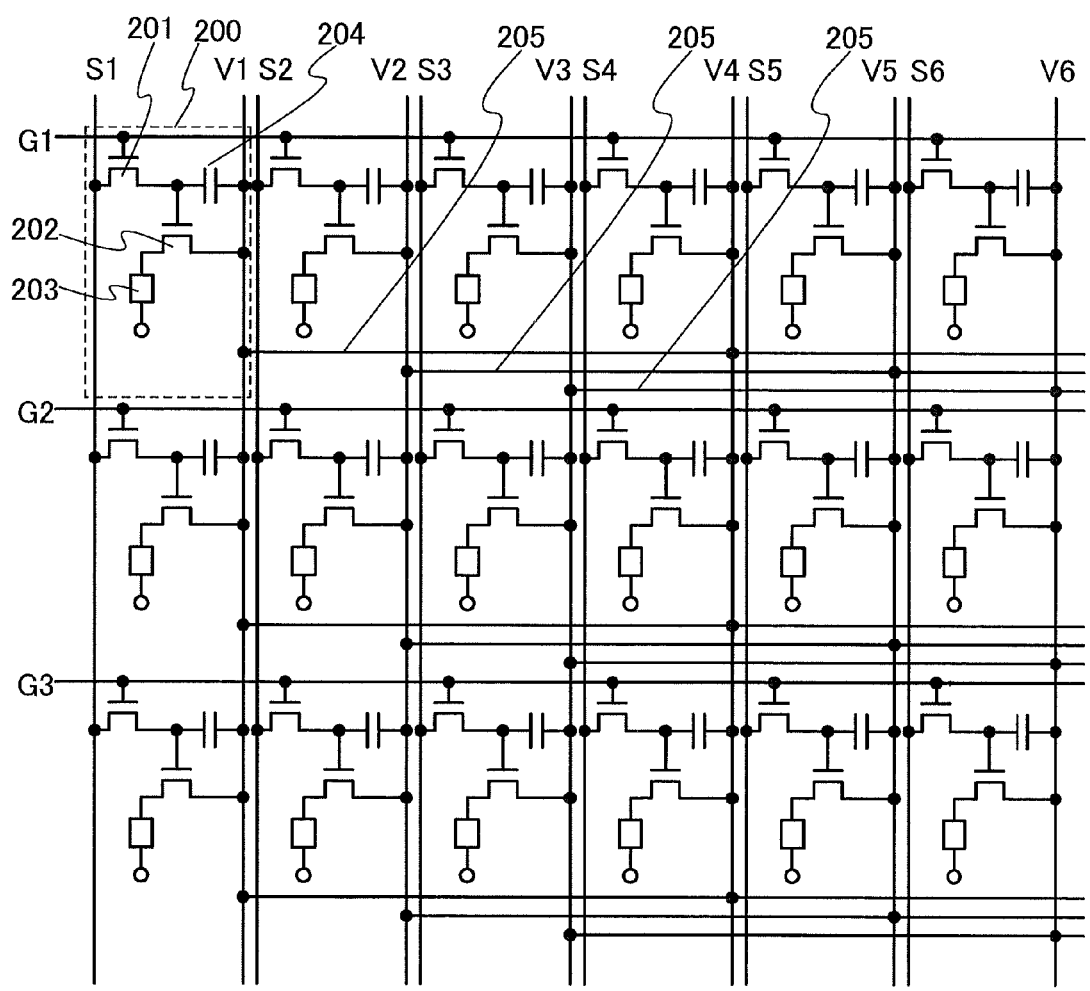
FIG. 3 is a circuit diagram of a display region of a semiconductor display device of Embodiment Mode 1.

Next, FIG. 3 shows a circuit diagram of a display region when power supply lines corresponding to colors of R (red), G (green), and B (blue) are electrically connected to each other, respectively. The structure of the display region shown in FIG. 3 is the same as the structure of the display region shown in FIG. 2 except the structure of the auxiliary power supply line 205. In the display region shown in FIG. 3, the power supply line V1 and the power supply line V4 supply current to the pixel 200 corresponding to R (red). In addition, the power supply line V2 and the power supply line V5 supply current to the pixel 200 corresponding to G (green). Further, the power supply line V3 and the power supply line V6 supply current to the pixel 200 corresponding to B (blue).

The power supply line V1 and the power supply line V4 which correspond to R (red) are electrically connected to each other through the auxiliary power supply line 205. In addition, the power supply line V2 and the power supply line V5 which correspond to G (green) are electrically connected to each other through the auxiliary power supply line 205. Further, the power supply line V3 and the power supply line V6 which correspond to B (blue) are electrically connected to each other through the auxiliary power supply line 205.

In the semiconductor display device having the display region shown in FIG. 3, potential differences generated in power supply lines due to the potential drop can be further prevented from varying among the power supply lines corresponding to the respective colors even when power supply potentials supplied to the power supply lines corresponding to the respective colors are varied. Thus, generation of luminance unevenness in the display region due to the potential drop can be prevented in each color.

Note that the color of light obtained from the pixel can be varied by changing the kind of the electroluminescent layer used for the light-emitting element 203. In this case, the range of the wavelength of light emitted from the light-emitting element 203 itself is varied among the pixels 200 corresponding to the respective colors. Alternatively, by using a color filter which can preferentially transmit light in a particular range of wavelengths among light emitted from the light-emitting element 203, the color of light obtained from the pixel 200 can be varied. In this case, the range of the wavelength of light emitted from the light-emitting element 203 may be the same in all of the pixels 200, or may be the same in the pixels 200 corresponding to a plurality of colors. Alternatively, even when the range of the wavelength of light emitted from the light-emitting element 203 is varied among the pixels 200 corresponding to the respective colors, a color filter may be used. By using a color filter even when the range of the wavelength of light emitted from the light-emitting element 203 is varied among the pixels 200 corresponding to the respective colors, the color purity of light obtained from the pixel 200 can be increased.

In addition, although an example of the semiconductor display device having the pixels 200 in which light of R (red), G (green), and B (blue) are obtained is shown in FIG. 3, the present invention is not limited to this structure. A semiconductor display device having the pixels 200 in which light of cyan (blue green), magenta (red purple), and yellow are obtained may be used. Alternatively, a semiconductor display device having the pixels 200 in which light of R (red), G (green), B (blue), and W (white) are obtained may be used.

In addition, in the display region shown in FIG. 3, an example is shown in which the auxiliary power supply line 205 electrically connects the adjacent power supply lines corresponding to the respective colors to each other in a plurality of portions. It is more effective to electrically connect the adjacent power supply lines to each other in a plurality portions as shown in FIG. 3 than to electrically connect the adjacent power supply lines to each other in one portion in order to prevent potential differences generated in power supply lines due to the potential drop from varying among the power supply lines corresponding to the respective colors even when the amount of current which should be supplied to the pixel 200 is considerably varied among the power supply lines. Thus, generation of luminance unevenness in the display region due to the potential drop can be prevented in each color.

Figure 4:
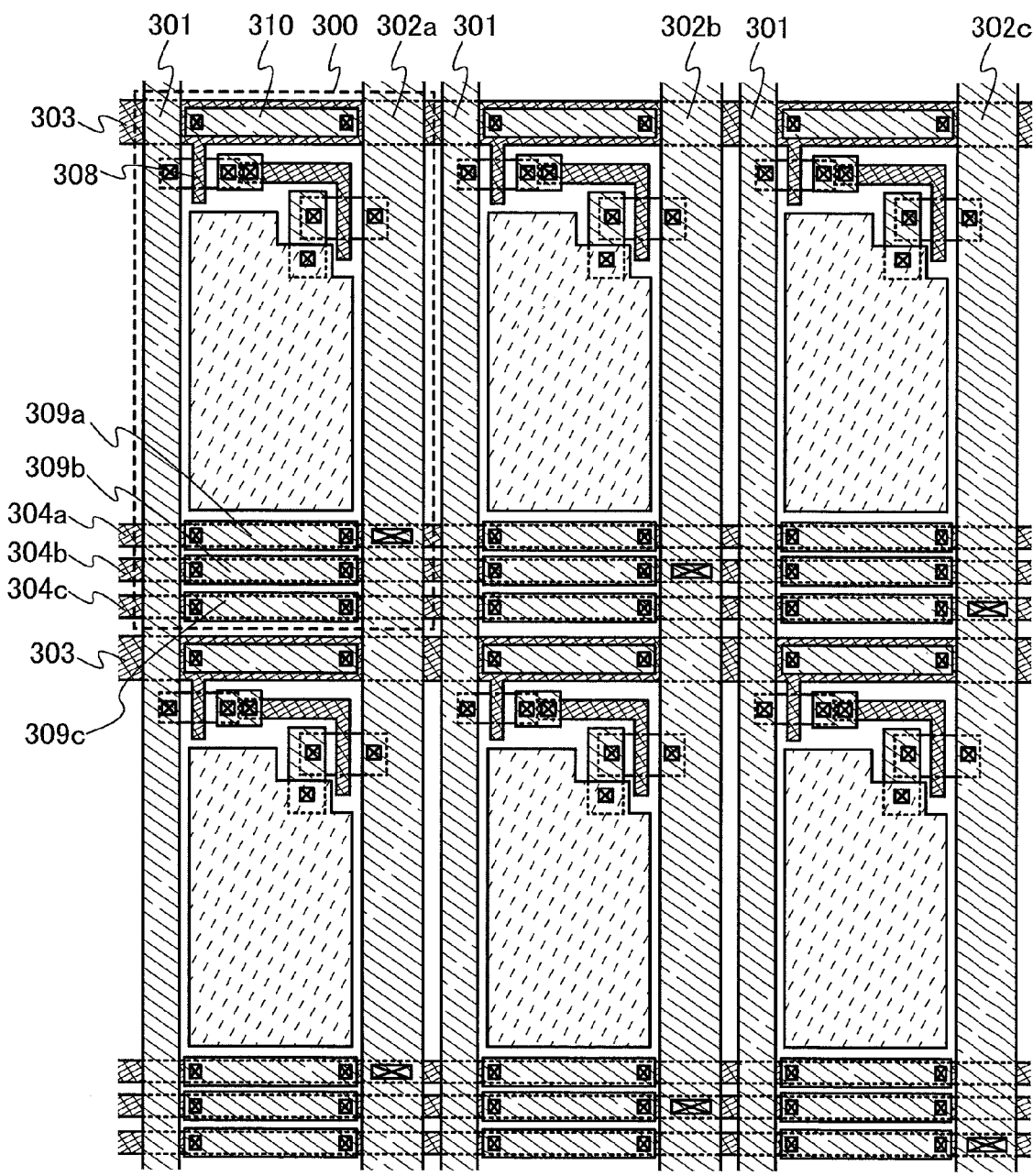
FIG. 4 is a magnified view of a display region of a semiconductor display device of Embodiment Mode 1.

FIG. 4 shows a top view of the display region shown in the circuit diagram in FIG. 3 as an example.

A semiconductor device of this embodiment mode, which is shown in FIG. 4, includes a plurality of signal lines 301, a power supply line 302*a*, a power supply line 302*b*, a power supply line 302*c*, a plurality of scan lines 303, an auxiliary power supply line 304*a*, an auxiliary power supply line 304*b*, and an auxiliary power supply line 304*c* in a display region. Each of a plurality of pixels 300 provided in the display region includes at least one of the signal lines 301; one of the power supply line 302*a*, the power supply line 302*b*, and the power supply line 302*c*; and one of the scan lines 303.

In FIG. 4, power supply potentials which are supplied to the power supply line 302*a*, the power supply line 302*b*, and the power supply line 302*c* are different from each other. In addition, the power supply line 302*a* is electrically connected to adjacent another power supply line 302*a* through the auxiliary power supply line 304*a*. Further, the power supply line 302*b* is electrically connected to adjacent another power supply line 302*b* through the auxiliary power supply line 304*b*. Furthermore, the power supply line 302*c* is electrically connected to adjacent another power supply line 302*c* through the auxiliary power supply line 304*c*.

Note that in FIG. 4, an example is shown in which the power supply line 302*a*, the power supply line 302*b*, and the power supply line 302*c* are directly connected to the auxiliary power supply line 304*a*, the auxiliary power supply line 304*b*, and the auxiliary power supply line 304*c*, respectively, so that the adjacent power supply lines 302*a* are electrically connected to each other, the adjacent power supply lines 302*b* are electrically connected to each other, or the adjacent power supply lines 302*c* are electrically connected to each other. However, the power supply line 302*a*, the power supply line 302*b*, and the power supply line 302*c* may be electrically connected to the auxiliary power supply line 304*a*, the auxiliary power supply line 304*b*, and the auxiliary power supply line 304*c*, respectively, through different wirings.

In addition, each pixel 300 includes an auxiliary wiring 309*a*, an auxiliary wiring 309*b*, and an auxiliary wiring 309*c* which are directly connected to the auxiliary power supply line 304*a*, the auxiliary power supply line 304*b*, and the auxiliary power supply line 304*c*, respectively, and a scan line auxiliary wiring 310 which is directly connected to the scan line 303. Note that although the auxiliary power supply line 304*a*, the auxiliary power supply line 304*b*, and the auxiliary power supply line 304*c* are directly connected to the auxiliary wiring 309*a*, the auxiliary wiring 309*b*, and the auxiliary wiring 309*c*, respectively, in FIG. 4, the auxiliary power supply line 304*a*, the auxiliary power supply line 304*b*, and the auxiliary power supply line 304*c* may be electrically connected to the auxiliary wiring 309*a*, the auxiliary wiring 309*b*, and the auxiliary wiring 309*c*, respectively, through different wirings. Further, although the scan line 303 and the scan line auxiliary wiring 310 are directly connected to each other in FIG. 4, the scan line 303 and the scan line auxiliary wiring 310 may be electrically connected to each other through a different wiring.

In the semiconductor display device of this embodiment mode, by providing the auxiliary wiring 309*a*, the auxiliary wiring 309*b*, and the auxiliary wiring 309*c* which are directly or electrically connected to the auxiliary power supply line 304*a*, the auxiliary power supply line 304*b*, and the auxiliary power supply line 304*c*, respectively, combined resistance of the auxiliary power supply line 304*a* and the auxiliary wiring 309*a*, combined resistance of the auxiliary power supply line 304*b* and the auxiliary wiring 309*b*, and combined resistance of the auxiliary power supply line 304*c* and the auxiliary wiring 309*c* can be lowered. Thus, the potential drop of the auxiliary power supply line 304*a*, the auxiliary power supply line 304*b*, and the auxiliary power supply line 304*c* can be prevented; consequently, the potential drop of the power supply line 302*a*, the power supply line 302*b*, and the power supply line 302*c* can be prevented.

In addition, in FIG. 4, the semiconductor display device includes the scan line auxiliary wiring 310; however, the semiconductor display device in this embodiment mode may include at least the auxiliary wiring 309*a*, the auxiliary wiring 309*b*, and the auxiliary wiring 309*c* and does not necessarily include the scan line auxiliary wiring 310. Note that by providing the scan line auxiliary wiring 310, combined resistance of the scan line 303 and the scan line auxiliary wiring 310 can be lowered. Thus, the switching of a transistor can be prevented from being unable to be controlled at appropriate timing due to the potential drop of the scan line 303.

Further, in this embodiment mode, at least the power supply line 302*a*, the power supply line 302*b*, the power supply line 302*c*, the auxiliary wiring 309*a*, the auxiliary wiring 309*b*, the auxiliary wiring 309*c*, and the scan line auxiliary wiring 310 are formed over an interlayer insulating film. In FIG. 4, an example is shown in which the signal line 301 as well as the power supply line 302*a*, the power supply line 302*b*, the power supply line 302*c*, the auxiliary wiring 309*a*, the auxiliary wiring 309*b*, the auxiliary wiring 309*c*, and the scan line auxiliary wiring 310 is formed over the interlayer insulating film. Thus, in this embodiment mode, the power supply line 302*a*, the power supply line 302*b*, the power supply line 302*c*, the auxiliary wiring 309*a*, the auxiliary wiring 309*b*, the auxiliary wiring 309*c*, the scan line auxiliary wiring 310, and the signal line 301 can be formed by processing (patterning) a single conductive film or a plurality of stacked conductive films formed over the interlayer insulating film into desired shapes. Accordingly, the power supply line 302*a*, the power supply line 302*b*, the power supply line 302*c*, the auxiliary wiring 309*a*, the auxiliary wiring 309*b*, the auxiliary wiring 309*c*, the scan line auxiliary wiring 310, and the signal line 301 can be formed using one mask.

Furthermore, in this embodiment mode, at least the gate electrode 308, the auxiliary power supply line 304*a*, the auxiliary power supply line 304*b*, the auxiliary power supply line 304*c*, and the scan line 303 are formed below the interlayer insulating film. Thus, in this embodiment mode, the gate electrode 308, the auxiliary power supply line 304*a*, the auxiliary power supply line 304*b*, the auxiliary power supply line 304c, and the scan line 303 can be formed by processing a single conductive film or a plurality of stacked conductive films into desired shapes before the interlayer insulating film is formed. Accordingly, the gate electrode 308, the auxiliary power supply line 304a, the auxiliary power supply line 304b, the auxiliary power supply line 304c, and the scan line 303 can be formed using one mask. Therefore, the semiconductor display device of this embodiment mode can be manufactured without increasing the number of masks as compared to a conventional semiconductor display device.

Note that it is necessary that the gate electrode 308 have heat resistance which is high enough to withstand heat treatment performed in steps of manufacturing a transistor. Thus, when the scan line 303, the auxiliary power supply line 304a, the auxiliary power supply line 304b, and the auxiliary power supply line 304c are formed together with the gate electrode 308 by processing (patterning) a single conductive film or a plurality of stacked conductive films into desired shapes, the kinds of materials which can be used for the gate electrode 308, the scan line 303, the auxiliary power supply line 304a, the auxiliary power supply line 304b, and the auxiliary power supply line 304c are limited to certain kinds. Therefore, it is difficult to form the gate electrode 308, the scan line 303, the auxiliary power supply line 304a, the auxiliary power supply line 304b, and the auxiliary power supply line 304c by using materials having lower resistivity. However, in this embodiment mode, the power supply line 302a, the power supply line 302b, the power supply line 302c, the auxiliary wiring 309a, the auxiliary wiring 309b, the auxiliary wiring 309c, and the scan line auxiliary wiring 310 are formed above the interlayer insulating film formed over the transistor. Thus, since the power supply line 302a, the power supply line 302b, the power supply line 302c, the auxiliary wiring 309a, the auxiliary wiring 309b, the auxiliary wiring 309c, and the scan line auxiliary wiring 310 are formed after the transistor is manufactured, the power supply line 302a, the power supply line 302b, the power supply line 302c, the auxiliary wiring 309a, the auxiliary wiring 309b, the auxiliary wiring 309c, and the scan line auxiliary wiring 310 do not need to have higher heat resistance than the gate electrode 308, the scan line 303, the auxiliary power supply line 304a, the auxiliary power supply line 304b, and the auxiliary power supply line 304c. Therefore, materials which can be used for the power supply line 302a, the power supply line 302b, the power supply line 302c, the auxiliary wiring 309a, the auxiliary wiring 309b, the auxiliary wiring 309c, and the scan line auxiliary wiring 310 can be relatively freely selected, so that it is possible to select materials having lower resistivity than materials for the gate electrode 308, the scan line 303, the auxiliary power supply line 304a, the auxiliary power supply line 304b, and the auxiliary power supply line 304c. By forming the auxiliary wiring 309a, the auxiliary wiring 309b, the auxiliary wiring 309c, and the scan line auxiliary wiring 310 by using materials having low resistivity, the combined resistance of the auxiliary power supply line 304a and the auxiliary wiring 309a, the combined resistance of the auxiliary power supply line 304b and the auxiliary wiring 309b, the combined resistance of the auxiliary power supply line 304c and the auxiliary wiring 309c, the combined resistance of the scan line 303 and the scan line auxiliary wiring 310 can be further lowered. Accordingly, the potential drop of the power supply line 302a, the power supply line 302b, and the power supply line 302c and the potential drop of the scan line 303 can be prevented.

Embodiment Mode 2

Next, a method for manufacturing a semiconductor display device is described in detail. Note that although a thin film transistor (TFT) is shown as an example of a semiconductor element in this embodiment mode, a semiconductor element used for a semiconductor display device of the present invention is not limited to this. For example, a memory element, a diode, a resistor, a capacitor, an inductor, or the like can be used instead of a TFT.

Figure 5A:
FIGS. 5A to 5C are cross-sectional views showing a method for manufacturing a semiconductor display device of Embodiment Mode 2.

First, as shown in FIG. 5A, an insulating film 401 and a semiconductor film 402 are sequentially formed over a substrate 400 having heat resistance. It is possible to form the insulating film 401 and the semiconductor film 402 successively.

A glass substrate such as a barium borosilicate glass substrate or an aluminoborosilicate glass substrate, a quartz substrate, a ceramic substrate, or the like can be used as the substrate 400. Alternatively, a metal substrate such as a stainless steel substrate with the surface provided with an insulating film, or a silicon substrate with the surface provided with an insulating film may be used. There is a tendency that a flexible substrate formed of a synthetic resin such as plastics generally has a lower allowable temperature limit than the above substrates; however, such a substrate can be used as long as it can withstand processing temperature in manufacturing steps.

As a plastic substrate, polyester typified by polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), polyimide, an acrylonitrile butadiene styrene resin, polyvinyl chloride, polypropylene, polyvinyl acetate, an acrylic resin, or the like can be used.

The insulating film 401 is provided in order that alkaline earth metal or alkali metal such as Na contained in the substrate 400 can be prevented from being diffused into the semiconductor film 402 and adversely affecting characteristics of a semiconductor element such as a transistor. Thus, the insulating film 401 is formed using silicon nitride, silicon nitride oxide, or the like which can suppress diffusion of alkali metal or alkaline earth metal into the semiconductor film 402. Note that in the case of using a substrate containing even a small amount of alkali metal or alkaline earth metal, such as a glass substrate, a stainless steel substrate, or a plastic substrate, it is effective to provide the insulating film 401 between the substrate 400 and the semiconductor film 402 from the viewpoint of preventing diffusion of impurities. However, when a substrate in which diffusion of impurities does not lead to a significant problem, such as a quartz substrate, is used as the substrate 400, the insulating film 401 is not necessarily provided.

The insulating film 401 can be formed using either a single insulating film or by stacking a plurality of insulating films. The insulating film 401 is formed using an insulating material such as silicon oxide, silicon nitride (e.g., $SiN_x$ or $Si_3N_4$), silicon oxynitride ($SiO_xN_y$) (x>y>0), or silicon nitride oxide ($SiN_xO_y$) (x>y>0) by CVD, sputtering, or the like.

In this embodiment mode, the insulating film 401 is formed by sequentially stacking a silicon oxynitride film having a thickness of 100 nm, a silicon nitride oxide film having a thickness of 50 nm, and a silicon oxynitride film having a thickness of 100 nm. However, the material and the thickness of each film, and the number of stacked layers are not limited to them. For example, instead of the silicon oxynitride film formed in the lower layer, a siloxane-based resin having a thickness greater than or equal to 0.5 μm and less than or equal to 3 μm may be formed by a spin coating method, a slit coating method, a droplet discharge method, a printing method, or the like. In addition, instead of the silicon nitride oxide film formed in the middle layer, a silicon nitride (e.g., $SiN_x$ or $Si_3N_4$) film may be used. Further, instead of the silicon oxynitride film formed in the upper layer, a silicon oxide film may be used. The thickness of each film is preferably greater than or equal to 0.05 μm and less than or equal to 3 μm and can be freely selected within this range.

The silicon oxide film can be formed using a mixed gas of silane and oxygen, TEOS (tetraethoxysilane) and oxygen, or the like by a method such as thermal CVD, plasma enhanced CVD, atmospheric pressure CVD, or bias ECRCVD. Further, typically, the silicon nitride film can be formed using a mixed gas of silane and ammonia by plasma enhanced CVD. Furthermore, typically, the silicon oxynitride film and the silicon nitride oxide film can be formed using a mixed gas of silane and dinitrogen monoxide by plasma enhanced CVD.

The semiconductor film 402 is preferably formed without being exposed to the air after forming the insulating film 401. The thickness of the semiconductor film 402 is greater than or equal to 20 nm and less than or equal to 200 nm (preferably greater than or equal to 40 nm and less than or equal to 170 nm, more preferably greater than or equal to 50 nm and less than or equal to 150 nm). Note that the semiconductor film 402 may be formed using either an amorphous semiconductor or a polycrystalline semiconductor. In addition, as the semiconductor, silicon germanium as well as silicon can be used. In the case of using silicon germanium, the concentration of germanium is preferably about 0.01 to 4.5 atomic percent.

Note that the semiconductor film 402 may be crystallized by a known technique. As a known crystallization method, there are a laser crystallization method with laser light and a crystallization method with a catalytic element. Alternatively, it is possible to combine a crystallization method with a catalytic element and a laser crystallization method. In addition, in the case where a substrate having high heat resistance, such as a quartz substrate, is used as the substrate 400, any of the following crystallization methods may be combined: a thermal crystallization method with an electrically heated oven, a lamp annealing crystallization method with infrared light, a crystallization method with a catalytic element, and high temperature annealing at about 950° C.

For example, in the case of using laser crystallization, in order to increase resistance of the semiconductor film 402 with respect to laser, heat treatment at 550° C. for 4 hours is performed on the semiconductor film 402 before laser crystallization. Then, by irradiating the semiconductor film 402 with laser light of second to fourth harmonics of the fundamental wave by using a solid-state laser capable of continuous oscillation, crystals with large grain size can be obtained. For example, typically, a second (532 nm) or third (355 nm) harmonic of an Nd:$YVO_4$ laser (having a fundamental wave of 1064 nm) is preferably used. Specifically, laser light emitted from the continuous wave $YVO_4$ laser is converted into a harmonic by a non-linear optical element to obtain laser light having an output of 10 W. Then, it is preferable to shape the laser light into a rectangular or elliptical shape on an irradiation surface by an optical system so that the semiconductor film 402 is irradiated with the laser light. In this case, an energy density of about 0.01 to 100 $MW/cm^2$ (preferably 0.1 to 10 $MW/cm^2$) is needed. Then, irradiation is performed with a scanning speed of about 10 to 2000 cm/sec.

As a continuous wave gas laser, an Ar laser, a Kr laser, or the like can be used. In addition, as a continuous wave solid-state laser, a YAG laser, a $YVO_4$ laser, a YLF laser, a $YAlO_3$ laser, a forsterite ($Mg_2SiO_4$) laser, a $GdVO_4$ laser, a $Y_2O_3$ laser, a glass laser, a ruby laser, an alexandrite laser, a Ti:sapphire laser, or the like can be used.

Further, as a pulsed laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used, for example.

The laser crystallization may be performed by pulsed laser light at a repetition rate greater than or equal to 10 MHz, which is a significantly higher frequency band than a generally used frequency band of several tens to several hundreds of hertz. It is said that the time between the irradiation of the semiconductor film 402 with the pulsed laser light and complete solidification of the semiconductor film 402 is several tens to several hundreds of nanoseconds. Thus, by using the above frequency band, the semiconductor film 402 can be irradiated with laser light of the next pulse after the semiconductor film 402 is melted by the laser light and before the semiconductor film 402 is solidified. Therefore, a solid-liquid interface can be continuously moved in the semiconductor film 402, so that the semiconductor film 402 having crystal grains which continuously grow toward a scanning direction is formed. Specifically, an aggregation of crystal grains each having a width of 10 to 30 μm in the scanning direction of the crystal grains and a width of about 1 to 5 μm in a direction perpendicular to the scanning direction can be formed. By forming such crystal grains of single crystal grown continuously in the scanning direction, the semiconductor film 402 having few grain boundaries at least in a channel direction of the TFT can be formed.

Note that the laser crystallization may be performed by irradiation with a fundamental wave of continuous wave laser light and a harmonic of continuous wave laser light in parallel. Alternatively, the laser crystallization may be performed by irradiation with a fundamental wave of continuous wave laser light and a harmonic of pulsed laser light in parallel.

Note that the laser irradiation may be performed in an atmosphere of an inert gas such as a rare gas or a nitrogen gas. Thus, roughness of a semiconductor surface due to laser light irradiation can be prevented, and variation in threshold voltage due to variation in interface state density can be suppressed.

By the above laser light irradiation, the semiconductor film 402 with higher crystallinity is formed. Note that a polycrystalline semiconductor which is formed in advance by sputtering, plasma enhanced CVD, thermal CVD, or the like may be used for the semiconductor film 402.

Although the semiconductor film 402 is crystallized in this embodiment mode, the semiconductor film 402 may remain as an amorphous silicon film or a microcrystalline semiconductor film without being crystallized and may be subjected to a process described below. A TFT formed using an amorphous semiconductor or a microcrystalline semiconductor has advantages of low cost and high yield because the number of manufacturing steps is smaller than that of a TFT using a polycrystalline semiconductor.

An amorphous semiconductor can be obtained by glow discharge decomposition of a gas containing silicon. Examples of a gas containing silicon are $SiH_4$, $Si_2H_6$, and the like. The gas containing silicon may be diluted with hydrogen or hydrogen and helium.

Next, channel doping by which an impurity element which imparts p-type conductivity or an impurity element which imparts n-type conductivity is added at a low concentration is performed on the semiconductor film 402. The channel doping may be performed on the whole semiconductor film 402 or may be selectively performed on part of the semiconductor film 402. As an impurity element which imparts p-type conductivity, boron (B), aluminum (Al), gallium (Ga), or the like can be used. As an impurity element which imparts n-type conductivity, phosphorus (P), arsenic (As), or the like can be used. Here, boron (B) is used as the impurity element and is added so that it is contained at a concentration greater than or equal to $1\times10^{16}/cm^3$ and less than or equal to $5\times10^{17}/cm^3$.

Figure 5B:
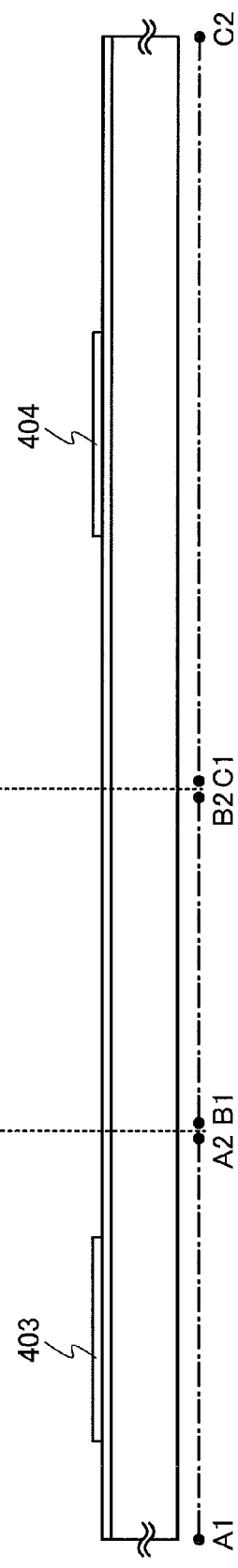
Figure 8:
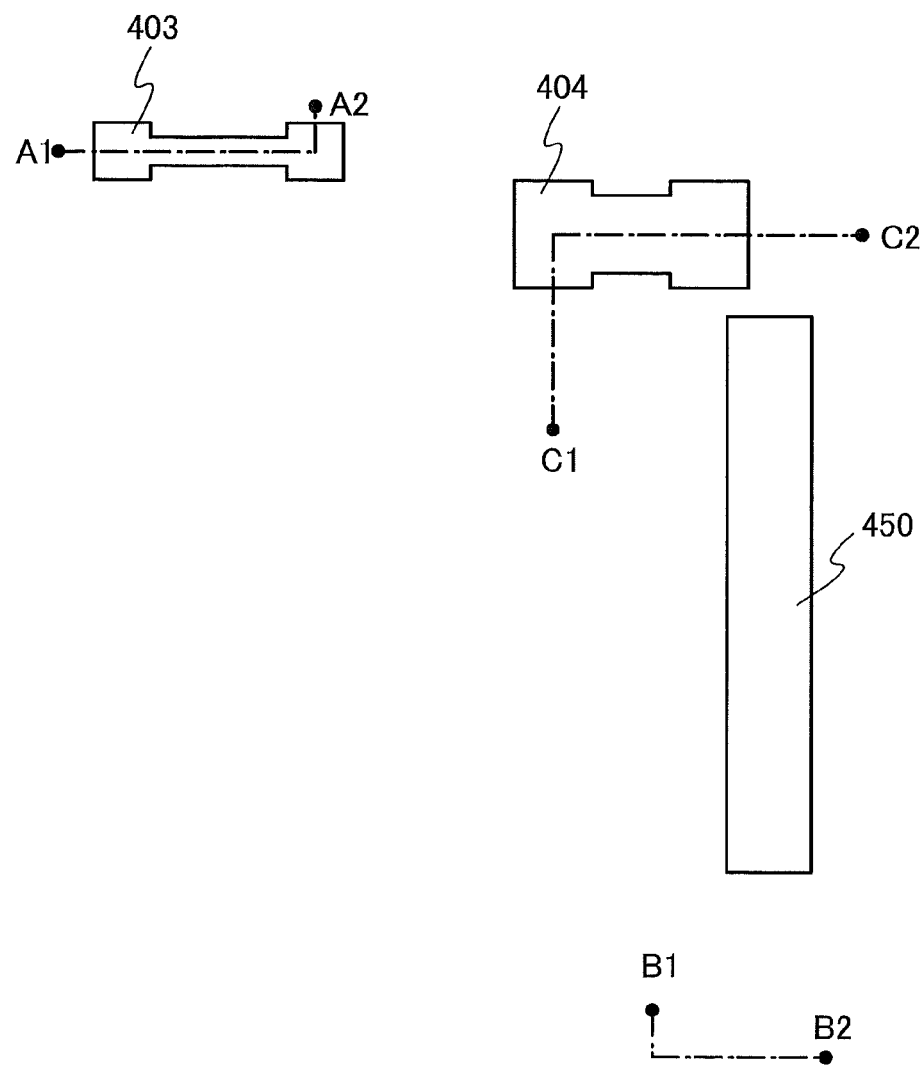
FIG. 8 is a top view showing a method for manufacturing a semiconductor display device of Embodiment Mode 2.

Next, as shown in FIG. 5B, the semiconductor film 402 is processed (patterned) into a desired shape to form a semiconductor film 403 and a semiconductor film 404 which have island shapes. FIG. 8 corresponds to a top view of a pixel in which the semiconductor film 403 and the semiconductor film 404 are formed. FIG. 5B shows a cross-sectional view taken along broken line A1-A2 in FIG. 8, a cross-sectional view taken along broken line B1-B2 in FIG. 8, and a cross-sectional view taken along broken line C1-C2 in FIG. 8. In FIG. 8, a semiconductor film 450 functions as one of electrodes of a storage capacitor.

Figure 5C:
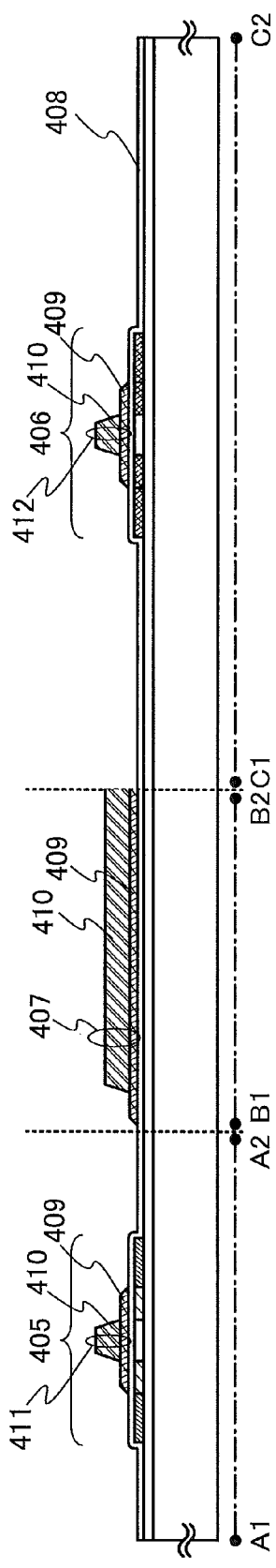

Then, as shown in FIG. 5C, a transistor 405 and a transistor 406 are formed using the semiconductor film 403 and the semiconductor film 404, respectively. In addition, an auxiliary power supply line 407 is formed together with the transistor 405 and the transistor 406.

Specifically, a gate insulating film 408 is formed so as to cover the semiconductor film 403 and the semiconductor film 404. Then, over the gate insulating film 408, a plurality of conductive films 409 and 410 which are processed (patterned) into desired shapes are formed. The conductive films 409 and 410 which overlap with the semiconductor film 403 function as a gate electrode 411 of the transistor 405. The conductive films 409 and 410 which overlap with the semiconductor film 404 function as a gate electrode 412 of the transistor 406. Further, the conductive films 409 and 410, which are formed in a region different from the region where the semiconductor film 403 is formed and the region where the semiconductor film 404 is formed, function as the auxiliary power supply line 407.

Then, impurities which impart n-type or p-type conductivity are added to the semiconductor film 403 and the semiconductor film 404 by using the conductive film 409, the conductive film 410, or a resist which is deposited and patterned, as a mask, so that impurity regions which function as a source region, a drain region, and LDD regions, and the like are formed. Note that here, the transistor 405 is an n-channel transistor and the transistor 406 is a p-channel transistor.

Figure 9:
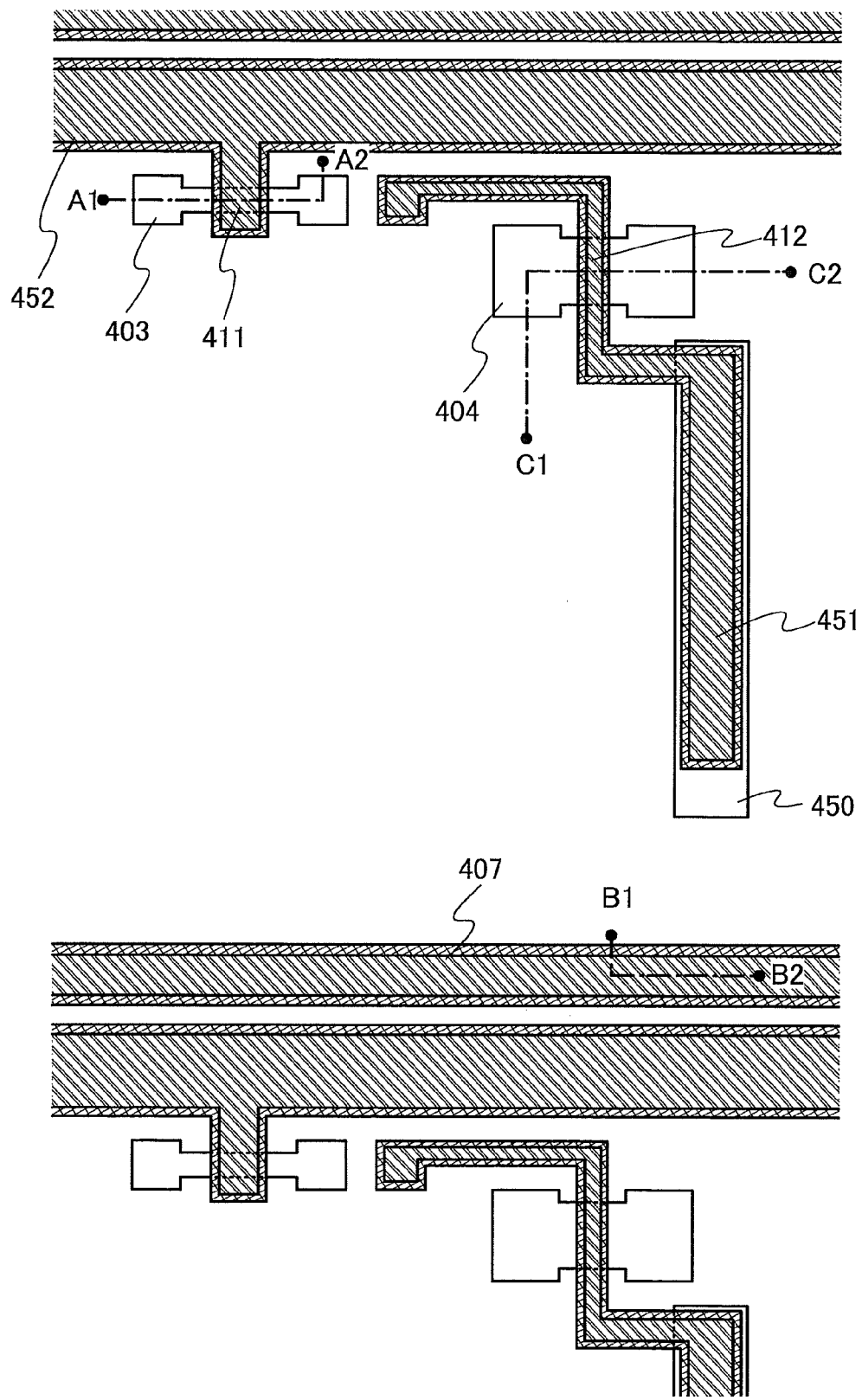
FIG. 9 is a top view showing a method for manufacturing a semiconductor display device of Embodiment Mode 2.

FIG. 9 corresponds to a top view of a pixel in which the transistor 405, the transistor 406, and the auxiliary power supply line 407 are formed. FIG. 5C shows a cross-sectional view taken along broken line A1-A2 in FIG. 9, a cross-sectional view taken along broken line B1-B2 in FIG. 9, and a cross-sectional view taken along broken line C1-C2 in FIG. 9. In FIG. 9, a portion in the conductive films 409 and 410, which overlaps with the semiconductor film 450, corresponds to the other of the electrodes of the storage capacitor. In FIG. 9, an electrode 451 and the gate electrode 412 of the transistor 406 are formed using a series of the conductive films 409 and 410. A region where the gate insulating film 408 is interposed between the semiconductor film 450 and the electrode 451 functions as the storage capacitor. Further, a scan line 452 shown in FIG. 9 is formed using the conductive films 409 and 410 in a manner similar to that of the auxiliary power supply line 407. In FIG. 9, the scan line 452 and the gate electrode 411 of the transistor 405 are formed using a series of the conductive films 409 and 410.

Note that for the gate insulating film 408, a single layer or stacked layers of silicon oxide, silicon nitride, silicon nitride oxide, silicon oxynitride, or the like is used, for example. In the case of using the stacked layers, for example, a three-layer structure of a silicon oxide film, a silicon nitride film, and a silicon oxide film which are stacked from the substrate 400 side is preferably used. Further, as the formation method, plasma enhanced CVD, sputtering, or the like can be used. For example, in the case where the gate insulating film is formed using silicon oxide by plasma enhanced CVD, a mixed gas of TEOS (tetraethyl orthosilicate) and $O_2$ is used; reaction pressure is set to 40 Pa; substrate temperature is set to higher than or equal to 300° C. and lower than or equal to 400° C.; and high-frequency (13.56 MHz) power density is set to greater than or equal to 0.5 W/cm² and less than or equal to 0.8 W/cm².

The gate insulating film 408 may be formed by oxidizing or nitriding surfaces of the semiconductor film 403 and the semiconductor film 404 by high-density plasma treatment. The high-density plasma treatment is performed by using, for example, a mixed gas of a rare gas such as He, Ar, Kr, or Xe, and oxygen, nitrogen oxide, ammonia, nitrogen, or hydrogen. In this case, by exciting plasma by introduction of microwaves, plasma with a low electron temperature and high density can be generated. The surfaces of the semiconductor film 403 and the semiconductor film 404 are oxidized or nitrided by oxygen radicals (OH radicals are included in some cases) or nitrogen radicals (NH radicals are included in some cases) generated by such high-density plasma, so that an insulating film having a thickness greater than or equal to 1 nm and less than or equal to 20 nm, typically greater than or equal to 5 nm and less than or equal to 10 nm is formed so as to be in contact with the semiconductor film 403 and the semiconductor film 404. The insulating film having a thickness greater than or equal to 5 nm and less than or equal to 10 nm is used as the gate insulating film 408.

Oxidation or nitridation of the semiconductor films by the above high-density plasma treatment proceeds by solid-phase reaction. Therefore, interface state density between the gate insulating film and the semiconductor films can be suppressed extremely low. Further, by directly oxidizing or nitriding the semiconductor films by high-density plasma treatment, variation in thickness of the insulating film to be formed can be suppressed. Furthermore, in the case where the semiconductor films have crystallinity, the surfaces of the semiconductor films are oxidized by solid-phase reaction by using high-density plasma treatment, so that crystal grain boundaries can be prevented from being locally oxidized at fast speed and a uniform gate insulating film having low interface state density can be formed. As for a transistor in which an insulating film formed by high-density plasma treatment is included in part of or the entire gate insulating film, variation in characteristics can be suppressed.

Alternatively, aluminum nitride can be used for the gate insulating film 408. Aluminum nitride has relatively high thermal conductivity and can effectively diff-use heat generated in a transistor. Alternatively, after silicon oxide, silicon oxynitride, or the like which does not contain aluminum is formed, aluminum nitride may be stacked thereon to form the gate insulating film.

In addition, although the gate electrode 411, the gate electrode 412, the auxiliary power supply line 407, the electrode 451, and the scan line 452 are formed using the stacked two conductive films 409 and 410 in this embodiment mode, the present invention is not limited to this structure. Instead of the conductive films 409 and 410, a single-layer conductive film or a staked-layer conductive film in which three or more layers are stacked may be used. In the case of using a three-layer structure in which three or more conductive films are stacked, a layered structure of a molybdenum film, an aluminum film, and a molybdenum film may be used.

For the conductive film for forming the gate electrode 411, the gate electrode 412, the auxiliary power supply line 407, the electrode 451, and the scan line 452, tantalum (Ta), tungsten (W), titanium (Ti), molybdenum (Mo), aluminum (Al), copper (Cu), chromium (Cr), niobium (Nb), or the like can be used. Alternatively, an alloy containing any of the above metals as its main component or a compound containing any of the above metals can be used. Alternatively, the conductive film may be formed using a semiconductor such as polycrystalline silicon, in which a semiconductor film is doped with an impurity element which imparts conductivity, such as phosphorus.

In this embodiment mode, tantalum nitride or tantalum (Ta) is used for the conductive film 409, which is a first layer, and tungsten (W) is used for the conductive film 410, which is a second layer. As well as the example described in this embodiment mode, the following combination of two conductive films can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step after forming the two-layer conductive films. Alternatively, as the combination of the two-layer conductive films, silicon doped with an impurity which imparts n-type conductivity and nickel silicide, silicon doped with an impurity which imparts n-type conductivity and tungsten silicide, or the like can be used.

CVD, sputtering, or the like can be used for forming the conductive films 409 and 410. In this embodiment mode, the conductive film 409, which is the first layer, is formed to a thickness greater than or equal to 20 nm and less than or equal to 100 nm and the conductive film 410, which is the second layer, is formed to a thickness greater than or equal to 100 nm and less than or equal to 400 nm.

Note that as a mask used in forming the gate electrode 411, the gate electrode 412, the auxiliary power supply line 407, the electrode 451, and the scan line 452, a mask using silicon oxide, silicon oxynitride, or the like may be used instead of a resist. In this case, a step of forming the mask using silicon oxide, silicon oxynitride, or the like by patterning is additionally needed; however, the thickness of the mask is less reduced in etching as compared to the resist, so that the gate electrode 411, the gate electrode 412, the auxiliary power supply line 407, the electrode 451, and the scan line 452 with desired shapes can be formed. Alternatively, without using the mask, the gate electrode 411, the gate electrode 412, the auxiliary power supply line 407, the electrode 451, and the scan line 452 may be selectively formed by a droplet discharge method. Note that a droplet discharge method refers to a method for forming a predetermined pattern by discharging or ejecting a droplet containing a predetermined composition from an orifice and includes an inkjet method or the like in its category.

Note that when the gate electrode 411, the gate electrode 412, the auxiliary power supply line 407, the electrode 451, and the scan line 452 are formed, an optimal etching method and an optimal etchant may be selected as appropriate in accordance with materials used for the conductive films. An example of an etching method when tantalum nitride is used for the conductive film 409, which is the first layer, and tungsten is used for the conductive film 410, which is the second layer, is described in detail below.

First, after a tantalum nitride film is formed, a tungsten film is formed over the tantalum nitride film. Then, a mask is formed over the tungsten film and first etching is performed. In the first etching, etching is performed under a first etching condition, and then, under a second etching condition. In the first etching condition, etching is performed as follows: an ICP (inductively coupled plasma) etching method is used; $CF_4$, $Cl_2$, and $O_2$ are used for an etching gas with a flow rate of 25:25:10 (sccm); and an RF (13.56 MHz) power of 500 W is applied to a coil-shaped electrode at a pressure of 1 Pa to generate plasma. Then, an RF (13.56 MHz) power of 150 W is also applied to the substrate side (a sample stage) to apply negative self-bias voltage substantially. By using this first etching condition, it is possible to etching the tungsten film so that end portions thereof can have tapered shapes.

Next, etching is performed under the second etching condition. In the second etching conduction, etching is performed for about 30 seconds as follows: $CF_4$ and $Cl_2$ are used for an etching gas with a flow rate of 30:30 (sccm); and an RF (13.56 MHz) power of 500 W is applied to a coil-shaped electrode at a pressure of 1 Pa to generate plasma. Then, an RF (13.56 MHz) power of 20 W is also applied to the substrate side (a sample stage) to apply negative self-bias voltage substantially. In the second etching condition where $CF_4$ and $Cl_2$ are mixed with each other, the tungsten film and the tantalum nitride film are etched to the same or substantially the same degree.

In the first etching, by using an optimal shape for the mask, the end portions of the tantalum nitride film and the tungsten film have tapered shapes each having an angle greater than or equal to 15° and less than or equal to 45° due to the effect of the bias voltage applied to the substrate side. Note that in the gate insulating film 408, a portion which is exposed by the first etching is etched to be thinner than other portions which are covered with the tantalum nitride film and the tungsten film by about 20 to 50 nm.

Next, second etching is performed without removing the mask. In the second etching, the tungsten film is selectively etched using $CF_4$, $Cl_2$, and $O_2$ for an etching gas. In this case, the tungsten film is preferentially etched by the second etching; however, the tantalum nitride film is hardly etched.

Through the first etching and the second etching, it is possible to form the conductive film 409 using tantalum nitride and the conductive film 410 using tungsten, which has smaller width than the conductive film 409.

In addition, by using the conductive film 409 and the conductive film 410 formed through the first etching and the second etching as masks, the impurity regions which function as the source region, the drain region, and the LDD regions can be separately formed in the semiconductor film 403 and the semiconductor film 404, without forming a mask additionally.

After the impurity regions are formed, the impurity regions may be activated by heat treatment. For example, after a silicon oxynitride film having a thickness of 50 nm is formed, heat treatment may be performed at 550° C. for 4 hours in a nitrogen atmosphere.

Alternatively, after a silicon nitride film containing hydrogen is formed to a thickness of 100 nm, heat treatment may be performed at 410° C. for 1 hour in a nitrogen atmosphere so that the semiconductor film 403 and the semiconductor film 404 are hydrogenated. Alternatively, the semiconductor film 403 and the semiconductor film 404 may be hydrogenated as follows: heat treatment is performed at higher than or equal to 400° C. and lower than or equal to 700° C. (preferably higher than or equal to 500° C. and lower than or equal to 600° C.) in a nitrogen atmosphere at an oxygen concentration less than or equal to 1 ppm, preferably less than or equal to 0.1 ppm; and then, heat treatment is performed at higher than or equal to 300° C. and lower than or equal to 450° C. for 1 to 12 hours in an atmosphere containing hydrogen at 3 to 100%. Through this step, dangling bonds can be terminated by thermally excited hydrogen. As a different hydrogenation method, plasma hydrogenation (using hydrogen excited by plasma) may be performed. Alternatively, activation treatment may be performed after an insulating film 413 which is to be formed later is formed.

For the heat treatment, a thermal annealing method using an annealing furnace, a laser annealing method, a rapid thermal annealing method (an RTA method), or the like can be used. By the heat treatment, not only hydrogenation but also activation of an impurity element which is added to the semiconductor film 403 and the semiconductor film 404 can be performed.

Through the above series of steps, the n-channel transistor 405 and the p-channel transistor 406 for controlling the amount of current supplied to a light-emitting element can be formed. Note that the method for manufacturing the transistors is not limited to the above process.

Figure 6A:
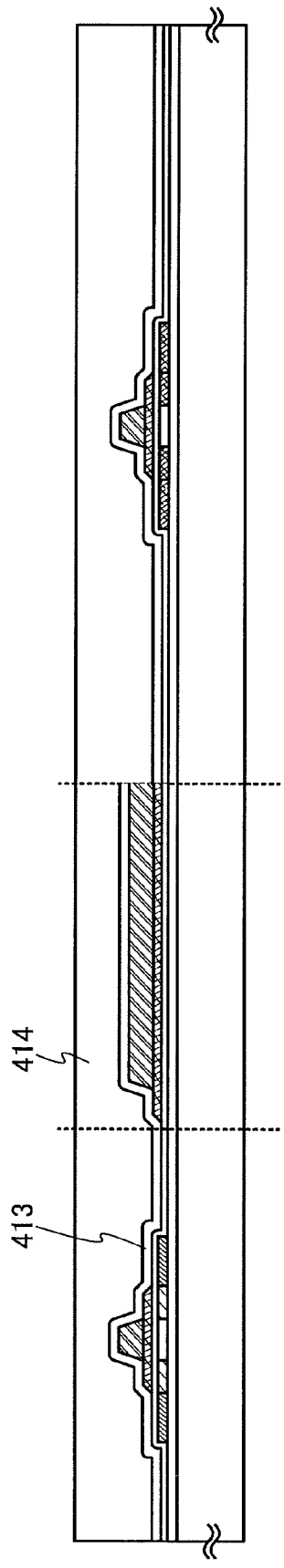
FIGS. 6A and 6B are cross-sectional views showing a method for manufacturing a semiconductor display device of Embodiment Mode 2.

Next, the insulating film 413 is formed so as to cover the transistor 405, the transistor 406, and the auxiliary power supply line 407 as shown in FIG. 6A and so as to cover the electrode 451 and the scan line 452 though not shown in FIG. 6A. Although the insulating film 413 is not necessarily provided, by providing the insulating film 413, impurities such as an alkali metal or an alkaline earth metal can be prevented from entering the transistor 405 and the transistor 406. Specifically, it is preferable to use silicon nitride, silicon nitride oxide, aluminum nitride, aluminum oxide, silicon oxide, silicon oxynitride, or the like for the insulating film 413. In this embodiment mode, a silicon oxynitride film having a thickness of about 600 nm is used for the insulating film 413. In this case, the above hydrogenation step may be performed after the silicon oxynitride film is formed.

Next, an insulating film 414 is formed over the insulating film 413 so as to cover the transistor 405, the transistor 406, and the auxiliary power supply line 407 and so as to cover the electrode 451 and the scan line 452 though not shown in FIG. 6A. An organic material having heat resistance, such as acrylic, polyimide, benzocyclobutene, polyamide, or epoxy, can be used for the insulating film 414. As well as the above organic material, a low dielectric constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like can be used. A Siloxane-based refers to a material in which a skeletal structure is formed by the bond of silicon (Si) and oxygen (O). A siloxane-based resin may have at least one kind of fluorine, a fluoro group, and an organic group (e.g., an alkyl group or an aromatic hydrocarbon group) as well as hydrogen, as a substituent. Note that the insulating film 414 may be formed by stacking a plurality of insulating films formed using such materials.

The insulating film 414 can be formed by CVD, sputtering, SOG, spin coating, dipping, spray coating, a droplet discharge method (e.g., an inkjet method, screen printing, or offset printing), a doctor knife, a roll coater, a curtain coater, a knife coater, or the like, depending on the material of the insulating film 414.

In this embodiment mode, the insulating film 413 and the insulating film 414 function as an interlayer insulating film; however, a single-layer insulating film may be used as the interlayer insulating film, or a stacked-layer insulating film having three or more layers may be used as the interlayer insulating film.

Figure 6B:
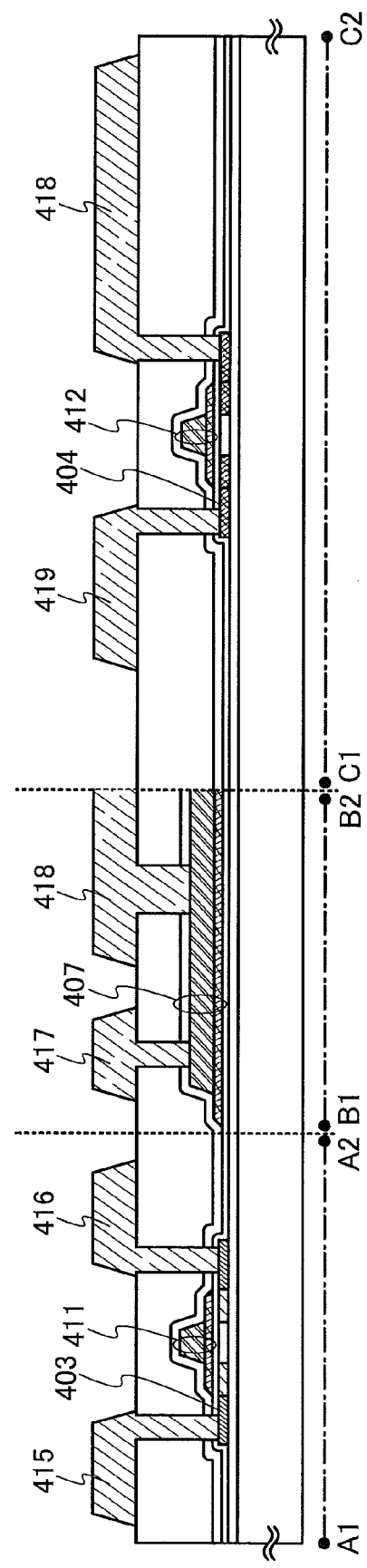

Next, contact holes are formed in the insulating film 413 and the insulating film 414 so that the semiconductor film 403 and the semiconductor film 404 are partly exposed. As an etching gas for opening the contact holes, a mixed gas of $CHF_3$ and He is preferably used; however, the etching gas is not limited to this. Further, as shown in FIG. 6B, conductive films 415 and 416 which are in contact with the semiconductor film 403 through the contact holes, conductive films 417 and 418 which are in contact with the auxiliary power supply line 407 through the contact holes, and conductive films 419 and 418 which are in contact with the semiconductor film 404 through the contact holes are formed.

Figure 10:
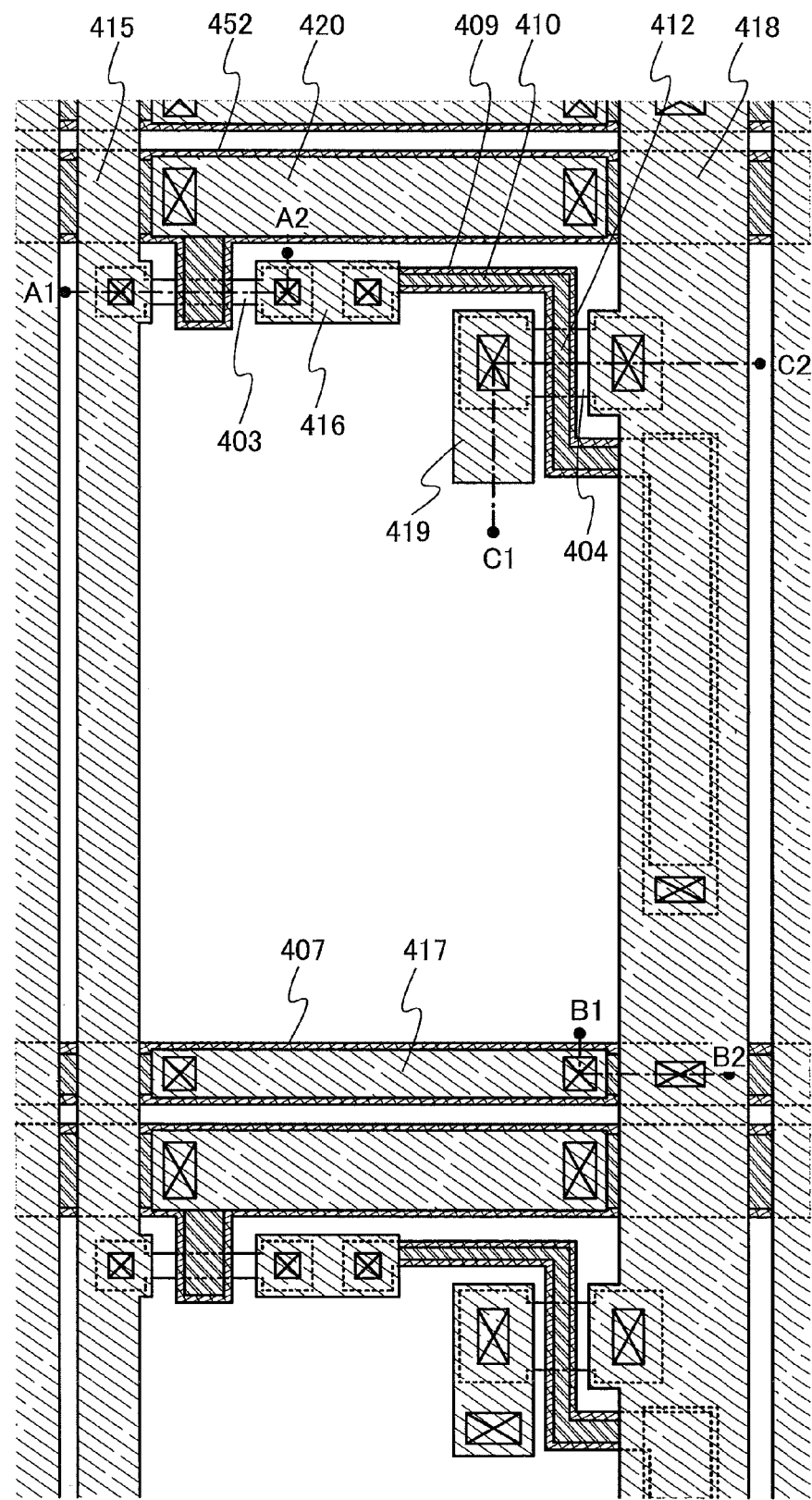
FIG. 10 is a top view showing a method for manufacturing a semiconductor display device of Embodiment Mode 2.

FIG. 10 corresponds to a top view of a pixel in which the conductive films 415 to 419 are formed. FIG. 6B shows a cross-sectional view taken along broken line A1-A2 in FIG. 10, a cross-sectional view taken along broken line B1-B2 in FIG. 10, and a cross-sectional view taken along broken line C1-C2 in FIG. 10. As shown in FIG. 10, the conductive film 416 is connected to the conductive films 409 and 410, part of which functions as the gate electrode 412. The conductive film 415 functions as a signal line. In addition, the conductive film 417 functions as an auxiliary wiring. Further, the conductive film 418 functions as a power supply line and is electrically connected to another conductive film 418 which functions as a power supply line through the auxiliary power supply line 407. As shown in FIG. 10, a conductive film 420 is formed together with the conductive films 415 to 419 so as to be connected to the scan line 452 through the contact hole. The conductive film 420 functions as a scan line auxiliary wiring.

The conductive films 415 to 420 can be formed by CVD, sputtering, or the like. Specifically, for the conductive films 415 to 420, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy containing any of the above elements as its main component or a compound containing any of the above elements can be used. As the conductive films 415 to 420, a single-layer film having any of the above elements or a plurality of stacked films having any of the above elements can be used.

An example of an alloy containing aluminum as its main component is an alloy which contains aluminum as its main component and contains nickel. Further, an alloy which contains aluminum as its main component and contains nickel and one or both of carbon and silicon is an example of an alloy containing aluminum as its main component. Since aluminum and aluminum silicon have low resistance values and are inexpensive, aluminum and aluminum silicon are suitable for materials used for the conductive films 415 to 420. In particular, generation of hillocks in resist baking can be prevented more in the case where aluminum silicon is used for patterning the conductive films 415 to 420 than in the case where an aluminum film is used. Further, instead of silicon (Si), Cu may be mixed into the aluminum film at about 0.5%.

For example, a layered structure of a barrier film, an aluminum silicon film, and a barrier film or a layered structure of a barrier film, an aluminum silicon film, a titanium nitride film, and a barrier film may be used for the conductive films 415 to 420. Note that a barrier film refers to a film formed using titanium, nitride of titanium, molybdenum, or nitride of molybdenum. By forming barrier films so as to interpose an aluminum silicon film, generation of hillocks in aluminum or aluminum silicon can be further prevented. Alternatively, by forming the barrier film by using titanium that is a highly reducible element, even if a thin oxide film is formed over the semiconductor film 403 and the semiconductor film 404, the oxide film is reduced by titanium contained in the barrier film, so that favorable contact between the conductive films 415, 416, 418, and 419 and the semiconductor films 403 and 404 can be obtained. Further, a plurality of barrier films may be stacked. In that case, for example, a five-layer structure in which titanium, titanium nitride, aluminum silicon, titanium, and titanium nitride are stacked from the lowest layer can be used for the conductive films 415 to 420.

The electric conductivity of at least one conductive film used for the conductive films 415 to 420 is preferably higher than the electric conductivity of at least one conductive film used for the gate electrode 411, the gate electrode 412, the auxiliary power supply line 407, the electrode 451, and the scan line 452 which are formed below the insulating film 413 and the insulating film 414. Alternatively, the thickness of any part of the conductive films 415 to 420 is preferably greater than the thickness of any part of the gate electrode 411, the gate electrode 412, the auxiliary power supply line 407, the electrode 451, and the scan line 452. Specifically, the thickness of any part of the conductive films 415 to 420 is preferably greater than or equal to 0.8 µm and less than or equal to 1.5 µm. When the thickness of the conductive films 415 to 420 is set as described above, it is possible to increase the electric conductivity and to lower combined resistance of the auxiliary power supply line and the auxiliary wiring and combined resistance of the scan line and the scan line auxiliary wiring.

In this embodiment mode, a titanium film having a thickness of about 100 nm, an aluminum film having a thickness of about 700 to 1000 nm, and a titanium film having a thickness of about 100 nm are stacked in that order from the insulating film 414 side. Then, these stacked films are patterned to form the conductive films 415 to 420.

Next, an insulating film 421 is formed so as to cover the conductive films 415 to 419 as shown in FIG. 7A and so as to cover the conductive film 420 though not shown in FIG. 7A. After that, a contact hole is formed in the insulating film 421 so that part of the conductive film 419 is exposed. Then, a pixel electrode 422 is formed so as to be in contact with the conductive film 419 through the contact hole.

The insulating film 421 can be formed using an organic resin film, an inorganic insulating film, or a siloxane-based insulating film. As an organic resin film, acrylic, epoxy, polyimide, polyamide, polyvinyl phenol, benzocyclobutene, or the like can be used, for example. As an inorganic insulating film, silicon oxide, silicon oxynitride, silicon nitride oxide, a film containing carbon typified by diamond like carbon (DLC), or the like can be used. Further, the insulating film 421 can be formed by CVD, sputtering, a droplet discharge method, a printing method, or the like depending on the material used for the insulating film 421. Note that as the insulating film 421, a film through which a substance which causes increase in deterioration of a light-emitting element, such as moisture or oxygen, penetrates in smaller amount than those of other insulating films is preferably used. In that case, silicon nitride formed by RF sputtering, diamond like carbon (DLC), aluminum nitride, or the like is preferably used for the insulating film 421.

Further, in this embodiment mode, after a light-transmitting conductive film is formed using indium tin oxide containing silicon oxide (ITSO) by sputtering, the conductive film is patterned to form the pixel electrode 422. Note that a light-transmitting oxide conductive material other than ITSO, such as indium tin oxide (ITO), zinc oxide (ZnO), indium oxide zinc (IZO), or zinc oxide to which gallium is added (GZO), may be used for the pixel electrode 422. Alternatively, for the pixel electrode 422, as well as the light-transmitting oxide conductive material, a single-layer film containing one or more of titanium nitride, zirconium nitride, Ti, W, Ni, Pt, Cr, Ag, Al, and the like, a layered structure of a titanium nitride and a film containing aluminum as its main component, a three-layer structure of a titanium nitride film, a film containing aluminum as its main component, and a titanium nitride film, or the like can be used, for example. Note that in the case where light is extracted from the pixel electrode 422 side by using a material other than the light-transmitting oxide conductive material, the pixel electrode 422 is formed to a thickness such that light can transmit therethrough (preferably about 5 to 30 nm).

In the case of using ITSO for the pixel electrode 422, a target in which silicon oxide is contained in ITO at 2 to 10 weight percent can be used. In this embodiment mode, by using a target containing $In_2O_3$, $SnO_2$, and $SiO_2$ at a weight percent ratio of 85:10:5, a conductive film which serves as the pixel electrode 422 can be formed to a thickness of 105 nm, with a flow rate of Ar at 50 sccm, a flow rate of $O_2$ at 3 sccm, a sputtering pressure of 0.4 Pa, a sputtering power of 1 kW, and a deposition rate of 30 nm/min.

Note that in the case where a metal having relatively high ionization tendency, such as aluminum, is used for a portion in the conductive film 419, which is in contact with the pixel electrode 422, electrolytic corrosion easily occurs in the conductive film 419 when a light-transmitting conductive oxide material is used for the pixel electrode 422. However, in this embodiment mode, the conductive film 419 is formed using the conductive film in which the titanium film, the aluminum film, and the titanium film are stacked in that order from the insulating film 414 side; the conductive film 419 is covered with the insulating film 421; and the pixel electrode 422 is in contact with the titanium film in the conductive film 419, which is formed in the top part, through the contact hole formed in the insulating film 421. Thus, a metal film formed using a metal having relatively high ionization tendency, such as aluminum, is interposed between metal films formed using a metal having relatively low ionization tendency, such as titanium, and the conductive film 419 is covered with the insulating film 421, so that electrolytic corrosion can be prevented from occurring in the conductive film 419 due to the contact with the pixel electrode 422 or other conductors. Further, by using a metal film formed using a metal having relatively high conductivity, such as aluminum, for the conductive film 419, the resistance value of the conductive film 419 can be lowered.

Note that the conductive film which serves as the pixel electrode 422 can be formed using a conductive composition containing a conductive high-molecular compound (also referred to as a conductive polymer). It is preferable that the conductive film which is formed using the conductive composition and serves as the pixel electrode 422 have a sheet resistance of 10000 ohm/square or less and a light transmittance of 70% or more at a wavelength of 550 nm. The sheet resistance of the conductive film is preferably lower. In addition, it is preferable that the resistivity of the conductive high-molecular compound contained in the conductive composition be 0.1 ohm·cm or less.

Note that as the conductive high-molecular compound, a so-called π electron conjugated conductive high-molecular compound can be used. For example, polyaniline and/or its derivatives, polypyrrole and/or its derivatives, polythiophene and/or its derivatives, copolymers of two or more kinds of them, and the like can be used as a π electron conjugated conductive high-molecular compound.

As specific examples of a π electron conjugated conductive high-molecular compound, the following can be given: polypyrrole, poly(3-methylpyrrole), poly(3-butylpyrrole), poly (3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3- methoxypyrrole), poly(3-ethoxypyrrole), poly(3-octoxypyrrole), poly(3-carboxypyrrole), poly(3-methyl-4-carboxypyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxythiophene), poly(3-methyl-4-carboxythiophene), poly(3,4-ethylenedioxythiophene), polyaniline, poly(2-methylaniline), poly(2-octylaniline), poly(2-isobutylaniline), poly(3-isobutylaniline), poly(2-aniline sulfonic acid), poly (3-aniline sulfonic acid), and the like.

Any of the above π electron conjugated conductive high-molecular compounds may be used alone for the pixel electrode 422 as a conductive composition. Alternatively, any of the above π electron conjugated conductive high-molecular compounds can be used by adding an organic resin thereto in order to adjust film characteristics such as uniformity in thickness of a film of a conductive composition film and intensity of the film of the conductive composition.

The organic resin may be a thermosetting resin, a thermoplastic resin, or a photocurable resin as long as the organic resin is compatible with the conductive high-molecular compound or can be mixed and dispersed into the conductive high-molecular compound. For example, the following can be used: a polyester-based resin such as polyethylene terephthalate, polybutylene terephthalate, or polyethylene naphthalate; a polyimide-based resin such as polyimide or polyamide imide; a polyamide resin such as polyamide 6, polyamide 66, polyamide 12, or polyamide 11; a fluorine resin such as poly(vinylidene fluoride), poly(vinyl fluoride), polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin; a melamine resin; a phenol-based resin; polyether; an acrylic-based resin; or a copolymer of any of these resins.

Further, in order to adjust the electric conductivity of the conductive composition, the conductive composition may be doped with an acceptor dopant or a donor dopant so that an oxidation-reduction potential of a conjugated electron in the π electron conjugated conductive high-molecular compound can be changed.

As an acceptor dopant, a halogen compound, a Lewis acid, a protonic acid, an organic cyano compound, an organic metal compound, or the like can be used. As a halogen compound, there are chlorine, bromine, iodine, iodine chloride, iodine bromide, iodine fluoride, and the like. As a Lewis acid, there are phosphorus pentafluoride, arsenic pentafluoride, antimony pentafluoride, boron trifluoride, boron trichloride, boron tribromide, and the like. As a protonic acid, there are inorganic acid such as hydrochloric acid, sulfuric acid, nitric acid, phosphoric acid, fluoroboric acid, hydrofluoric acid, or perchloric acid and organic acid such as organic carboxylic acid or organic sulfonic acid. As organic carboxylic acid and organic sulfonic acid, the above carboxylic acid compound and sulfonic acid compound can be used. As the organic cyano compound, a compound in which two or more cyano groups are included in a conjugated bond can be used. As an organic cyano compound, a compound having two or more cyano groups in a conjugated bond can be used. For example, tetracyanoethylene, tetracyanoethylene oxide, tetracyanobenzene, tetracyanoquinodimethane, tetracyanoazanaphthalene, or the like can be used.

As a donor dopant, alkali metal, alkaline earth metal, a quaternary amine compound, or the like can be used.

The conductive composition is dissolved in water or an organic solvent (e.g., an alcohol-based solvent, a ketone-based solvent, an ester-based solvent, a hydrocarbon-based solvent, or an aromatic-based solvent), so that the conductive film which serves as the pixel electrode 422 can be formed by a wet process.

A solvent in which the conductive composition is dissolved is not particularly limited to a certain solvent. A solvent in which the above conductive high-molecular compound and a high-molecular resin compound such as an organic resin are dissolved may be used. For example, the conductive composition may be dissolved in any one or a mixture of water, methanol, ethanol, propylene carbonate, N-methylpyrrolidone, dimethylformamide, dimethylacetamide, cyclohexanone, acetone, methyl ethyl ketone, methyl isobutyl ketone, toluene, or the like.

After the conductive composition is dissolved in a solvent as described above, deposition thereof can be performed by a wet process such as an application method, a coating method, a droplet discharge method (also referred to as an inkjet method), or a printing method. The solvent may be evaporated by thermal treatment or may be evaporated under reduced pressure. In the case where the organic resin is a thermosetting resin, heat treatment may be further performed. In the case where the organic resin is a photocurable resin, light irradiation treatment may be performed.

After the conductive film which serves as the pixel electrode 422 is formed, the surface thereof may be cleaned or polished by, for example, CMP or by cleaning with a polyvinyl alcohol-based porous body so that the surface thereof is flattened.

Next, as shown in FIG. 7A, a partition 423 having an opening portion is formed over the insulating film 421 so as to cover part of the pixel electrode 422. Part of the pixel electrode 422 is exposed in the opening portion of the partition 423. The partition 423 can be formed using an organic resin film, an inorganic insulating film, or a siloxane-based insulating film. In the case of using an organic resin film, for example, acrylic, polyimide, or polyamide can be used. In the case of using an inorganic insulating film, silicon oxide, silicon nitride oxide, or the like can be used. In particular, by using a photosensitive organic resin film for the partition 423 and forming an opening portion over the pixel electrode 422 so that the side wall of the opening portion has an inclined surface of continuous curvature, the pixel electrode 422 and a common electrode 425 which is to be formed later can be prevented from being connected to each other. In this case, a mask can be formed by a droplet discharge method or a printing method. Further, the partition 423 itself can be formed by a droplet discharge method or a printing method.

Figure 11:
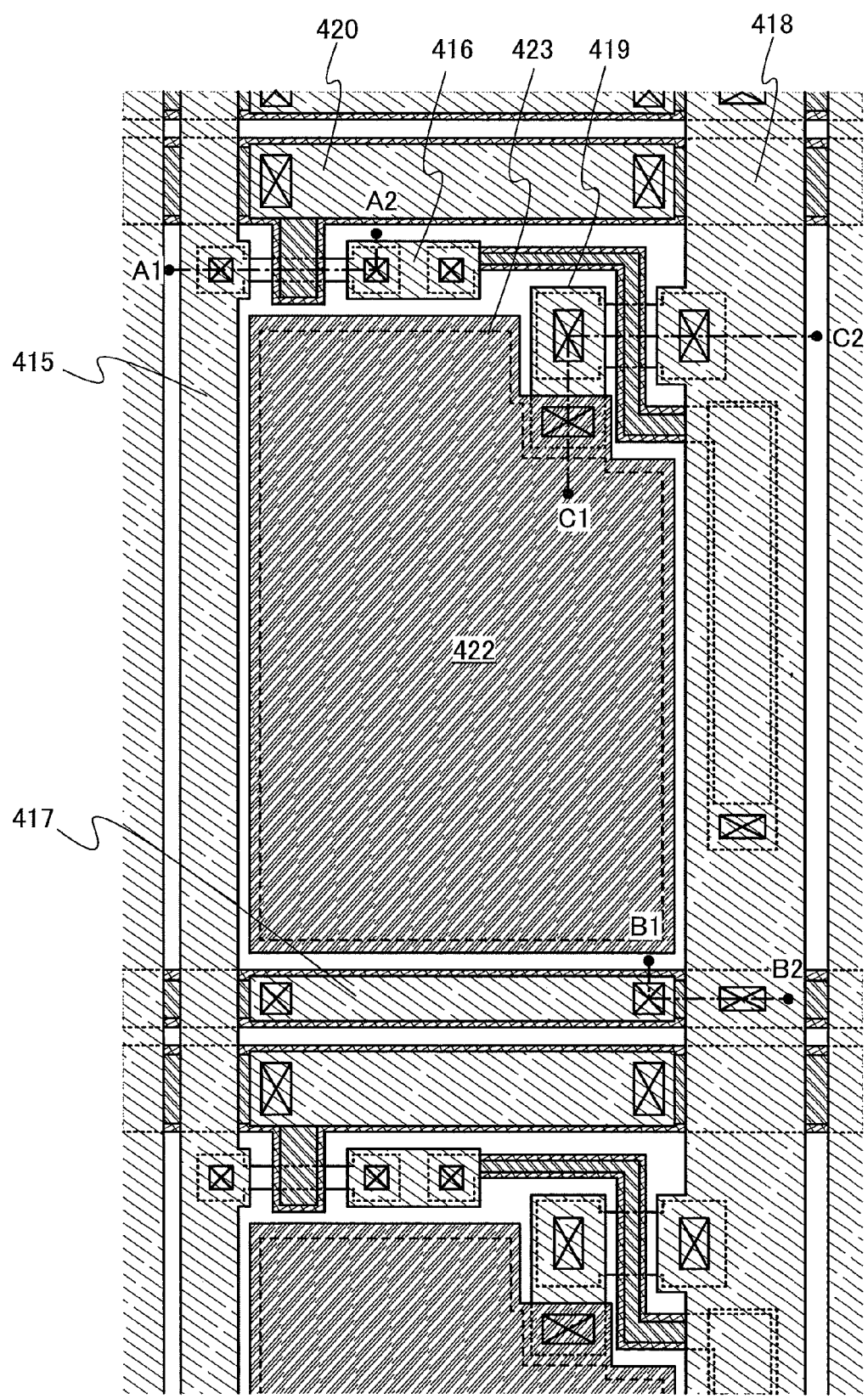
FIG. 11 is a top view showing a method for manufacturing a semiconductor display device of Embodiment Mode 2.

FIG. 11 corresponds to a top view of a pixel in which the pixel electrode 422 and the partition 423 are formed. FIG. 7A shows a cross-sectional view taken along broken line A1-A2 in FIG. 11, a cross-sectional view taken along broken line B1-B2 in FIG. 11, and a cross-sectional view taken along broken line C1-C2 in FIG. 11. Note that in FIG. 11, the position of the opening portion in the partition 423 is represented by a broken line. As shown in FIG. 11, the partition 423 is formed so as to cover all of the conductive films 415 to 420 formed over the insulating film 414. With such a structure, even when the thickness of the conductive films 415 to 420 is set greater than or equal to 0.8 μm and less than or equal to 1.5 μm in order to lower the resistance values, an electroluminescent layer 424 which is to be formed later can be prevented from being extremely thinned or disconnected due to a step formed between the insulating film 414 and the conductive films 415 to 420.

Next, before the electroluminescent layer 424 is formed, heat treatment under an air atmosphere or heat treatment (vacuum baking) under a vacuum atmosphere may be performed in order to remove moisture, oxygen, or the like adsorbed in the partition 423 and the pixel electrode 422. Specifically, heat treatment is performed at a substrate temperature of higher than or equal to 200° C. and lower than or equal to 450° C., preferably higher than or equal to 250° C. and lower than or equal to 300° C. for about 0.5 to 20 hours in a vacuum atmosphere. Pressure is preferably lower than or equal to $3 \times 10^{-7}$ Torr, most preferably lower than or equal to $3 \times 10^{-8}$ Torr if possible. In addition, in the case where the electroluminescent layer 424 is deposited after heat treatment is performed in a vacuum atmosphere, the reliability can be further improved by putting the substrate in the vacuum atmosphere just before the deposition of the electroluminescent layer 424. Further, the pixel electrode 422 may be irradiated with an ultraviolet ray before or after the vacuum baking.

Next, as shown in FIG. 7B, the electroluminescent layer 424 is formed so as to be in contact with the pixel electrode 422 in the opening portion of the partition 423. The electroluminescent layer 424 may be formed using either a single layer or by stacking a plurality of layers; and an inorganic material as well as an organic material may be included in each layer. Luminescence of the electroluminescent layer 424 refers to light emission (fluorescence) in returning from a singlet-excited state to a ground state and light emission (phosphorescence) in returning from a triplet-excited state to a ground state. In the case where the electroluminescent layer 424 is formed using a plurality of layers, an electron injection layer, an electron transport layer, a light-emitting layer, a hole transport layer, and a hole injection layer are stacked in that order over the pixel electrode 422 which corresponds to a cathode. Note that in the case where the pixel electrode 422 corresponds to an anode, the electroluminescent layer 424 is formed by stacking a hole injection layer, a hole transport layer, a light-emitting layer, an electron transport layer, and an electron injection layer in that order.

Alternatively, the electroluminescent layer 424 can be formed by a droplet discharge method by using any of a high-molecular organic compound, an intermediate-molecular organic compound (an organic compound having no sublimation property and having a molecular chain length less than or equal to 10 μm), a low-molecular organic compound, and an inorganic compound. Further, an intermediate-molecular organic compound, a low-molecular organic compound, and an inorganic compound may be formed by vapor deposition.

Next, as shown in FIG. 7B, the common electrode 425 is formed so as to cover the electroluminescent layer 424. For the common electrode 425, a metal, an alloy, or an electroconductive compound, which generally has a small work function, a mixture thereof, or the like can be used. Specifically, the common electrode 425 can be formed using an alkali metal such as Li or Cs; an alkaline earth metal such as Mg, Ca, or Sr; an alloy containing any of these metals (e.g., Mg:Ag or Al:Li); or a rare earth metal such as Yb or Er. Further, by forming a layer containing a material having a high electron injection property so as to be in contact with the common electrode 425, a normal conductive film formed using aluminum, a light-transmitting oxide conductive material, or the like can be used.

The pixel electrode 422, the electroluminescent layer 424, and the common electrode 425 overlap with each other in the opening portion of the partition 423, so that a light-emitting element 426 is formed.

Note that light from the light-emitting element 426 may be extracted from the pixel electrode 422 side, the common electrode 425 side, or both sides. In accordance with an objective structure among the three structures described above, the material and the thickness of each of the pixel electrode 422 and the common electrode 425 are selected.

Note that an insulating film may be formed over the common electrode 425 after the light-emitting element 426 is formed. As the insulating film, a film through which a substance which causes increase in deterioration of a light-emitting element, such as moisture or oxygen, penetrates in smaller amount than those of other insulating films is used. Typically, for example, a DLC film, a carbon nitride film, a silicon nitride which is formed by RF sputtering, or the like is preferably used. Alternatively, the above film through which a substance such as moisture or oxygen penetrates in smaller amount and a film through which a substance such as moisture or oxygen penetrates in larger amount than that of the film are stacked so that the films can be used as the above insulating film.

Note that in practice, when the process is completed up to and including FIG. 7B, packaging (encapsulation) is preferably performed using a protective film (e.g., an attachment film or an ultraviolet curable resin film) or a cover material, which has high airtightness and causes less degassing, so that additional exposure to the air is prevented.

Through the above process, the semiconductor display device can be manufactured.

Note that although the method for manufacturing the transistor 405 and the transistor 406 in the display region is described in this embodiment mode, a transistor used for a driver circuit or an integrated circuit can be formed together with the transistors in the display region. In this case, it is not necessary that the thickness of the gate insulating film 408 be the same in all of the transistors in the display region and the transistor used for the driver circuit or the integrated circuit. For example, in the transistor used for the driver circuit or the integrated circuit, which needs to be operated at high speed, the thickness of the gate insulating film 408 may be smaller than that of the transistors in the display region.

Further, by using an SOI (silicon on insulator) substrate, a single crystal semiconductor can be used for the semiconductor film 402 and the semiconductor film 403. An SOI substrate can be manufactured using, for example, an attachment method such as UNIBOND (registered trademark) typified by Smart Cut (registered trademark), epitaxial layer transfer (ELTRAN), a dielectric separation method, or plasma assisted chemical etching (PACE); separation by implanted oxygen (SIMOX); or the like.

By transferring the semiconductor element manufactured using the above method to a flexible substrate such as a plastic substrate, the semiconductor display device may be formed. As a transferring method, any of the following methods can be used; a method by which a metal oxide film is formed between the substrate and the semiconductor element and the metal oxide film is weakened by crystallization so that the semiconductor element is separated from the substrate and transferred; a method by which an amorphous silicon film containing hydrogen is provided between the substrate and the semiconductor element and the amorphous silicon film is removed by laser light irradiation or etching so that the semiconductor element is separated from the substrate and transferred; a method by which the substrate over which the semiconductor element is formed is mechanically removed or is removed by etching with a solution or a gas so that the semiconductor element is separated from the substrate and transferred; and the like. Note that the semiconductor element is preferably transferred before the light-emitting element is manufactured.

This embodiment mode can be combined with any of other embodiment modes as appropriate.

Embodiment Mode 3

In this embodiment mode, the structure of a semiconductor display device in which the number of transistors included in a pixel and connection relationships thereof are different from those of Embodiment Mode 1 is described.

Figure 12:
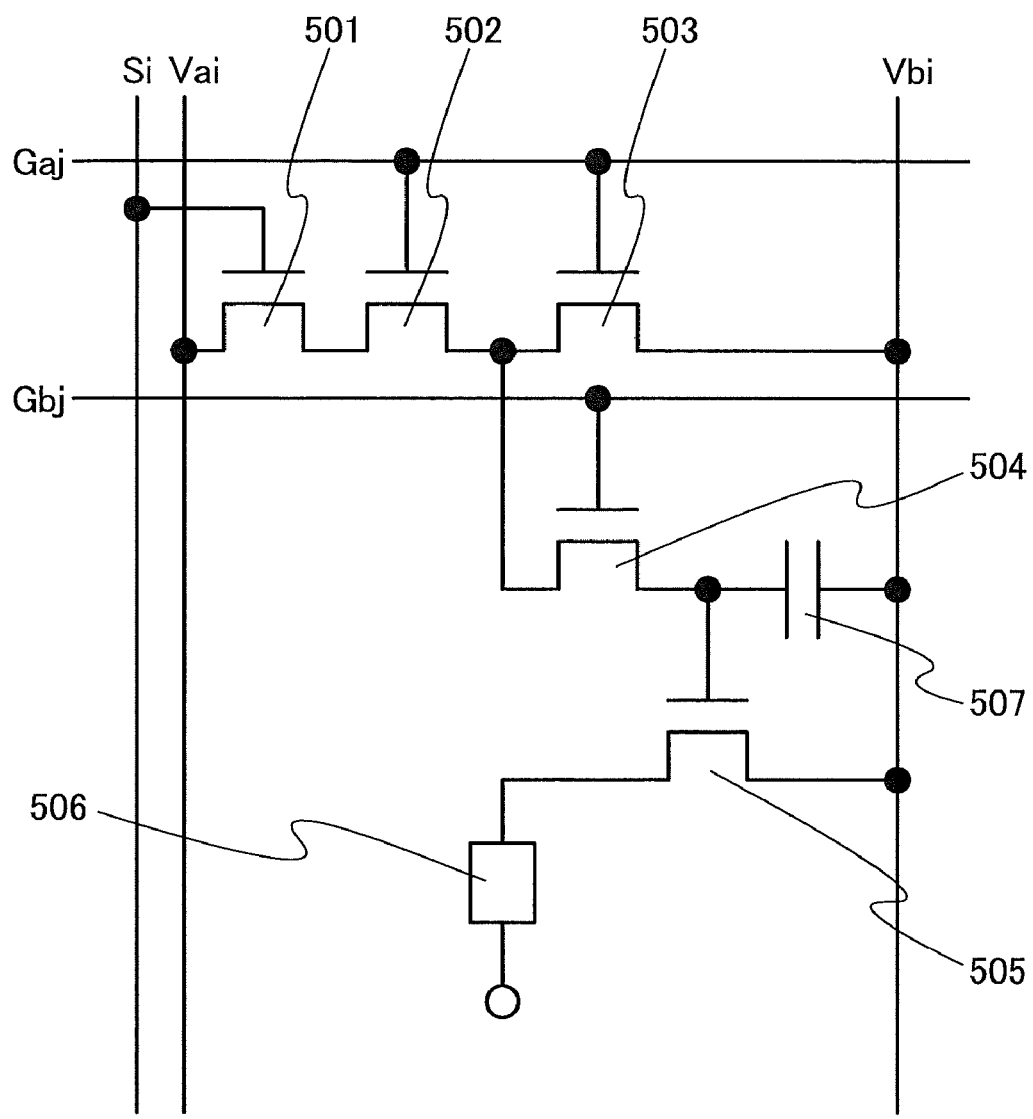
FIG. 12 is a circuit diagram of a pixel included in a semiconductor display device of Embodiment Mode 3.

FIG. 12 shows a circuit diagram of a pixel included in a semiconductor display device of this embodiment mode. The pixel shown in FIG. 12 includes at least a signal line Si (i is any one of 1 to x), a first power supply line Vai (i is any one of 1 to x), a second power supply line Vbi (i is any one of 1 to x), a first scan line Gaj (j is any one of 1 to y), and a second scan line Gbj (j is any one of 1 to y). In addition, the pixel shown in FIG. 12 includes at least transistors 501 to 505 and a light-emitting element 506. Further, the pixel shown in FIG. 12 includes a storage capacitor 507 between a gate electrode of the transistor 505 and the second power supply line Vbi; however, the storage capacitor 507 is not necessarily provided.

A gate electrode of the transistor 501 is connected to the signal line Si. One of a source region and a drain region of the transistor 501 is connected to the first power supply line Vai. The other of the source region and the drain region of the transistor 501 is connected to one of a source region and a drain region of the transistor 502. A gate electrode of the transistor 502 is connected to the first scan line Gaj. The other of the source region and the drain region of the transistor 502 is connected to one of a source region and a drain region of the transistor 503 and one of a source region and a drain region of the transistor 504. A gate electrode of the transistor 503 is connected to the first scan line Gaj. The other of the source region and the drain region of the transistor 503 is connected to the second power supply line Vbi. A gate electrode of the transistor 504 is connected to the second scan line Gbj. The other of the source region and the drain region of the transistor 504 is connected to the gate electrode of the transistor 505. One of a source region and a drain region of the transistor 505 is connected to the second power supply line Vbi. The other of the source region and the drain region of the transistor 505 is connected to a pixel electrode of the light-emitting element 506.

Further, the transistor 502 and the transistor 503 have opposite polarities. When one of the transistor 502 and the transistor 503 is on, the other is off.

Figure 13:
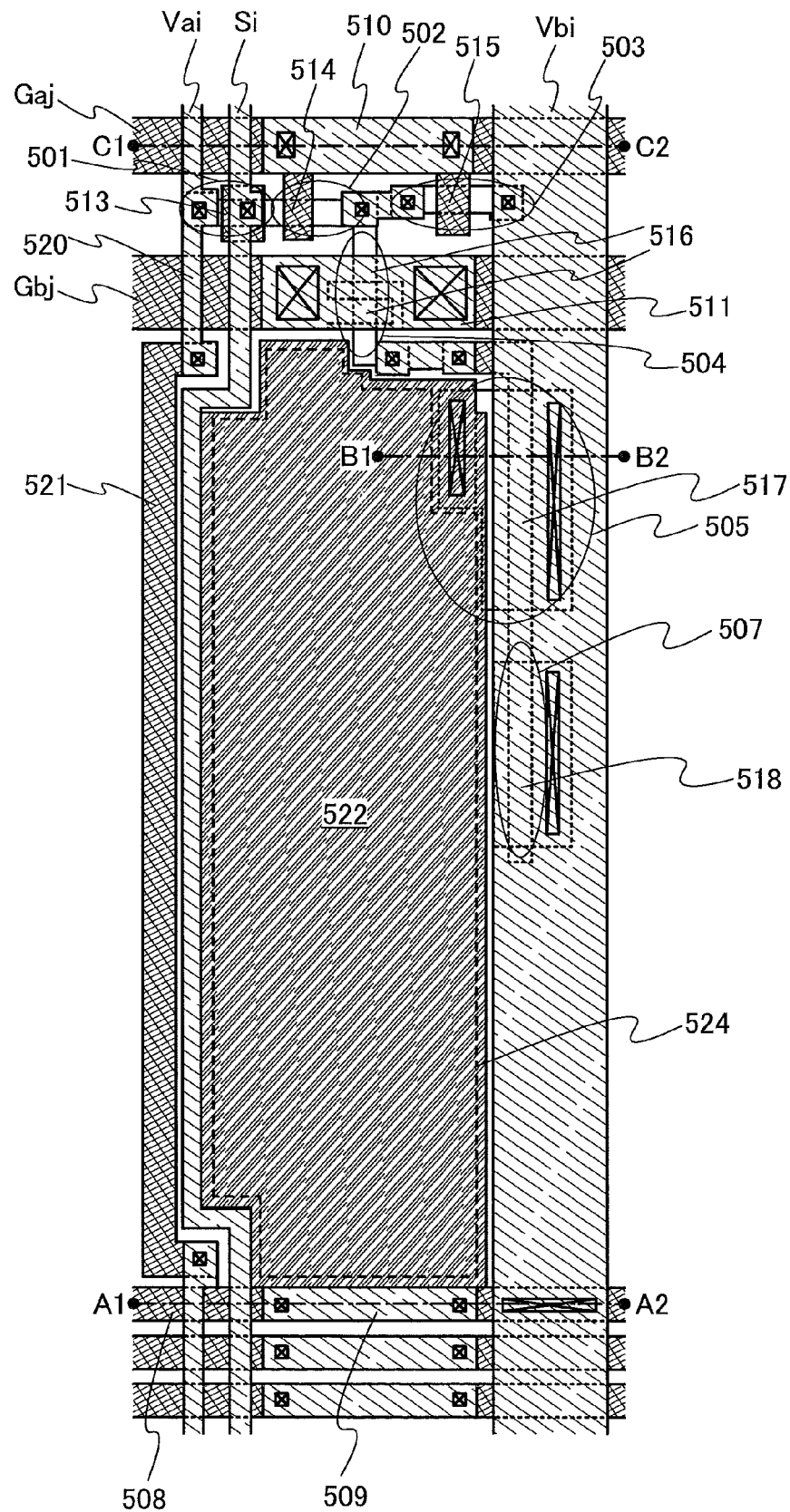
FIG. 13 is a top view of a pixel included in a semiconductor display device of Embodiment Mode 3.
Figure 14A:
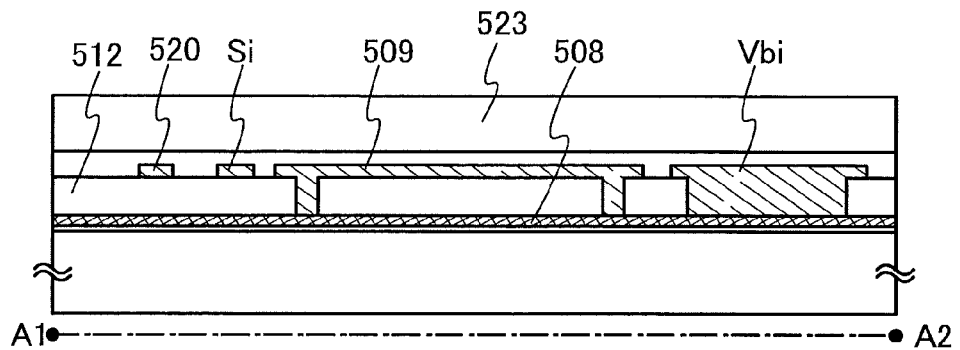
FIGS. 14A to 14C are cross-sectional views of the pixel included in a semiconductor display device of Embodiment Mode 3.
Figure 14B:
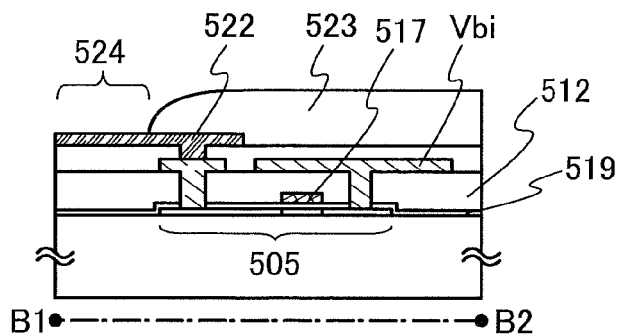
Figure 14C:
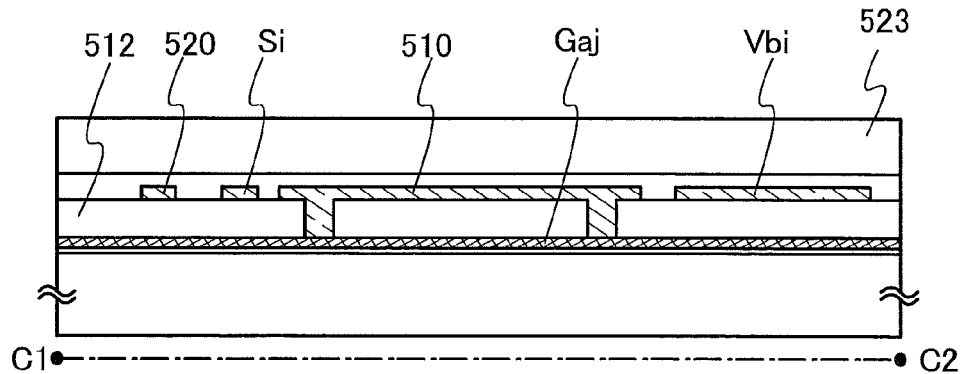

Next, an example of a top view of a display region shown in the circuit diagram in FIG. 12 is shown in FIG. 13. FIG. 14A shows a cross-sectional view taken along broken line A1-A2 in FIG. 13. FIG. 14B shows a cross-sectional view taken along broken line B1-B2 in FIG. 13. FIG. 14C shows a cross-sectional view taken along broken line C1-C2 in FIG. 13. Note that the light-emitting element 506 includes the pixel electrode, a common electrode, and an electroluminescent layer to which current is supplied by the pixel electrode and the common electrode. Note that in FIG. 13 and FIGS. 14A to 14C, only the layout of a pixel electrode 522 is shown in the light-emitting element 506 in order to clarify the arrangement of various wirings and transistors.

In the semiconductor display device of this embodiment mode, which is shown in FIG. 13 and FIGS. 14A to 14C, the second power supply line Vbi for supplying current to the light-emitting element 506 is directly connected to an auxiliary power supply line 508. In addition, although not shown in FIG. 13 and FIGS. 14A to 14C, the auxiliary power supply line 508 is connected to another second power supply line Vbi, which is different from the second power supply line Vbi shown in FIG. 13 and FIGS. 14A to 14C. These two second power supply lines Vbi are electrically connected to each other through the auxiliary power supply line 508. Note that although an example in which the second power supply lines Vbi are electrically connected to each other by directly connecting the second power supply line Vbi and the auxiliary power supply line 508 to each other is shown in FIG. 13 and FIGS. 14A to 14C, one of the second power supply line Vbi and the auxiliary power supply line 508 may be electrically connected to each other through a different wiring.

In this embodiment mode, by electrically connecting at least two second power supply lines Vbi to each other through the auxiliary power supply line 508, potential differences generated in the second power supply lines Vbi due to potential drop can be prevented from varying among the second power supply lines Vbi even when the amount of current which should be supplied to pixels are considerably varied among the second power supply lines Vbi. Thus, generation of luminance unevenness in the display region due to the potential drop can be prevented.

Further, the semiconductor display device of this embodiment mode, which is shown in FIG. 13 and FIGS. 14A to 14C, includes an auxiliary wiring 509 which is directly connected to the auxiliary power supply line 508, a scan line auxiliary wiring 510 which is directly connected to the first scan line Gaj, and a scan line auxiliary wiring 511 which is directly connected to the second scan line Gbj. Note that although the auxiliary power supply line 508 is directly connected to the auxiliary wiring 509 in FIG. 13 and FIGS. 14A to 14C, the auxiliary power supply line 508 may be electrically connected to the auxiliary wiring 509 through a different wiring. In addition, although the first scan line Gaj is directly connected to the scan line auxiliary wiring 510 in FIG. 13 and FIGS. 14A to 14C, the first scan line Gaj may be electrically connected to the scan line auxiliary wiring 510 through a different wiring. Further, although the second scan line Gbj is directly connected to the scan line auxiliary wiring 511 in FIG. 13 and FIGS. 14A to 14C, the second scan line Gbj may be electrically connected to the scan line auxiliary wiring 511 through a different wiring.

In the semiconductor display device of this embodiment mode, by providing the auxiliary wiring 509 which is directly or electrically connected to the auxiliary power supply line 508, combined resistance of the auxiliary power supply line 508 and the auxiliary wiring 509 can be lowered. Thus, the potential drop of the auxiliary power supply line 508 can be prevented; consequently, the potential drop of the second power supply line Vbi can be prevented.

In addition, in FIG. 13 and FIGS. 14A to 14C, the semiconductor display device includes the scan line auxiliary wiring 510 and the scan line auxiliary wiring 511; however, the semiconductor display device of this embodiment mode may include at least the auxiliary wiring 509 and does not necessarily include the scan line auxiliary wiring 510 and the scan line auxiliary wiring 511. Note that by providing the scan line auxiliary wiring 510 or the scan line auxiliary wiring 511, combined resistance of the first scan line Gaj and the scan line auxiliary wiring 510 or combined resistance of the second scan line Gbj and the scan line auxiliary wiring 511 can be lowered. Thus, the switching of the transistor 502 or the switching of the transistor 503 can be prevented from being unable to be controlled at appropriate timing due to the potential drop of the first scan line Gaj. Further, the switching of the transistor 504 can be prevented from being unable to be controlled at appropriate timing due to the potential drop of the second scan line Gbj.

Further, in this embodiment mode, at least the second power supply line Vbi, the auxiliary wiring 509, the scan line auxiliary wiring 510, and the scan line auxiliary wiring 511 are formed over an interlayer insulating film 512. In FIG. 13 and FIGS. 14A to 14C, an example is shown in which part 520 of the first power supply line Vai and the signal line Si as well as the second power supply line Vbi, the auxiliary wiring 509, the scan line auxiliary wiring 510, and the scan line auxiliary wiring 511 are formed over the interlayer insulating film 512. Thus, in this embodiment mode, the second power supply line Vbi, the auxiliary wiring 509, the scan line auxiliary wiring 510, the scan line auxiliary wiring 511, the signal line Si, and the part 520 of the first power supply line Vai can be formed by processing (patterning) a single conductive film or a plurality of stacked conductive films formed over the interlayer insulating film 512 into desired shapes. Accordingly, the second power supply line Vbi, the auxiliary wiring 509, the scan line auxiliary wiring 510, the scan line auxiliary wiring 511, the signal line Si, and the part 520 of the first power supply line Vai can be formed using one mask.

Furthermore, in this embodiment mode, below the interlayer insulating film 512, a gate electrode 513 of the transistor 501w a gate electrode 514 of the transistor 502, a gate electrode 515 of the transistor 503, two gate electrodes 516 of the transistor 504, a gate electrode 517 of the transistor 505, one of electrodes 518 of the storage capacitor 507, the auxiliary power supply line 508, the first scan line Gaj, the second scan line Gbj, and part 521 of the first power supply line Vai are formed. Thus, in this embodiment mode, the gate electrodes 513 to 517, the electrode 518, the auxiliary power supply line 508, the first scan line Gaj, the second scan line Gbj, and the part 521 of the first power supply line Vai can be formed by processing a single conductive film or a plurality of stacked conductive films into desired shapes before the interlayer insulating film 512 is formed. Accordingly, the gate electrodes 513 to 517, the electrode 518, the auxiliary power supply line 508, the first scan line Gaj, the second scan line Gbj, and the part 521 of the first power supply line Vai can be formed using one mask. Therefore, the semiconductor display device of this embodiment mode can be manufactured without increasing the number of masks as compared to a conventional semiconductor display device.

Note that part of the second power supply line Vai functions as the other of the electrodes of the storage capacitor 507. A region where the second power supply line Vbi, a gate insulating film 519, and the electrode 518 overlap with each other functions as the storage capacitor 507. The electrode 518 and the gate electrode 517 of the transistor 505 are formed using a series of the conductive films.

Note that it is necessary that the gate electrodes 513 to 517 have heat resistance which is high enough to withstand heat treatment performed in steps of manufacturing the transistors 501 to 505. Thus, when the auxiliary power supply line 508, the first scan line Gaj, and the second scan line Gbj are formed together with the gate electrodes 513 to 517 by processing (patterning) a single conductive film or a plurality of stacked conductive films into desired shapes, the kinds of materials which can be used for the gate electrodes 513 to 517, the auxiliary power supply line 508, the first scan line Gaj, and the second scan line Gbj are limited to certain kinds. Therefore, it is difficult to form the gate electrodes 513 to 517, the auxiliary power supply line 508, the first scan line Gaj, and the second scan line Gbj by using materials having lower resistivity. However, in this embodiment mode, the second power supply line Vbi, the auxiliary wiring 509, the scan line auxiliary wiring 510, and the scan line auxiliary wiring 511 are formed above the interlayer insulating film 512 formed over the transistors 501 to 505. Thus, since the second power supply line Vbi, the auxiliary wiring 509, the scan line auxiliary wiring 510, and the scan line auxiliary wiring 511 are formed after the transistors 501 to 505 are manufactured, the second power supply line Vbi, the auxiliary wiring 509, the scan line auxiliary wiring 510, and the scan line auxiliary wiring 511 do not need to have higher heat resistance than the gate electrodes 513 to 517, the auxiliary power supply line 508, the first scan line Gaj, and the second scan line Gbj. Therefore, materials which can be used for the second power supply line Vbi, the auxiliary wiring 509, the scan line auxiliary wiring 510, and the scan line auxiliary wiring 511 can be relatively freely selected, so that it is possible to select materials having lower resistivity than the gate electrodes 513 to 517, the auxiliary power supply line 508, the first scan line Gaj, and the second scan line Gbj. By forming the auxiliary wiring 509, the scan line auxiliary wiring 510, and the scan line auxiliary wiring 511 by using materials having low resistivity, the combined resistance of the auxiliary power supply line 508 and the auxiliary wiring 509, the combined resistance of the first scan line Gaj and the scan line auxiliary wiring 510, and the combined resistance of the second scan line Gbj and the scan line auxiliary wiring 511 can be further lowered. Accordingly, the potential drop of the second power supply line Vbi, the potential drop of the first scan line Gaj, and the potential drop of the second scan line Gbj can be prevented.

Note that in FIG. 13 and FIGS. 14A to 14C, part of the pixel electrode 522, the second power supply line Vbi, the auxiliary wiring 509, the scan line auxiliary wiring 510, the scan line auxiliary wiring 511, the part 520 of the first power supply line Vai, and the signal line Si are covered with the partition 523. In addition, in the region where the pixel electrode 522 is formed, the electroluminescent layer and the common electrode which are formed after the partition 523 is formed are directly stacked on the pixel electrode 522 in a region 524 where the pixel electrode 522 is not covered with the partition 523 but is partly exposed. Thus, in the region 524 where the pixel electrode 522, the electroluminescent layer, and the common electrode directly overlap with each other, the light-emitting element 506 is formed.

As shown in FIG. 13 and FIGS. 14A to 14C, the partition 523 is formed so as to cover all of the second power supply line Vbi, the auxiliary wiring 509, the scan line auxiliary wiring 510, the scan line auxiliary wiring 511, the part 520 of the first power supply line Vai, and the signal line Si which are formed over the interlayer insulating film 512. With such a structure, even when the thickness of the second power supply line Vbi, the auxiliary wiring 509, the scan line auxiliary wiring 510, the scan line auxiliary wiring 511, the part 520 of the first power supply line Vai, and the signal line Si is set greater than or equal to 0.8 µm and less than or equal to 1.5 µm in order to lower the resistance values, the electroluminescent layer which is to be formed later can be prevented from being extremely thinned or disconnected due to a step formed between the interlayer insulating film 512 and the second power supply line Vbi, the auxiliary wiring 509, the scan line auxiliary wiring 510, the scan line auxiliary wiring 511, the part 520 of the first power supply line Vai, and the signal line Si.

In addition, in FIG. 13, an example is shown in which a plurality of the auxiliary power supply lines 508 are arranged. In the case where the level of a power supply potential supplied to to the second power supply line Vbi is different from a power supply potential supplied to another second power supply line Vbi, the second power supply lines Vbi to which the same power supply potential is supplied are electrically connected to each other through an auxiliary power supply line. The auxiliary power supply line 508 other than the auxiliary power supply line 508 connected to the second power supply line Vbi shown in FIG. 13 can be used for electrically connecting second power supply lines Vbi to each other to which a different power supply potential is supplied.

Figure 15:
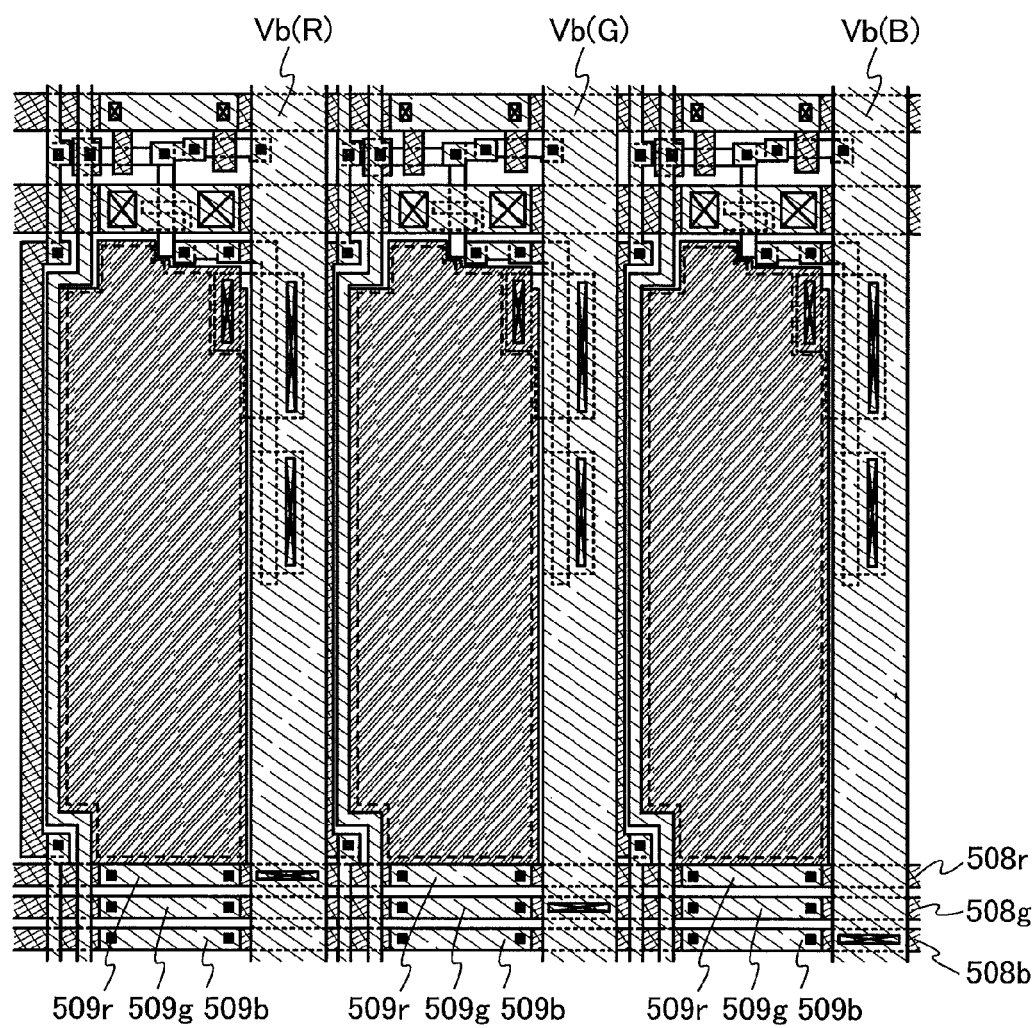
FIG. 15 is a magnified view of a display region of a semiconductor display device of Embodiment Mode 3.

FIG. 15 shows an example of a top view of the display region when second power supply lines Vbi corresponding to colors of R (red), G (green), and B (blue) are electrically connected to each other, respectively. In FIG. 15, power supply potentials which are supplied to a second power supply line Vb (R) corresponding to R (red), a second power supply line Vb (G) corresponding to G (green), a second power supply line Vb (B) corresponding to B (blue) are different from each other. In addition, the second power supply line Vb (R) is electrically connected to another adjacent second power supply line Vb (R) corresponding to R (red) through an auxiliary power supply line 508r. Further, the second power supply line Vb (G) is electrically connected to another adjacent second power supply line Vb (G) corresponding to G (green) through an auxiliary power supply line 508g. Furthermore, the second power supply line Vb (B) is electrically connected to another adjacent second power supply line Vb (B) corresponding to B (blue) through an auxiliary power supply line 508b.

Note that in FIG. 15, an example is shown in which the second power supply line Vb (R), the second power supply line Vb (G), and the second power supply line Vb (B) are directly connected to the auxiliary power supply line 508r, the auxiliary power supply line 508g, and the auxiliary power supply line 508b, respectively, so that the adjacent second power supply lines Vb (R), the adjacent second power supply lines Vb (G), and the adjacent second power supply lines Vb (B) are electrically connected to each other. However, the second power supply line Vb (R), the second power supply line Vb (G), and the second power supply line Vb (B) are electrically connected to the auxiliary power supply line 508r, the auxiliary power supply line 508g, and the auxiliary power supply line 508b, respectively, through different wirings.

Further in FIG. 15, an auxiliary wiring 509r, an auxiliary wiring 509g, and an auxiliary wiring 509b which are directly connected to the auxiliary power supply line 508r, the auxiliary power supply line 508g, and the auxiliary power supply line 508b, respectively, are shown. Note that although the auxiliary power supply line 508r, the auxiliary power supply line 508g, and the auxiliary power supply line 508b are directly connected to the auxiliary wiring 509r, the auxiliary wiring 509g, and the auxiliary wiring 509b, respectively, in FIG. 15, the auxiliary power supply line 508r, the auxiliary power supply line 508g, and the auxiliary power supply line 508b may be electrically connected to the auxiliary wiring 509r, the auxiliary wiring 509g, and the auxiliary wiring 509b, respectively, through different wirings.

In the semiconductor display device of this embodiment mode, by providing the auxiliary wiring 509r, the auxiliary wiring 509g, and the auxiliary wiring 509b which are directly or electrically connected to the auxiliary power supply line 508r, the auxiliary power supply line 508g, and the auxiliary power supply line 508b, respectively, combined resistance of the auxiliary power supply line 508r and the auxiliary wiring 509r, combined resistance of the auxiliary power supply line 508g and the auxiliary wiring 509g, and combined resistance of the auxiliary power supply line 508b and the auxiliary wiring 509b can be lowered. Thus, the potential drop of the auxiliary power supply line 508r, the auxiliary power supply line 508g, and the auxiliary power supply line 508b can be prevented; consequently, the potential drop of the second power supply line Vb (R), the second power supply line Vb (G) and the second power supply line V b (B) can be prevented.

This embodiment mode can be combined with any of other embodiment modes as appropriate.

Embodiment Mode 4

In this embodiment mode, a method for manufacturing a semiconductor display device, by which the thickness of various wirings formed over an interlayer insulating film can be partly varied, is described.

Figure 16A:
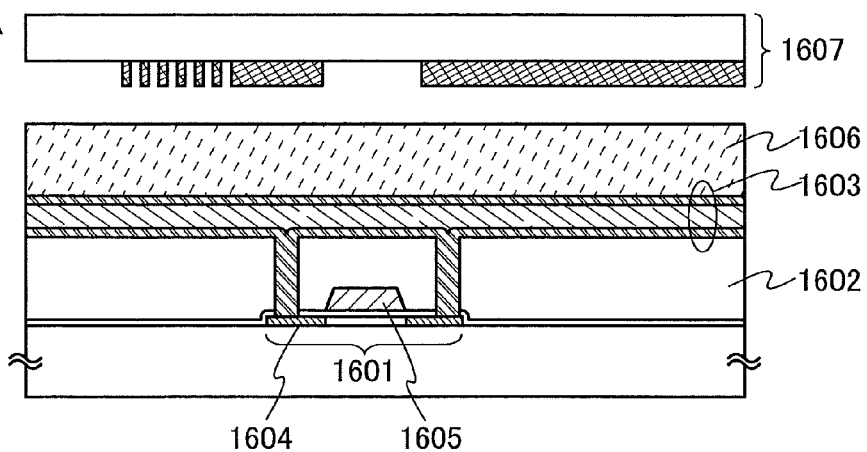
FIGS. 16A to 16D are cross-sectional views showing a method for manufacturing a semiconductor display device of Embodiment Mode 4.

First, as shown in FIG. 16A, a transistor 1601, an interlayer insulating film 1602 which covers the transistor 1601, and a conductive film 1603 which covers the interlayer insulating film 1602 are formed. The conductive film 1603 is connected to a semiconductor film 1604 of the transistor 1601 through a contact hole formed in the interlayer insulating film 1602. The transistor 1601, the interlayer insulating film 1602, and the conductive film 1603 can be formed using the manufacturing method described in Embodiment Mode 2, for example.

Note that in FIG. 16A, an example is shown in which the conductive film 1603 is formed using three stacked conductive films. However, in this embodiment mode, the conductive film 1603 may be formed using one conductive film; the conductive film 1603 may be formed using two stacked conductive films; or the conductive film 1603 may be formed using four or more stacked conductive films. The electric conductivity of at least one conductive film used for the conductive film 1603 is preferably higher than the electric conductivity of at least one conductive film used for a gate electrode 1605 of the transistor 1601, which is formed in the lower layer of the interlayer insulating film 1602. Alternatively, the thickness of any part of the conductive film 1603 is preferably larger than the thickness of any part of the gate electrode 1605. Specifically, the thickness of any part of the conductive film 1603 is preferably greater than or equal to 0.8 µm and less than or equal to 1.5 µm. When the thickness of the conductive film 1603 is set as described above, it is possible to increase the electric conductivity.

In this embodiment mode, as the conductive film 1603, a titanium film having a thickness of about 100 nm, an aluminum film having a thickness of about 700 to 1000 nm, and a titanium film having a thickness of about 100 nm are stacked in that order from the interlayer insulating film 1602 side.

Next, as shown in FIG. 16A, the conductive film 1603 is coated with a resist 1606. The resist 1606 can be a positive resist or a negative resist. In this embodiment mode, a positive resist is used. Then, the resist 1606 is partly exposed to light by using a multi-tone mask 1607.

A multi-tone mask refers to a mask which can achieve three levels of light exposure to obtain an exposed portion, a half-exposed portion, and an unexposed portion and can form a resist mask with regions of a plurality of thicknesses (typically two kinds of thicknesses) by one-time exposure and development process. Thus, the number of photomasks can be reduced by using a multi-tone mask.

Typical examples of a multi-tone mask are a gray-tone mask and a half-tone mask. A gray-tone mask includes a light-transmitting substrate, a light-shielding portion formed thereover, and a diffraction grating. The light transmittance of the light-shielding portion is 0%. In contrast, the light transmittance of the diffraction grating can be controlled by setting an interval between light-transmitting portions in slit forms, dot forms, or mesh forms to an interval less than or equal to the resolution limit of light used for the exposure. Note that the diffraction grating can be in a regular slit form, a regular dot form, or a regular mesh form, or in an irregular slit form, an irregular dot form, or an irregular mesh form. As the light-transmitting substrate, a light-transmitting substrate such as a quartz substrate can be used. Each of the light-shielding portion and the diffraction grating can be formed using a light-shielding material which absorbs light, such as chromium or chromium oxide. When the gray-tone mask is irradiated with light for exposure, the light transmittance of the light-shielding portion is 0% and the light transmittance of a region where the light-shielding portion and the diffraction grating are not provided is 100%. Further, the light transmittance of the diffraction grating can be controlled in the range of 10 to 70%. The light transmittance of the diffraction grating can be controlled by controlling the interval and pitch of slits, dots, or meshes of the diffraction grating.

Meanwhile, a half-tone mask includes a light-transmitting substrate, a transflective portion formed thereover, and a light-shielding portion. The transflective portion can be formed using MoSiN, MoSi, MoSiO, MoSiON, CrSi, or the like. The light-shielding portion can be formed using a light-shielding material which absorbs light, such as chromium or chromium oxide. When the half-tone mask is irradiated with light for exposure, the light transmittance of the light-shielding portion is 0% and the light transmittance of a region where the light-shielding portion and the transflective portion are not provided is 100%. Further, the light transmittance of the transfiective portion can be controlled in the range of 10 to 70%. The light transmittance of the transflective portion can be controlled by controlling the material used for the transflective portion.

Figure 16B:
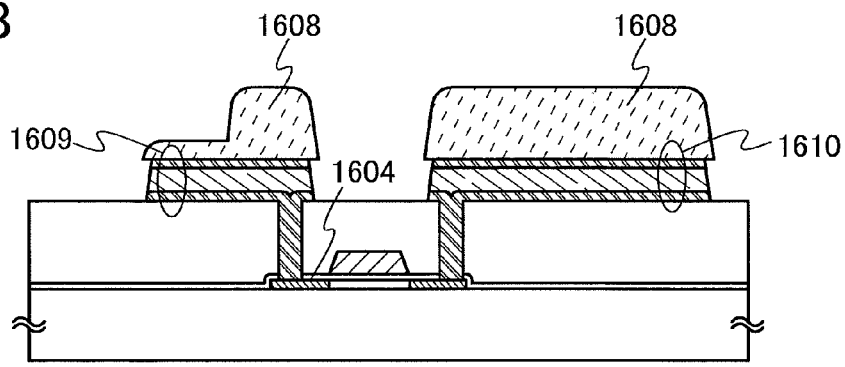

After the resist 1606 is exposed to light by using the multi-tone mask, development is performed, so that a resist mask 1608 having regions with different thicknesses can be formed, as shown in FIG. 16B. Then, by etching the conductive film 1603 by using the resist masks 1608, a conductive film 1609 and a conductive film 1610 are formed, as shown in FIG. 16B. The conductive film 1609 and the conductive film 1610 are connected to the semiconductor film 1604 through contact holes.

Next, ashing is performed on the resist masks 1608. Accordingly, the area and the thickness of the resist are decreased. Then, by partly removing the resist in a region with small thickness over the conductive film 1609 in the resist masks 1608, resist masks 1611 are formed, as shown in FIG. 16C.

Next, the conductive film 1609 is further etched using the resist mask 1611. Accordingly, a conductive film 1612 having partly small thickness can be formed from the conductive film 1609, as shown in FIG. 16C. Note that when the amount of ashing performed on the resist masks 1608 is large, the area of the resist mask 1611 over the conductive film 1610 is smaller than the area of the conductive film 1610. Thus, in the etching using the resist mask 1611, an end portion of the conductive film 1610 is also etched in some cases.

Figure 16C:
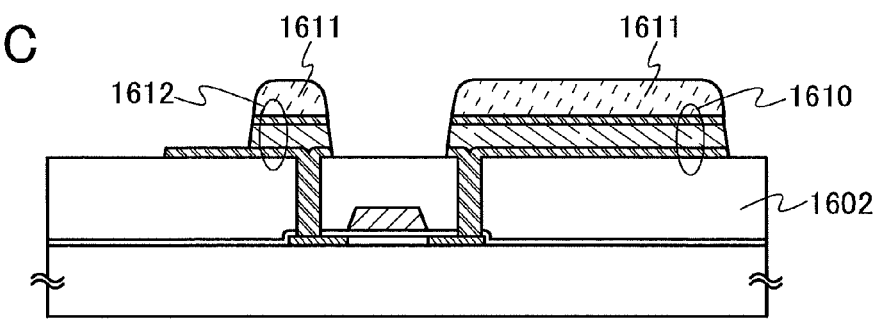

Further, in FIG. 16C, an example is shown in which only the conductive film closest to the interlayer insulating film 1602 partly remains when the conductive film 1609 is etched; however, the present invention is not limited to this structure. Two conductive films formed in the upper layers of the interlayer insulating film 1602 may also partly remain.

Figure 16D:
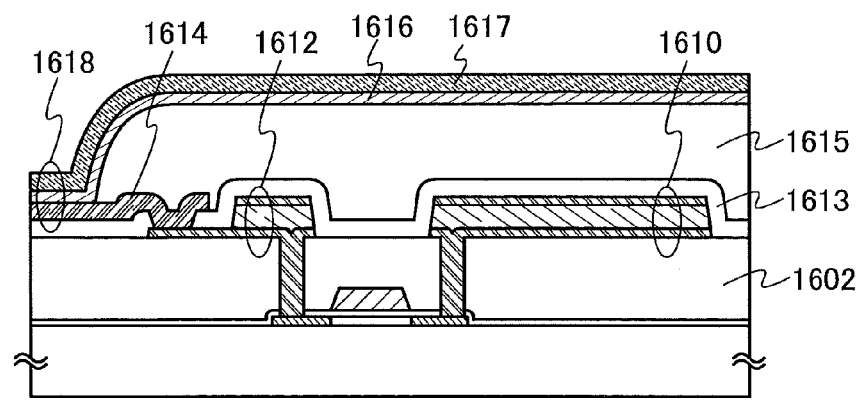

Next, as shown in FIG. 16D, after the resist masks 1611 are removed, an insulating film 1613 is formed over the interlayer insulating film 1602 so as to cover the conductive film 1612 and the conductive film 1610. Then, a contact hole is formed in the insulating film 1613, and a pixel electrode 1614 which is connected to a portion with small thickness of the conductive film 1612 through the contact hole is formed over the insulating film 1613.

Then, a partition 1615 is formed over the insulating film 1613 so as to cover part of the pixel electrode 1614. The partition 1615 has an opening portion and the pixel electrode 1614 is partly exposed in the opening portion. In addition, the partition 1615 is formed so as to overlap with at least a portion with large thickness of the conductive film 1612 and the conductive film 1610. With such a structure, even when the thickness of the portion with large thickness of the conductive film 1612 and the conductive film 1610 is set greater than or equal to 0.8 µm and less than or equal to 1.5 µm in order to lower the resistance values, an electroluminescent layer 1616 which is to be formed later can be prevented from being extremely thinned or disconnected due to a step formed between the interlayer insulating film 1602, and the portion with large thickness of the conductive film 1612 and the conductive film 1610.

Further, since the pixel electrode 1614 is connected to the small thickness portion of the conductive film 1612, the pixel electrode 1614 can be prevented from being extremely thinned or disconnected due to a step formed between the portion with small thickness of the conductive film 1612 and the interlayer insulating film 1602.

Next, the electroluminescent layer 1616 and a common electrode 1617 are sequentially stacked over the pixel electrode 1614 and the partition 1615. A region where the pixel electrode 1614, the electroluminescent layer 1616, and the common electrode 1617 overlap with each other functions as a light-emitting element 1618.

This embodiment mode can be combined with any of other embodiment modes as appropriate.

Embodiment Mode 5

In this embodiment mode, a structure by which light emitted from a light-emitting element can be efficiently extract outside a semiconductor display device by using various wirings formed over an interlayer insulating film is described.

Figure 17:
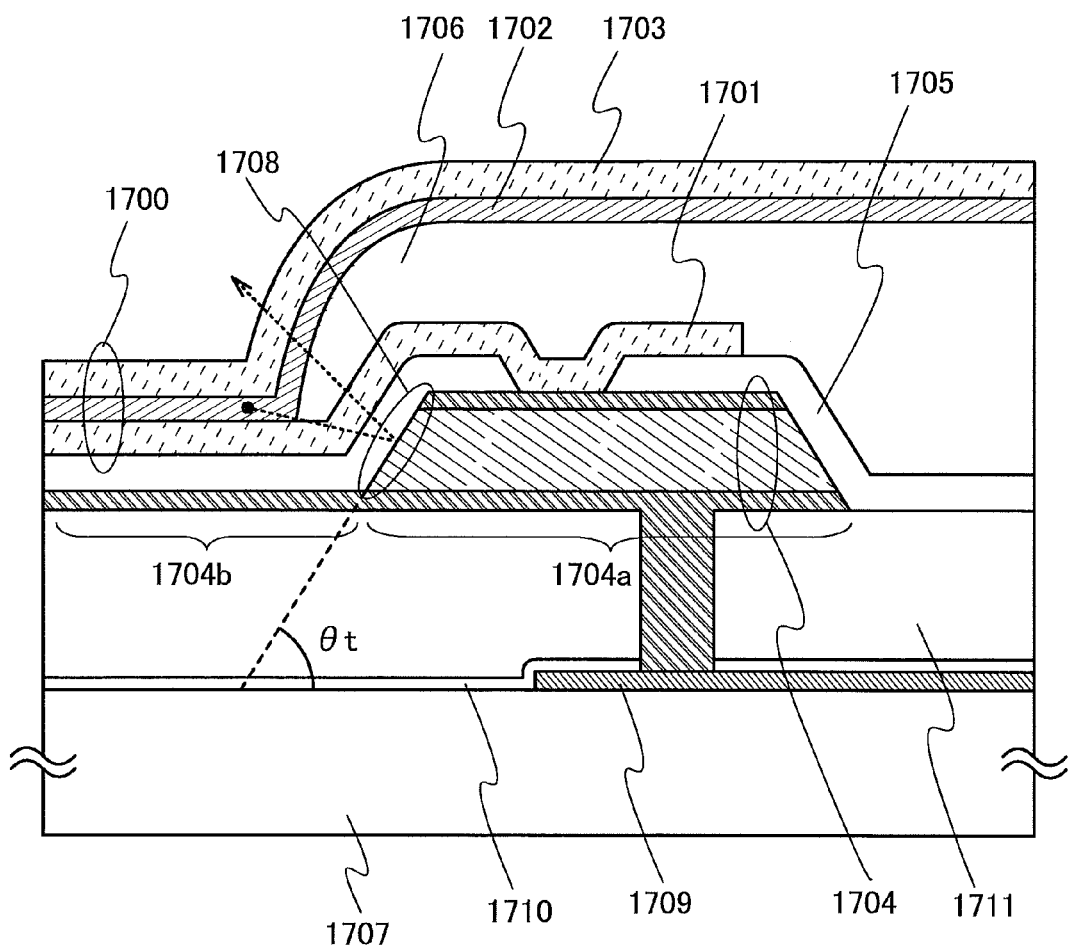
FIG. 17 is a cross-sectional view of a light-emitting element and a wiring of a semiconductor display device of Embodiment Mode 5.

FIG. 17 shows an example of a cross-sectional view of a light-emitting element included in a semiconductor display device of this embodiment mode and a wiring which is provided close to the light-emitting element. A light-emitting element 1700 includes a pixel electrode 1701, an electroluminescent layer 1702, and a common electrode 1703. In addition, a wiring 1704 has a plurality of regions with different thicknesses. Specifically, in FIG. 17, the wiring 1704 includes a region 1704a having large thickness and a region 1704b having small thickness.

The wiring 1704 is covered with an insulating film 1705. The wiring 1704 and the pixel electrode 1701 formed over the insulating film 1705 are connected to each other through a contact hole formed in the insulating film 1705. Note that although an example in which the region 1704a having large thickness in the wiring 1704 and the contact hole overlap with each other is shown in FIG. 17, the present invention is not limited to this structure. The region 1704b having small thickness in the wiring 1704 and the contact hole may overlap with each other.

Further, part of the pixel electrode 1701 and the region 1704a having large thickness in the wiring 1704 are covered with a partition 1706. A portion where a region which is exposed without being covered with the partition 1706 in the pixel electrode 1701, the electroluminescent layer 1702, and the common electrode 1703 overlap with each other functions as the light-emitting element 1700. In addition, the portion which functions as the light-emitting element 1700 overlaps with the region 1704*b* having small thickness in the wiring 1704.

Since the region 1704*a* having large thickness in the wiring 1704 is covered with the partition 1706, even when the thickness of the region 1704*a* in the wiring 1704 is set greater than or equal to 0.8 μm and less than or equal to 1.5 μm in order to lower the resistance value, the electroluminescent layer 1702 which is to be formed later can be prevented from being extremely thinned or disconnected due to a step formed between the region 1704*a* and the region 1704*b*.

Note that by using a multi-tone mask such as a gray tone mask or a half tone mask, the wiring 1704 which includes the region 1704*a* having large thickness and the region 1704*b* having small thickness can be formed without increasing the number of masks.

In addition, a semiconductor film 1709 is formed over a substrate 1707. The semiconductor film 1709 is covered with a gate insulating film 1710 and an interlayer insulating film 1711. The wiring 1704 is formed over the interlayer insulating film 1711. The wiring 1704 and the semiconductor film 1709 are connected to each other through a contact hole formed in the gate insulating film 1710 and the interlayer insulating film 1711. Note that depending on the kind of the material for the wiring 1704, a wiring which is formed over the gate insulating film 1710 together with a gate electrode may be connected to the wiring 1704 through the contact hole formed in the interlayer insulating film 1711.

Further, in FIG. 17, the pixel electrode 1701 and the common electrode 1703 have light-transmitting properties, and the wiring 1704 is formed using a reflective material. In the wiring 1704, in the region 1704*b* having small thickness and an end portion 1708 which is close to the region 1704*b* in the region 1704*a* having large thickness, light emitted from the electroluminescent layer 1702 can be reflected in a direction which is opposite to the substrate 1707. Thus, in the semiconductor display device shown in this embodiment mode, light emitted from the semiconductor display device includes light which is emitted from the electroluminescent layer 1702 directly in a direction which is opposite to the substrate 1707, and light which is emitted from the electroluminescent layer 1702 and then is emitted in a direction which is opposite to the substrate 1707 by being reflected at the wiring 1704.

Furthermore, in this embodiment mode, in the wiring 1704, an inclination angle in the end portion 1708 of the region 1704*a* having large thickness, that is, angle θt between a surface of the end portion 1708 and the substrate 1707 is set to 0°<θt<90°, preferably 50°<θt<60°. With such a structure, in light emitted from the electroluminescent layer 1702, light emitted in a lateral direction (a direction parallel to one main surface of the substrate 1707) can be reflected at the end portion 1708 of the wiring 1704 so that it is emitted in a direction which is opposite to the substrate 1707.

Note that that in the region 1704*b* and the end portion 1708 of the region 1704*a*, the material used for the wiring 1704 is selected as appropriate so that light emitted from the electroluminescent layer 1702 can be reflected. For example, as the wiring 1704, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy containing any of the above elements as its main component or a compound containing any of the above elements can be used. As the wiring 1704, a single-layer film having any of the above elements or a plurality of stacked films having any of the above elements can be used.

Note that in the case of using silicon oxide for the insulating film 1705, a surface of the wiring 1704 is oxidized depending on the material used for the wiring 1704 and light is not easily reflected on the surface of the wiring 1704 in some cases. By using silicon nitride for the insulating film 1705, oxidation on the surface of the wiring 1704 can be prevented and light can be easily reflected on the surface of the wiring 1704. Alternatively, by using a material which is not easily oxidized, such as platinum (Pt), gold (Au), or silver (Ag) for the wiring 1704, oxidation on the surface of the wiring 1704 can be prevented. In the case of using a material which is not easily oxidized for the wiring 1704, silicon oxide, which has a higher light-transmitting property than silicon nitride, can be used for the insulating film 1705.

This embodiment mode can be combined with any of other embodiment modes as appropriate.

Embodiment 1

In this embodiment, a method for manufacturing a semiconductor display device, by which a semiconductor element is formed by using a semiconductor film which is transferred from a semiconductor substrate (a bond substrate) to a support substrate (a base substrate), is described.

Figure 18A:
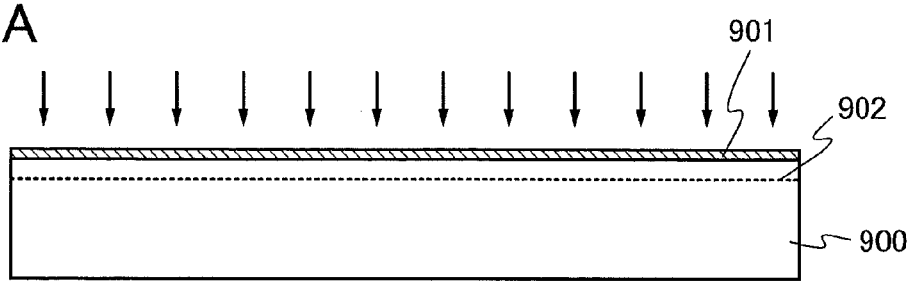
FIGS. 18A to 18D are cross-sectional views showing a method for manufacturing a semiconductor display device of Embodiment 1.

First, as shown in FIG. 18A, an insulating film 901 is formed over a bond substrate 900. The insulating film 901 is formed using an insulating material such as silicon oxide, silicon oxynitride, silicon nitride oxide, or silicon nitride. The insulating film 901 can be formed using either a single insulating film or by stacking a plurality of insulating films. For example, in this embodiment, the insulating film 901 is formed by stacking silicon oxynitride containing more oxygen than nitrogen and silicon nitride oxide containing more nitrogen than oxygen in that order from the bond substrate 900 side.

For example, in the case of using silicon oxide for the insulating film 901, the insulating film 901 can be formed using a mixed gas of silane and oxygen, a mixed gas of tetraethoxysilane (TEOS) and oxygen, or the like by vapor deposition such as thermal CVD, plasma enhanced CVD, atmospheric pressure CVD, or bias ECRCVD. In this case, a surface of the insulating film 901 may be densified by oxygen plasma treatment. Alternatively, in the case of using silicon nitride for the insulating film 901, the insulating film 901 can be formed using a mixed gas of silane and ammonia by vapor deposition such as plasma enhanced CVD. Alternatively, in the case of using silicon nitride oxide for the insulating film 901, the insulating film 901 can be formed using a mixed gas of silane and ammonia or a mixed gas of silane and nitrogen oxide by vapor deposition such as plasma enhanced CVD.

Alternatively, silicon oxide formed using an organosilane gas by chemical vapor deposition may be used for the insulating film 901. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Next, as shown in FIG. 18A, hydrogen or a rare gas, or hydrogen ions or rare gas ions are introduced into the bond substrate 900 as indicated by arrows, so that a weakened layer 902 having microvoids is formed at a given depth from a surface of the bond substrate 900. The position where the weakened layer 902 is formed is determined by accelerating voltage at the time of the introduction. Since the thickness of a semiconductor film 908 which is transferred from the bond substrate 900 to the base substrate 904 is determined by the position of the weakened layer 902, the accelerating voltage at the time of the introduction is set taking the thickness of the semiconductor film 908 into consideration. The thickness of the semiconductor film 908 is greater than or equal to 10 nm and less than or equal to 200 nm, preferably greater than or equal to 10 nm and less than or equal to 50 nm. For example, when hydrogen is introduced into the bond substrate 900, the dosage is preferably greater than or equal to $3\times10^{16}/cm^2$ and less than or equal to $1\times10^{17}/cm^2$.

Note that since hydrogen or a rare gas, or hydrogen ions or rare gas ions are introduced into the bond substrate 900 at a high concentration in the step of forming the weakened layer 902, the surface of the bond substrate 900 becomes rough and sufficient strength for bonding the base substrate 904 and the bond substrate 900 to each other cannot be obtained in some cases. By providing the insulating film 901, the surface of the bond substrate 900 is protected when hydrogen or a rare gas, or hydrogen ions or rare gas ions are introduced into the bond substrate 900, so that the base substrate 904 and the bond substrate 900 can be bonded to each other favorably.

Figure 18B:
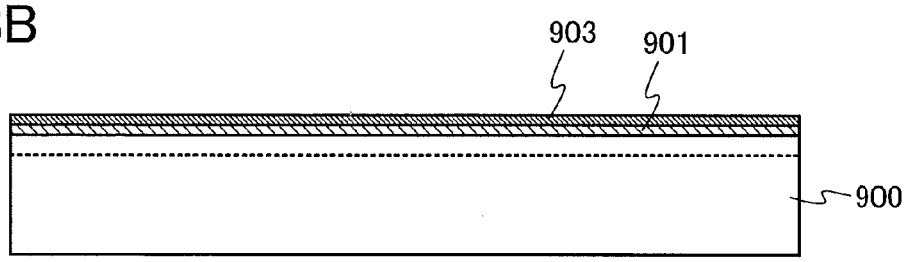

Next, as shown in FIG. 18B, an insulating film 903 is formed over the insulating film 901. In a manner similar to that of the insulating film 901, the insulating film 903 is formed using an insulating material such as silicon oxide, silicon oxynitride, silicon nitride oxide, or silicon nitride. The insulating film 903 can be formed using either a single insulating film or by stacking a plurality of insulating films. Further, silicon oxide formed using an organosilane gas by chemical vapor deposition may be used for the insulating film 903. In this embodiment, silicon oxide formed using an organosilane gas by chemical vapor deposition is used for the insulating film 903.

Note that by using an insulating film having a high barrier property, such as a silicon nitride film or a silicon nitride oxide film, as the insulating film 901 or the insulating film 903, impurities such as an alkali metal or an alkaline earth metal can be prevented from entering a semiconductor film 909 which is to be formed later, from the base substrate 904.

Note that although the insulating film 903 is formed after the weakened layer 902 is formed in this embodiment, the insulating film 903 is not necessarily provided. Note that since the insulating film 903 is formed after the weakened layer 902 is formed, the insulating film 903 has a flatter surface than the insulating film 901 formed before the weakened layer 902 is formed. Thus, by providing the insulating film 903, the strength of bonding which is to be performed later can be further increased.

Next, before the bond substrate 900 and the base substrate 904 are attached to each other by bonding, hydrogenation may be performed on the bond substrate 900. Hydrogenation is performed, for example, at 350° C. for about 2 hours in a hydrogen atmosphere.

Figure 18C:
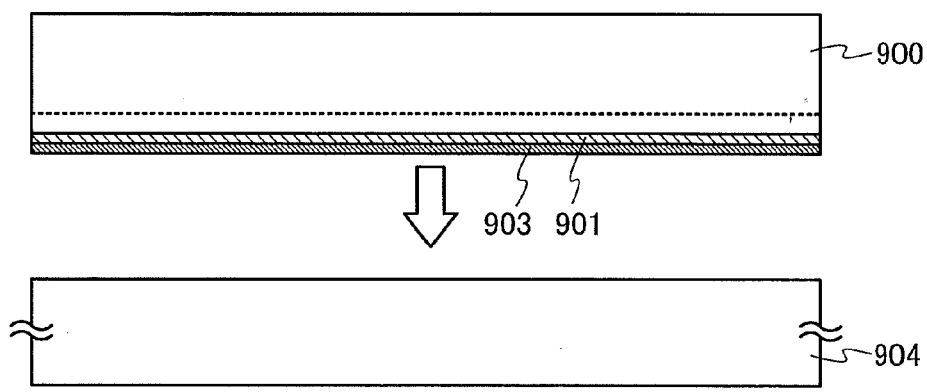
Figure 18D:
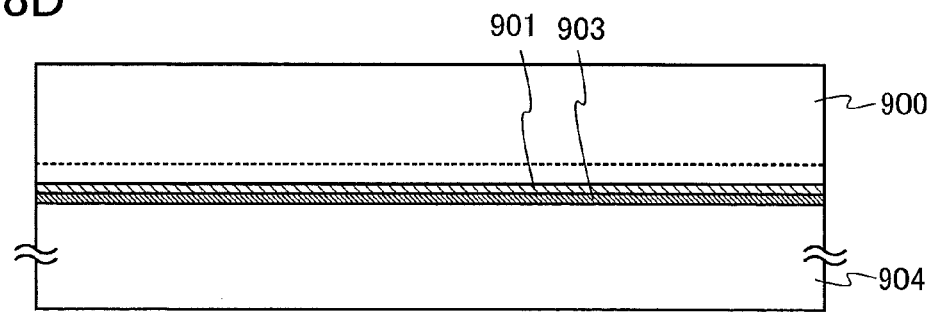

Next, as shown in FIG. 18C, the bond substrate 900 is stacked over the base substrate 904 so that the insulating film 903 is interposed therebetween. Then, the bond substrate 900 and the base substrate 904 are attached to each other, as shown in FIG. 18D. The insulating film 903 is bonded to the base substrate 904, so that the bond substrate 900 and the base substrate 904 can be attached to each other.

Since the bond substrate 900 and the base substrate 904 are bonded to each other by van der Waals force, the substrates are firmly bonded to each other even at room temperature. Note that since the bonding can be performed at low temperature, various substrates can be used as the base substrate 904.

For example, as well as a glass substrate such as an aluminosilicate glass substrate, a barium borosilicate glass substrate, or an aluminoborosilicate glass substrate, a substrate such as a quartz substrate or a sapphire substrate can be used as the base substrate 904. Alternatively, a semiconductor substrate formed using silicon, gallium arsenide, indium phosphide, or the like can be used as the base substrate 904.

Note that an insulating film may also be formed over a surface of the base substrate 904 and the insulating film may be bonded to the insulating film 903. In this case, as well as the above substrates, a metal substrate such as a stainless steel substrate can be used as the base substrate 904. There is a tendency that a flexible substrate formed of a synthetic resin such as plastics generally has a lower allowable temperature limit than the above substrates; however, such a substrate can be used as the base substrate 904 as long as it can withstand processing temperature in manufacturing steps. As a plastic substrate, polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, an acrylonitrile butadiene styrene resin, polyvinyl chloride, polypropylene, polyvinyl acetate, an acrylic resin, or the like can be used.

A single crystal semiconductor substrate or a polycrystalline semiconductor substrate formed using silicon, germanium, or the like can be used as the bond substrate 900. Alternatively, a single crystal semiconductor substrate or a polycrystalline semiconductor substrate formed using a compound semiconductor such as gallium arsenide or indium phosphide can be used as the bond substrate 900. Alternatively, a semiconductor substrate formed using silicon having lattice distortion, silicon germanium in which germanium is added to silicon, or the like may be used as the bond substrate 900. Silicon having lattice distortion can be formed by being deposited over silicon germanium or a silicon nitride film, which has a larger lattice constant than silicon.

Note that heat treatment or pressure treatment may be performed after the base substrate 904 and the bond substrate 900 are attached to each other. By performing heat treatment or pressure treatment the bonding strength can be increased.

Figure 19A:
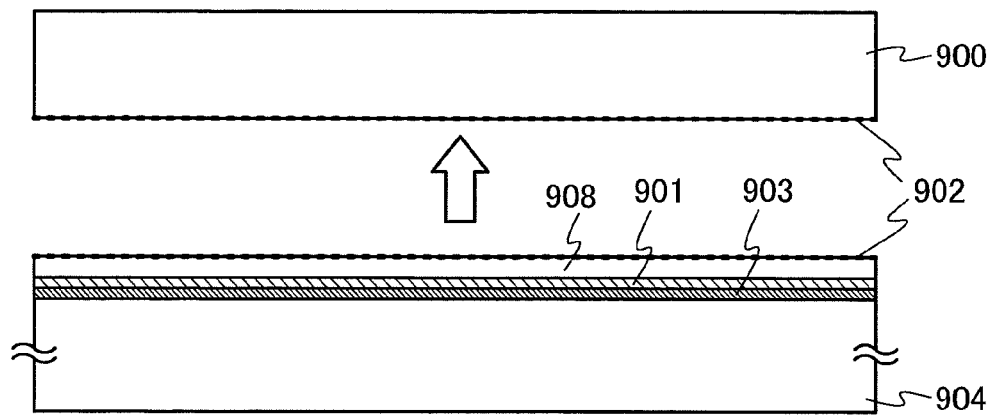
FIGS. 19A to 19C are cross-sectional views showing a method for manufacturing a semiconductor display device of Embodiment 1.

By performing heat treatment after the bonding is performed, adjacent microvoids in the weakened layer 902 are combined with each other and the volume of the microvoid is increased. Accordingly, as shown in FIG. 19A, the bond substrate 900 is cleaved along the weakened layer 902, so that the semiconductor film 908 which is part of the bond substrate 900 is separated from the bond substrate 900. The heat treatment is preferably performed at a temperature which is lower than or equal to the allowable temperature limit of the base substrate 904. For example, the heat treatment is performed at a temperature higher than or equal to 400° C. and lower than or equal to 600° C. With this separation, the semiconductor film 908 is transferred together with the insulating film 901 and the insulating film 903 to the base substrate 904. After that, heat treatment at a temperature higher than or equal to 400° C. and lower than or equal to 600° C. is preferably performed in order to bond the insulating film 903 and the base substrate 904 to each other more firmly.

The crystalline orientation of the semiconductor film 908 can be controlled with the plane orientation of the bond substrate 900. The bond substrate 900 having crystalline orientation which is suitable for a semiconductor element which is to be formed may be selected as appropriate. Further, the mobility of a transistor differs depending on the crystalline orientation of the semiconductor film 908. When a transistor having higher mobility is desired to be obtained, the direction of the attachment of the bond substrate 900 is set taking the direction of a channel and the crystalline orientation into consideration.

Next, a surface of the semiconductor film 908 transferred is flattened. Although flattening is not necessarily performed, by performing flattening, characteristics of an interface between the semiconductor film 908 and a gate insulating film in a transistor which is to be formed later can be improved. Specifically, flattening can be performed by chemical mechanical polishing (CMP). The thickness of the semiconductor film 908 is decreased by the flattening.

Note that although the case where Smart Cut (registered trademark) is used by which the semiconductor film 908 is separated from the bond substrate 900 by forming the weakened layer 902 is described in this embodiment, the semiconductor film 908 may be attached to the base substrate 904 by a different attachment method such as epitaxial layer transfer (ELTRAN), a dielectric separation method, or plasma assisted chemical etching (PACE).

Figure 19B:
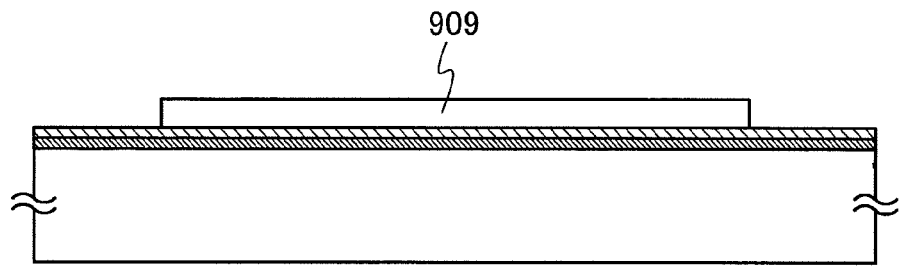

Next, as shown in FIG. 19B, by processing (patterning) the semiconductor film 908 into a desired shape, the island-shaped semiconductor film 909 is formed.

Figure 19C:
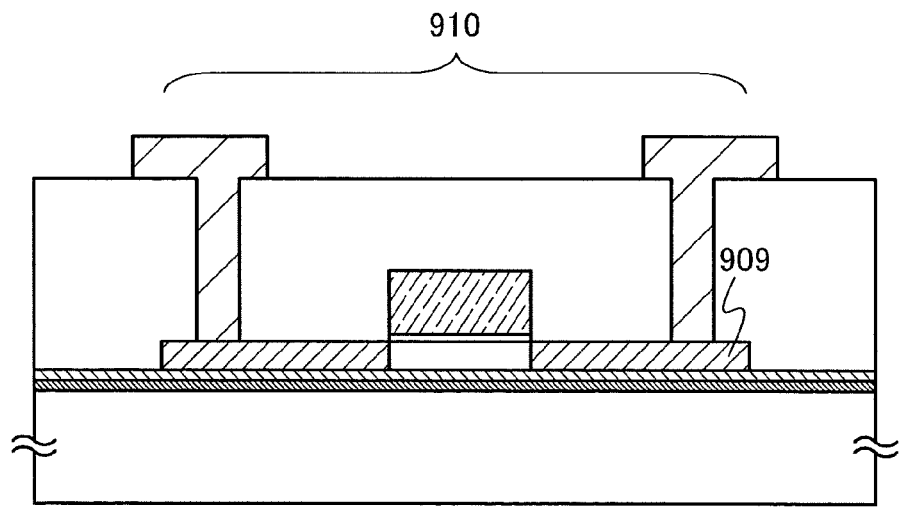

Various semiconductor elements such as transistors can be formed using the semiconductor film 909 formed through the above step. In FIG. 19C, a transistor 910 formed using the semiconductor film 909 is shown.

By using the above manufacturing method, a semiconductor element included in the semiconductor display device of the aforementioned embodiment mode can be manufactured.

This embodiment can be combined with any of the embodiment modes as appropriate.

Embodiment 2

Figure 20A:
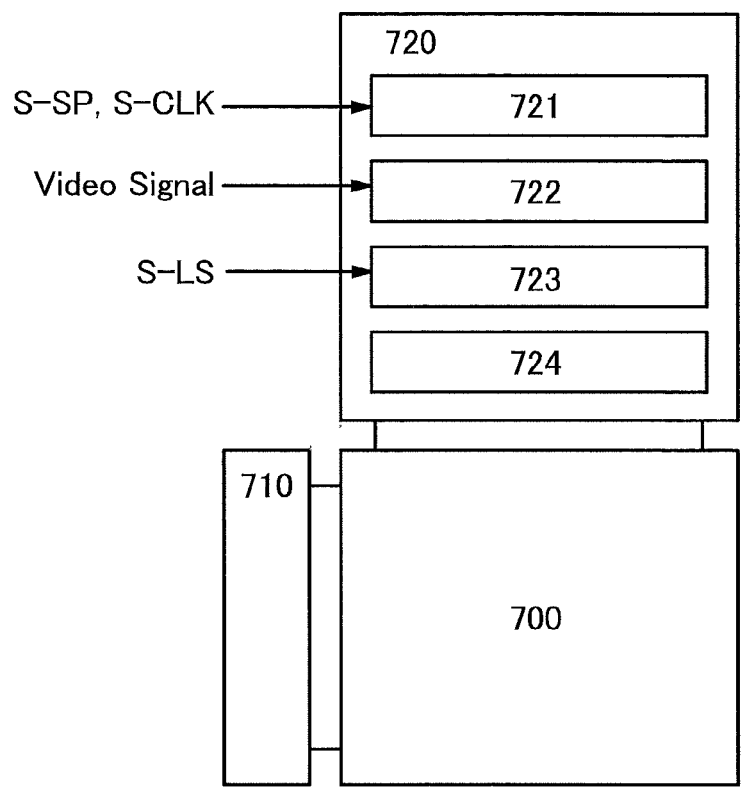
FIGS. 20A and 20B are block diagrams of semiconductor display devices of Embodiment 2.

In this embodiment, the general structure of a semiconductor display device is described. In FIG. 20A, a block diagram of a semiconductor display device of this embodiment is shown as an example.

The semiconductor display device shown in FIG. 20A includes a pixel portion (a display portion) 700 having a plurality of pixels provided with light-emitting elements, a scan line driver circuit 710 for selecting pixels in each line, and a signal line driver circuit 720 for controlling input of video signals to the pixels in the selected line.

In FIG. 20A, the signal line driver circuit 720 includes a shift register 721, a first memory circuit 722, a second memory circuit 723, and a D/A (digital to analog) converter 724. A clock signal S-CLK and a start pulse signal S-SP are input to the shift register 721. The shift register 721 generates timing signals, pulses of which are sequentially shifted, in accordance with the clock signal S-CLK and the start pulse signal S-SP, and outputs the timing signals to the first memory circuit 722. The order of the appearance of the pulses of the timing signal may be switched in accordance with scan direction switching signals.

When a timing signal is input to the first memory circuit 722, video signals are sequentially written to and held in the first memory circuit 722 in accordance with the pulse of the timing signal. Note that the video signals may be sequentially written to a plurality of memory elements included in the first memory circuit 722; or so-called division driving may be performed, in which the memory elements included in the first memory circuit 722 are divided into several groups and video signals are input to each group in parallel. Note that the number of groups in this case is referred to as the number of divisions. For example, when the memory elements are divided into groups each having four memory elements, division driving is performed with four divisions.

The time until video signal writing to all of the memory elements of the first memory circuit 722 is completed is referred to as a line period. In practice, a line period refers to a period when a horizontal retrace interval is added to the line period in some cases.

When one line period is finished, the video signals held in the first memory circuit 722 are written to the second memory circuit 723 all at once and held in accordance with the pulse of a signal S-LS which is input to the second memory circuit 723. The next video signals are sequentially written to the first memory circuit 722 which has finished sending the video signals to the second memory circuit 723, in accordance with timing signals from the shift register 721 again. During this second round of one line period, the video signals which are written to and held in the second memory circuit 723 are input to the D/A converter 724.

Then, the D/A converter 724 converts the input digital video signals into analog video signals and inputs the analog video signals to each pixel in the pixel portion 700 through signal lines.

Note that without providing the D/A converter 724, the digital video signals may be directly input to the pixel portion 700.

Further, in the signal line driver circuit 720, a circuit which can output signals, pulses of which are sequentially shifted, may be used instead of the shift register 721.

Note that although the pixel portion 700 is directly connected to the D/A converter 724 in the next stage in FIG. 20A, the present invention is not limited to this structure. A circuit which performs signal processing on the video signals output from the D/A converter 724 can be provided in the previous stage of the pixel portion 700. Examples of a circuit which performs signal processing are a buffer which can shape a waveform, and the like.

Next, the operation of the scan line driver circuit 710 is described. The scan line driver circuit 710 generates selection signals, inputs the selection signals to each of a plurality of scan lines, and thus selects pixels in each line. When the pixels are selected with the selection signals, a transistor whose gate is connected to one of the scan lines is turned on and video signals are input to the pixels.

Note that although an example in which all selection signals that are input to the plurality of scan lines are generated in one scan line driver circuit 710 is shown in this embodiment, the present invention is not limited to this structure. Selection signals input to the plurality of scan lines may be generated in a plurality of scan line driver circuits 710.

Further, in the case where a plurality of scan lines are provided in each pixel, a plurality of scan line driver circuits which correspond to the respective scan lines may be provided.

Note that although the pixel portion 700, the scan line driver circuit 710, and the signal line driver circuit 720 can be provided over the same substrate, any of them can be provided over a different substrate.

Figure 20B:
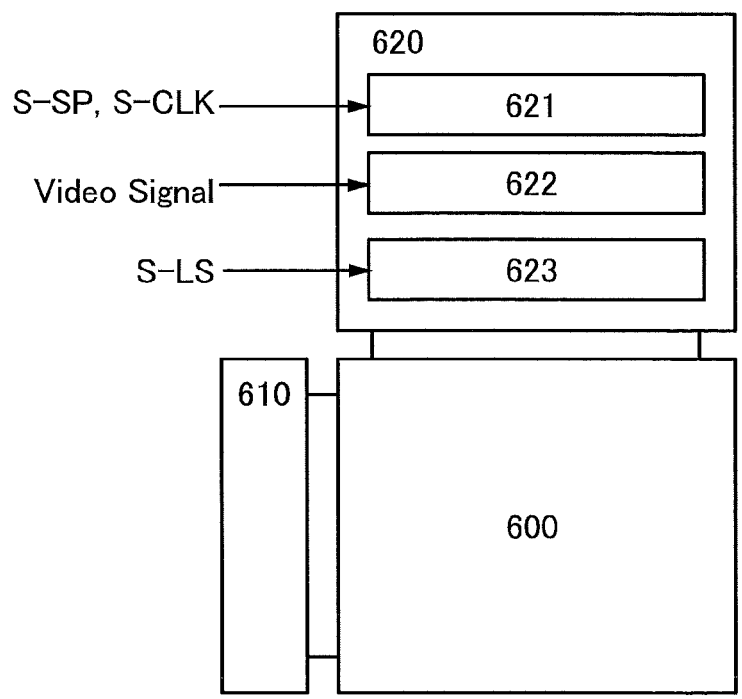

Next, FIG. 20B shows an example of a block diagram of a semiconductor display device, which is different from that in FIG. 20A. The semiconductor display device shown in FIG. 20B includes a pixel portion (a display region) 600 having a plurality of pixels, a scan line driver circuit 610 capable of selecting the plurality of pixels in each line, and a signal line driver circuit 620 for controlling input of video signals to the pixels in the selected line, The signal line driver circuit 620 includes at least a shift register 621, a sampling circuit 622, and a memory circuit 623 which can store analog signals. The clock signal S-CLK and the start pulse signal S-SP are input to the shift register 621. The shift register 621 generates timing signals, pulses of which are sequentially shifted, in accordance with the clock signal S-CLK and the start pulse signal S-SP, and inputs the timing signals to the sampling circuit 622. The sampling circuit 622 samples analog video signals for one line period, which are input to the signal line driver circuit 620, in accordance with the input timing signals. Then, when all of the video signals for the one line period are sampled, the sampled video signals are output to the memory circuit 623 all at once and held in accordance with the signal S-LS. The video signals held in the memory circuit 623 are input to the pixel portion 600 through the signal lines.

Note that although an example in which all of the video signals for the one line period are sampled in the sampling circuit 622, and then, the sampled video signals are input to the memory circuit 623 in the lower stage all at once is shown in this embodiment, the present invention is not limited to this structure. In the sampling circuit 622, every time a video signal corresponding to each pixel is sampled, the sampled video signal may be input to the memory circuit 623 in the lower stage, without waiting for the one line period to finish.

In addition, video signals may be sampled sequentially in corresponding pixels, or pixels in one line may be divided into several groups and video signals may be sampled in r each pixel corresponding in one group at the same time.

Note that although the pixel portion 600 is directly connected to the memory circuit 623 in the next stage in FIG. 20B, the present invention is not limited to this structure. A circuit which performs signal processing on the analog video signals output from the memory circuit 623 can be provided in the previous stage of the pixel portion 600. Examples of a circuit which performs signal processing are a buffer which can shape a waveform, and the like.

Then, when video signals are input to the pixel portion 600 from the memory circuit 623, the sampling circuit 622 can sample video signals corresponding to the next line period again at the same time.

Next, the operation of the scan line driver circuit 610 is described. The scan line driver circuit 610 generates selection signals, inputs the selection signals to each of a plurality of scan lines, and thus selects pixels in each line. When the pixels are selected with the selection signals, a transistor whose gate is connected to one of the scan lines is turned on and video signals are input to the pixels.

Note that although an example in which all selection signals that are input to the plurality of scan lines are generated in one scan line driver circuit 610 is shown in this embodiment, the present invention is not limited to this structure. Selection signals input to the plurality of scan lines may be generated in a plurality of scan line driver circuits 610.

Further, in the case where a plurality of scan lines are provided in each pixel, a plurality of scan line driver circuits which correspond to the respective scan lines may be provided.

Note that although the pixel portion 600, the scan line driver circuit 610, and the signal line driver circuit 620 can be provided over the same substrate, any of them can be provided over a different substrate.

This embodiment can be combined with any of the embodiment modes and embodiments as appropriate.

Embodiment 3

In this embodiment, the appearance of a semiconductor display device is described with reference to FIGS. 21A and 21B. FIG. 21A is a top view of a panel in which a transistor and a light-emitting element which are formed over a first substrate are sealed between the first substrate and a second substrate with a sealant. FIG. 21B corresponds to a cross-sectional view taken along line A-A' in FIG. 21A.

A sealant 4020 is provided so as to surround a pixel portion (a display region) 4002, a signal line driver circuit 4003, and a scan line driver circuit 4004 which are provided over a first substrate 4001. Further, a second substrate 4006 is provided over the pixel portion 4002, the signal line driver circuit 4003, and the scan line driver circuit 4004. Thus, the pixel portion 4002, the signal line driver circuit 4003, and the scan line driver circuit 4004 are sealed together with a filler 4007 between the first substrate 4001 and the second substrate 4006 with the sealant 4020.

Each of the pixel portion 4002, the signal line driver circuit 4003, and the scan line driver circuit 4004 which are formed over the first substrate 4001 has a plurality of transistors. In FIG. 21B, a transistor 4008 included in the signal line driver circuit 4003, and a transistor 4009 and a transistor 4010 which are included in the pixel portion 4002 are shown.

In addition, a light-emitting element 4011 includes an electroluminescent layer 4013, a common electrode 4012, and a pixel electrode 4030 which is electrically connected to a source region or a drain region of the transistor 4009 through a wiring 4017. The structure of the light-emitting element 4011 is not limited to the structure shown in this embodiment. Note that the structure of the light-emitting element 4011 is not limited to the structure shown in this embodiment. The structure of the light-emitting element 4011 can be changed as appropriate in accordance with the direction of light extracted from the light-emitting element 4011, polarity of the thin film transistor 4009, or the like.

Although a variety of signals and voltage supplied to the signal line driver circuit 4003, the scan line driver circuit 4004, or the pixel portion 4002 are not shown in the cross-sectional view shown in FIG. 21B, the variety of signals and voltage are supplied from a connection terminal 4016 through lead wirings 4014 and 4015.

In this embodiment, the connection terminal 4016 is formed using the same conductive film as the common electrode 4012 included in the light-emitting element 4011. In addition, the lead wiring 4014 is formed using the same conductive film as the wiring 4017. Further, the lead wiring 4015 is formed using the same conductive film as gate electrodes of the transistor 4009, the transistor 4010, and the transistor 4008.

The connection terminal 4016 is electrically connected to a terminal of an FPC 4018 through an anisotropic conductive film 4019.

Note that for each of the first substrate 4001 and the second substrate 4006, glass, metal (typically stainless steel), ceramics, or plastics can be used. Note that the second substrate 4006 which is in a direction from which light from the light-emitting element 4011 is extracted needs to have a light-transmitting property. Thus, a light-transmitting material such as a glass plate, a plastic plate, a polyester film, or an acrylic film is preferably used for the second substrate 4006.

In addition, as well as inert gas such as nitrogen or argon, an ultraviolet curable resin or a thermosetting resin can be used for the filler 4007. In this embodiment, an example in which nitrogen is used for the filler 4007 is shown.

This embodiment can be combined with any of the embodiment modes and embodiments as appropriate.

Embodiment 4

By using the semiconductor display device shown in the aforementioned embodiment mode and embodiment, a high-definition display device having a large display region can be provided. Thus, the semiconductor display device shown in the aforementioned embodiment mode and embodiment is preferably applied to display devices, laptops, or image reproducing devices provided with recording media (typically devices which reproduce the content of recording media such as DVDs (digital versatile disc) and have displays for displaying the reproduced images). Further, as electronic devices which can use the semiconductor display device shown in the aforementioned embodiment mode and embodiment, there are a cellular phone, a portable game machine, an e-book reader, a camera such as a video camera or a digital still camera, a goggle-type display (a head mounted display), a navigation system, and an audio reproducing device (e.g., a car audio or an audio component set). Specific examples of these electronic devices are shown in FIGS. 22A to 22C.

Figure 22A:
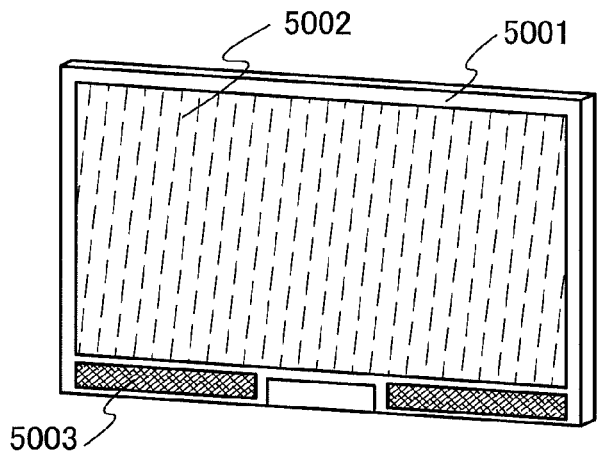
FIGS. 22A to 22C are diagrams of electronic devices each using a semiconductor display device of Embodiment 4.

FIG. 22A shows a display device, which includes a housing 5001, a display portion 5002, a speaker portion 5003, and the like. The semiconductor display device shown in the aforementioned embodiment mode and embodiment can be used for the display portion 5002. Note that a display device includes all display devices for displaying information, such as display devices for personal computers, for receiving television broadcast, and for displaying advertisement, in its category.

Figure 22B:
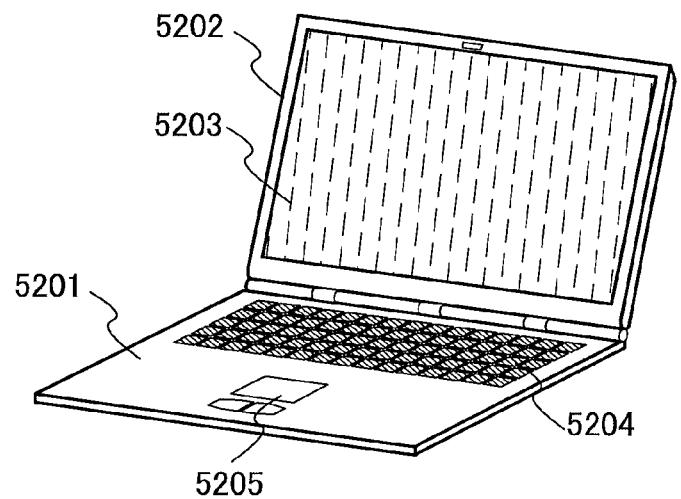

FIG. 22B shows a laptop, which includes a main body 5201, a housing 5202, a display portion 5203, a keyboard 5204, a mouse 5205, and the like. The semiconductor display device shown in the aforementioned embodiment mode and embodiment can be used for the display portion 5203.

Figure 22C:
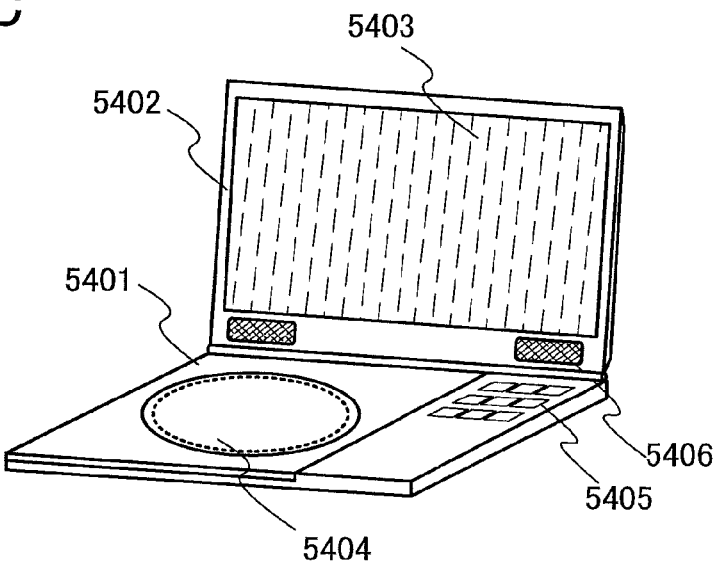

FIG. 22C shows a portable image reproducing device provided with a recording medium (specifically a DVD player), which includes a main body 5401, a housing 5402, a display portion 5403, a recording medium (e.g., a DVD) reading portion 5404, an operation key 5405, a speaker portion 5406, and the like. An image reproducing device provided with a recording medium includes a home-use game machine in its category. The semiconductor display device shown in the aforementioned embodiment mode and embodiment can be used for the display portion 5403.

As described above, the application range of the present invention is so wide that the present invention can be applied to electronic devices in all fields.

This embodiment can be combined with any of the embodiment modes and embodiments as appropriate.

This application is based on Japanese Patent Application serial no. 2007-329579 filed with Japan Patent Office on Dec. 21, 2007, the entire contents of which are hereby incorporated by reference.

What is claimed is:

1. A semiconductor display device comprising:
an auxiliary power supply line;
an interlayer insulating film over the auxiliary power supply line;
a first power supply line over the interlayer insulating film, wherein the first power supply line is arranged perpendicular to the auxiliary power supply line;
a second power supply line over the interlayer insulating film, wherein the second power supply line is arranged parallel to the first power supply line;
an auxiliary wiring over the interlayer insulating film, wherein the auxiliary wiring is arranged parallel to the auxiliary power supply line; and
a pixel electrode electrically connected to the first power supply line and the second power supply line,
wherein the first power supply line is electrically connected to the auxiliary power supply line through a first contact hole formed in the interlayer insulating film,
wherein the second power supply line is electrically connected to the auxiliary power supply line through a second contact hole formed in the interlayer insulating film, and
wherein the auxiliary wiring is electrically connected to the auxiliary power supply line through a third contact hole formed in the interlayer insulating film.

2. The semiconductor display device according to claim 1,
wherein a single first conductive film or a plurality of first stacked conductive films are used for the first power supply line, the second power supply line and the auxiliary wiring,
wherein a single second conductive film or a plurality of second stacked conductive films are used for the auxiliary power supply line, and
wherein electric conductivity of at least one conductive film among the single first conductive film or the plurality of first stacked conductive films is higher than electric conductivity of at least one conductive film among the single second conductive film or the plurality of second stacked conductive films.

3. The semiconductor display device according to claim 1, wherein the auxiliary wiring is electrically connected to the auxiliary power supply line through a fourth contact hole formed in the interlayer insulating film.

4. The semiconductor display device according to claim 1, wherein thickness of the first power supply line, the second power supply line and the auxiliary wiring is greater than or equal to 0.8 µm and less than or equal to 1.5 µm.

5. The semiconductor display device according to claim 1, the pixel electrode is electrically connected to the first power supply line through a transistor.

6. A semiconductor display device comprising:
a transistor;
an auxiliary power supply line;
an interlayer insulating film over the transistor and the auxiliary power supply line;
a first power supply line over the interlayer insulating film, wherein the first power supply line is arranged perpendicular to the auxiliary power supply line;
a second power supply line over the interlayer insulating film, wherein the second power supply line is arranged parallel to the first power supply line;
an auxiliary wiring over the interlayer insulating film, wherein the auxiliary wiring is arranged parallel to the auxiliary power supply line; and
a pixel electrode electrically connected to the first power supply line and the second power supply line through the transistor,
wherein the first power supply line is electrically connected to the auxiliary power supply line through a first contact hole formed in the interlayer insulating film,
wherein the second power supply line is electrically connected to the auxiliary power supply line through a second contact hole formed in the interlayer insulating film, and
wherein the auxiliary wiring is electrically connected to the auxiliary power supply line through a third contact hole formed in the interlayer insulating film.

7. The semiconductor display device according to claim 6,
wherein a single first conductive film or a plurality of first stacked conductive films are used for the first power supply line, the second power supply line and the auxiliary wiring, wherein a single second conductive film or a plurality of second stacked conductive films are used for the auxiliary power supply line and a gate electrode of the transistor, and wherein electric conductivity of at least one conductive film among the single first conductive film or the plurality of first stacked conductive films is higher than electric conductivity of at least one conductive film among the single second conductive film or the plurality of second stacked conductive films.

8. The semiconductor display device according to claim 6, wherein the auxiliary wiring is electrically connected to the auxiliary power supply line through a fourth contact hole formed in the interlayer insulating film.

9. The semiconductor display device according to claim 6, wherein thickness of the first power supply line, the second power supply line and the auxiliary wiring is greater than or equal to 0.8 µm and less than or equal to 1.5 µm.

10. A semiconductor display device comprising:
a first transistor;
a scan line electrically connected to a gate electrode of the first transistor;
an auxiliary power supply line;
an interlayer insulating film over the first transistor, the scan line, and the auxiliary power supply line;
a first power supply line over the interlayer insulating film, wherein the first power supply line is arranged perpendicular to the auxiliary power supply line;
a second power supply line over the interlayer insulating film, wherein the second power supply line is arranged parallel to the first power supply line;
an auxiliary wiring over the interlayer insulating film, wherein the auxiliary wiring is arranged in a direction parallel to the auxiliary power supply line:
a scan line auxiliary wiring over the interlayer insulating film wherein the scan line auxiliary wiring is arranged parallel to the scan line; and
a pixel electrode electrically connected to the first power supply line and the second power supply line,
wherein the first power supply line is electrically connected to the auxiliary power supply line through a first contact hole formed in the interlayer insulating film,
wherein the second power supply line is electrically connected to the auxiliary power supply line through a second contact hole formed in the interlayer insulating film,
wherein the auxiliary wiring is electrically connected to the auxiliary power supply line through a third contact hole formed in the interlayer insulating film, and
wherein the scan line auxiliary wiring is electrically connected to the scan line through a fourth contact hole formed in the interlayer insulating film.

11. The semiconductor display device according to claim 10,
wherein a single first conductive film or a plurality of first stacked conductive films are used for the first power supply line, the second power supply line, the auxiliary wiring, and the scan line auxiliary wiring,
wherein a single second conductive film or a plurality of second stacked conductive films are used for the auxiliary power supply line, the gate electrode, and the scan line, and
wherein electric conductivity of at least one conductive film among the single first conductive film or the plurality of first stacked conductive films is higher than electric conductivity of at least one conductive film among the single second conductive film or the plurality of second stacked conductive films.

12. The semiconductor display device according to claim 10, wherein the auxiliary wiring is electrically connected to the auxiliary power supply line through a fifth contact hole formed in the interlayer insulating film.

13. The semiconductor display device according to claim 10, wherein the scan line auxiliary wiring is electrically connected to the scan line through a sixth contact hole formed in the interlayer insulating film.

14. The semiconductor display device according to claim 10, wherein thickness of the first power supply line, the second power supply line, the auxiliary wiring, and the scan line auxiliary wiring is greater than or equal to 0.8 µm and less than or equal to 1.5 µm.

15. The semiconductor display device according to claim 10, the pixel electrode is electrically connected to the first power supply line through a second transistor.

16. A semiconductor display device comprising:
a first auxiliary power supply line;
a second auxiliary power supply line arranged parallel to the first auxiliary power supply line;
an interlayer insulating film over the first auxiliary power supply line and the second auxiliary power supply line;
a first power supply line over the interlayer insulating film, wherein the first power supply line is arranged perpendicular to the first auxiliary power supply line;
a second power supply line over the interlayer insulating film, wherein the second power supply line is arranged parallel to the first power supply line;
a third power supply line over the interlayer insulating film, wherein the third power supply line is arranged perpendicular to the second auxiliary power supply line;
a fourth power supply line over the interlayer insulating film, wherein the fourth power supply line is arranged parallel to the third power supply line;
a first auxiliary wiring over the interlayer insulating film, wherein the first auxiliary wiring is arranged parallel to the first auxiliary power supply line;
a second auxiliary wiring over the interlayer insulating film, wherein the second auxiliary wiring is arranged parallel to the second auxiliary power supply line;
a first pixel electrode electrically connected to the first power supply line and the second power supply line; and
a second pixel electrode electrically connected to the third power supply line and the fourth power supply line,
wherein the first power supply line is electrically connected to the first auxiliary power supply line through a first contact hole formed in the interlayer insulating film,
wherein the second power supply line is electrically connected to the first auxiliary power supply line through a second contact hole formed in the interlayer insulating film,
wherein the third power supply line is electrically connected to the second auxiliary power supply line through a third contact hole formed in the interlayer insulating film,
wherein the fourth power supply line is electrically connected to the second auxiliary power supply line through a fourth contact hole formed in the interlayer insulating film,
wherein the first auxiliary wiring is electrically connected to the first auxiliary power supply line through a fifth contact hole formed in the interlayer insulating film, and
wherein the second auxiliary wiring is electrically connected to the second auxiliary power supply line through a sixth contact hole formed in the interlayer insulating film.

17. The semiconductor display device according to claim 16,
wherein a single first conductive film or a plurality of first stacked conductive films are used for the first power supply line, the second power supply line, the third power supply line, the fourth power supply line, the first auxiliary wiring, and the second auxiliary wiring,
wherein a single second conductive film or a plurality of second stacked conductive films are used for the first auxiliary power supply line and the second auxiliary power supply line, and
wherein electric conductivity of at least one conductive film among the single first conductive film or the plurality of first stacked conductive films is higher than electric conductivity of at least one conductive film among the single second conductive film or the plurality of second stacked conductive films.

18. The semiconductor display device according to claim 16, wherein the first auxiliary wiring is electrically connected to the first auxiliary power supply line through a seventh contact hole formed in the interlayer insulating film, and the second auxiliary wiring is electrically connected to the second auxiliary power supply line through a eighth contact hole formed in the interlayer insulating film.

19. The semiconductor display device according to claim 16, wherein thickness of the first power supply line, the second power supply line, the third power supply line, the fourth power supply line, the first auxiliary wiring, and the second auxiliary wiring is greater than or equal to 0.8 μm and less than or equal to 1.5 μm.

20. The semiconductor display device according to claim 16, the first pixel electrode is electrically connected to the first power supply line through a first transistor, and the second pixel electrode is electrically connected to the third power supply line through a second transistor.

* * * * *